(12) United States Patent
Arelakis et al.

(10) Patent No.: US 11,868,271 B2
(45) Date of Patent: Jan. 9, 2024

(54) ACCESSING COMPRESSED COMPUTER MEMORY

(71) Applicant: ZEROPOINT TECHNOLOGIES AB, Gothenburg (SE)

(72) Inventors: Angelos Arelakis, Gothenburg (SE); Vasileios Spiliopoulos, Mölndal (SE); Per Stenström, Torslanda (SE)

(73) Assignee: Zeropoint Technologies AB, Göteberg (SE)

( * ) Notice: Subject to any disclaimer, the term of this patent is extended or adjusted under 35 U.S.C. 154(b) by 33 days.

(21) Appl. No.: 17/293,584

(22) PCT Filed: Nov. 14, 2019

(86) PCT No.: PCT/SE2019/051158
§ 371 (c)(1),
(2) Date: May 13, 2021

(87) PCT Pub. No.: WO2020/101564
PCT Pub. Date: May 22, 2020

(65) Prior Publication Data
US 2022/0012184 A1 Jan. 13, 2022

(30) Foreign Application Priority Data
Nov. 14, 2018 (SE) .................... 1851424-0

(51) Int. Cl.
*G06F 12/1045* (2016.01)
*G06F 3/06* (2006.01)
(Continued)

(52) U.S. Cl.
CPC ........ *G06F 12/1054* (2013.01); *G06F 3/0608* (2013.01); *G06F 3/0656* (2013.01);
(Continued)

(58) Field of Classification Search
CPC .................................................. G06F 2212/401
See application file for complete search history.

(56) References Cited

U.S. PATENT DOCUMENTS 6,681,305 B1 1/2004 Franke et al.
10,496,335 B2 * 12/2019 Khan ................... G06F 3/0661
(Continued)

OTHER PUBLICATIONS

Choukse, E. et al. "Compresso: Pragmatic Main Memory Compression," 2018 51$^{st}$ Annual IEEE/ACM International Symposium on Microarchitecture (MICRO), Fukuoka (Oct. 20, 2018), pp. 546-558.
(Continued)

*Primary Examiner* — Stephanie Wu
(74) *Attorney, Agent, or Firm* — Ballard Spahr LLP

(57) ABSTRACT

A method for accessing compressed computer memory residing in physical computer memory is disclosed. In the method, compressed memory blocks are represented as sectors, wherein all sectors contain a fixed number of compressed memory blocks, have a fixed logical size in the form of the fixed number of compressed memory blocks, and have varying physical sizes in the form of the total size of data stored in the respective compressed memory blocks. The method involves providing sector-based translation metadata to keep track of the sectors within a compressed memory page, receiving a physical memory access request comprising an address in the physical computer memory, using the address in the physical memory access request to derive a memory block index, using the memory block index and the fixed logical size of the sectors to determine a sector id, using the sector-based translation metadata to locate a sector having the sector id in the compressed memory page, and using the address of the physical memory access request to locate the requested data within said sector.

27 Claims, 53 Drawing Sheets

(51) Int. Cl.
  *G06F 12/02* (2006.01)
  *G06F 12/06* (2006.01)
  *G06F 12/0882* (2016.01)
(52) U.S. Cl.
  CPC .......... *G06F 3/0659* (2013.01); *G06F 3/0673* (2013.01); *G06F 12/0246* (2013.01); *G06F 12/0646* (2013.01); *G06F 12/0882* (2013.01)

(56) References Cited

U.S. PATENT DOCUMENTS

| | | | |
|---|---|---|---|
| 2012/0036325 A1 | 2/2012 | Mashtizadeh et al. | |
| 2013/0311722 A1 | 11/2013 | Arelakis et al. | |
| 2014/0258650 A1* | 9/2014 | Vishniac | G06F 3/064 |
| | | | 711/159 |
| 2015/0149739 A1* | 5/2015 | Seo | G06F 3/0608 |
| | | | 711/162 |
| 2015/0339237 A1 | 11/2015 | Heddes et al. | |
| 2015/0339239 A1 | 11/2015 | Heddes et al. | |
| 2017/0286308 A1* | 10/2017 | Verrilli | G06F 12/0875 |
| 2018/0088812 A1* | 3/2018 | Lee | G06F 3/064 |
| 2018/0088822 A1 | 3/2018 | Alameldeen et al. | |
| 2019/0235759 A1* | 8/2019 | Sen | G06F 3/065 |

OTHER PUBLICATIONS

Pekhimenko, G. et al. "Exploiting compressed block size as an indicator of future reuse," 2015 IEEE $21^{st}$ International Symposium on High Performance Computer Architecture (HPCA), Burlingame, CA (Feb. 7, 2015), pp. 51-63.

Baek, S. et al. "Size-aware cache management for compressed cache architectures," IEEE Transactions on Computers (Jul. 1, 2015), https://doi.org/10.1109/TC.2014.2360518.

Angelos Arelakis and Per Stenstrom. "SC2: a statistical compression cache scheme." in Proceeding if the $41^{st}$ annual international symposium on Computer architecture (ISCA '14). Jun. 14, 2014, IEEE Press, Piscataway, NJ, USA, p. 145-156.

International Search Report and Written Opinion dated Mar. 2, 2020 by the International Searching Authority for International Application No. PCT/SE2019/051158, filed on Nov. 14, 2019 and published as WO 2020/101564 on May 22, 2020 (Applicant—Zeropoint Technologies AB) (21 pages).

* cited by examiner

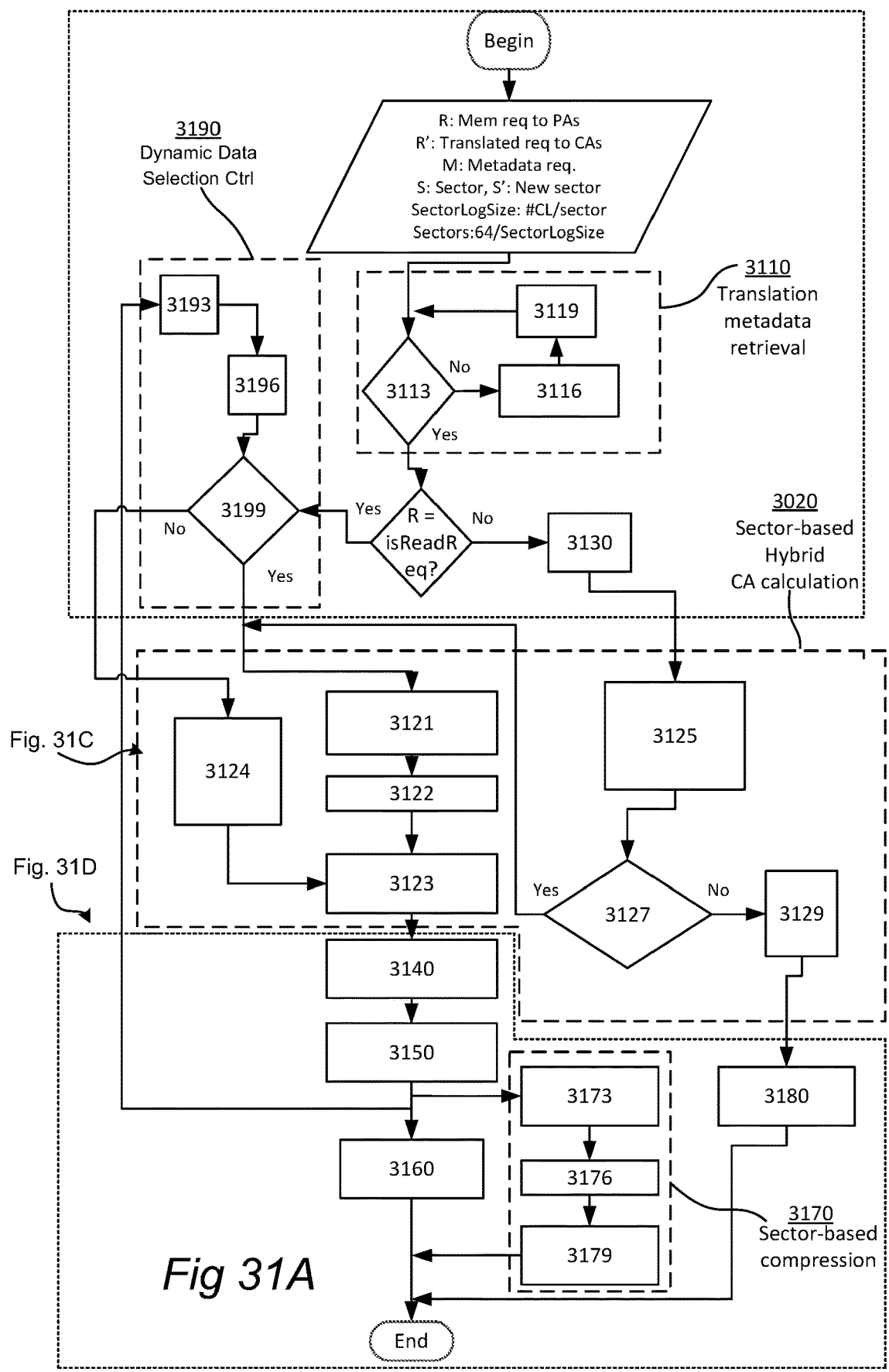

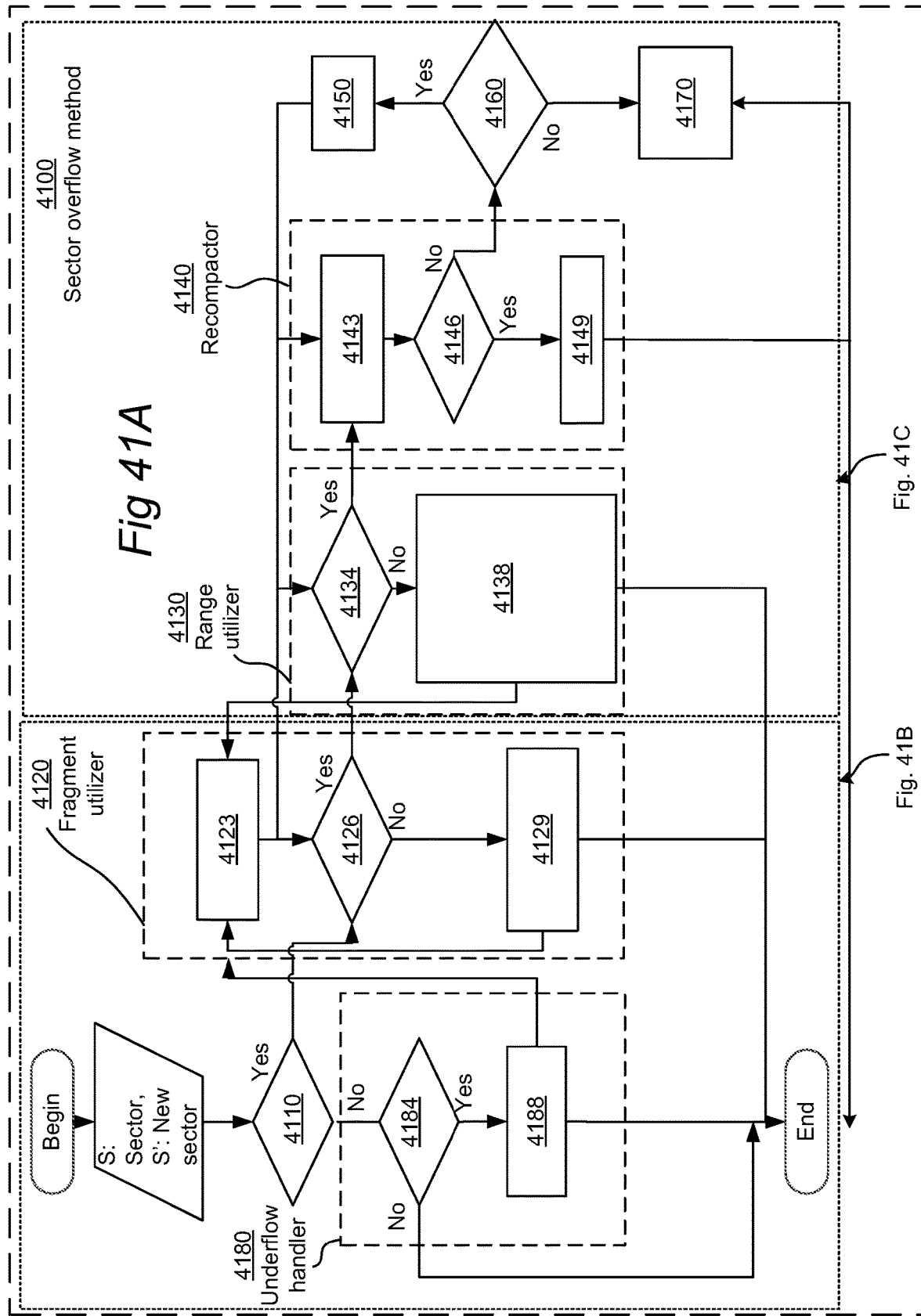

4500
A method for accessing compressed computer memory residing in physical computer memory:

4510
Representing compressed memory blocks as sectors, wherein all sectors contain a fixed number of compressed memory blocks such as cache lines, have a fixed logical size in the form of the fixed number of compressed memory blocks, and have varying physical sizes in the form of the total size of data stored in the respective compressed memory blocks

4520
Providing sector-based translation metadata to keep track of the sectors within a compressed memory page

4530
Receiving a physical memory access request comprising an address in the physical computer memory

4540
Using the address in the physical memory access request to derive a memory block index

4550
Using the memory block index and the fixed logical size of the sectors to determine a sector id

4560
Using the sector-based translation metadata to locate a sector having the sector id in the compressed memory page

4570
Using the address of the physical memory access request to locate the requested data within said sector

*Fig 45*

ACCESSING COMPRESSED COMPUTER MEMORY

CROSS-REFERENCE TO RELATED APPLICATIONS

This application is a U.S. National Phase Application of International Application No. PCT/SE2019/051158, filed Nov. 14, 2019, which claims priority to Swedish Application No. 1851424-0, filed Nov. 14, 2018, each of which are hereby incorporated by reference in their entirety.

TECHNICAL FIELD

This subject matter generally relates to the field of data compression in memories in electronic computers.

BACKGROUND

Data compression is a general technique to store and transfer data more efficiently by coding frequent collections of data more efficiently than less frequent collections of data. It is of interest to generally store and transfer data more efficiently for a number of reasons. In computer memories, for example memories that keep data and computer instructions that processing devices operate on, for example main memory or cache memories, it is of interest to store said data more efficiently, say K times, as it then can reduce the size of said memories potentially by K times, using potentially K times less communication capacity to transfer data between one memory to another memory and with potentially K times less energy expenditure to store and transfer said data inside or between computer systems and/or between memories. Alternatively, one can potentially store K times more data in available computer memory than without data compression. This can be of interest to achieve potentially K times higher performance of a computer without having to add more memory, which can be costly or can simply be less desirable due to resource constraints. As another example, the size and weight of a smartphone, a tablet, a lap/desktop or a set-top box are limited as a larger or heavier smartphone, tablet, lap/desktop or set-top box could be of less value for an end user; hence potentially lowering the market value of such products. Yet, more memory capacity can potentially increase the market value of the product as more memory capacity can result in higher performance and hence better utility of the product.

To summarize, in the general landscape of computerized products, including isolated devices or interconnected ones, data compression can potentially increase the performance, lower the energy expenditure or lower the cost and area consumed by memory. Therefore, data compression has a broad utility in a wide range of computerized products beyond those mentioned here.

Compressed memory systems in prior art typically compress a memory page when it is created, either by reading it from disk or through memory allocation. Compression can be done using a variety of well-known methods by software routines or by hardware accelerators. When the processors request data from memory, data must be first decompressed before serving the requesting processor. As such requests end up on the critical memory access path, decompression is typically hardware accelerated to impose minimal impact on the memory access time.

One problem with compressed memory systems is that they suffer from the problem of managing variable-sized memory pages. Unlike in a conventional memory system, without compression, where all pages have the same size, the size of each page in a compressed memory system depends on the compressibility of the page which is highly data dependent. Moreover, the size of each page can vary during its lifetime in main memory owing to modifications of the data in the page which may affect its compressibility. For this reason, a fundamental problem is how to dynamically manage the amount of memory freed up through compression.

Prior art of managing the freed-up memory space in compressed memory systems takes a variety of approaches. Typically, memory management is an integral part of the operating system and more specifically the virtual memory management (VMM) routines. The VMM is tasked with managing the available physical main memory space efficiently. At boot time, the VMM typically establishes how much physical main memory is available. Based on this, it can decide which pages should be resident in the available physical memory space on a demand basis; when required, the VMM typically selects which page that is less likely to be accessed soon as a victim to be paged out to disk. In a compressed memory, the amount of available memory capacity will however change dynamically. For this reason, conventional VMM routines do not work as they assume a fixed amount of physical memory at boot time.

An alternative is to modify the VMM to be aware of the amount of memory available at any point in time. This is however highly undesirable as changes to operating systems must apply to computer systems whether or not they use compression. Instead, several approaches in prior art solve the management problem in a transparent way to the operating system. One approach is to let the operating system boot while assuming a larger amount of physical memory than what is available. If the amount of memory freed up by compression is less than that amount, pages are swapped out to disk to lower the memory pressure. This solution may however suffer from stability problems due to thrashing and is not desirable.

Another approach, which is transparent to the operating system, is to reserve a memory region as a swap space in main memory. Instead of evicting a page to a secondary storage device (e.g. disk), the page is evicted to the reserved swap space. This has the advantage that it can be brought into memory much faster than if it is transferred into memory from secondary storage which may be substantially slower than memory. However, this reduces the size of the directly-accessed memory of the system. One can optionally compress pages swapped out to the swap space and thereby make use of the swap space more efficiently. However, the swap space is typically a small fraction, often a few tens of percentages, of the available physical memory capacity. Assume, for example, that the swap space comprises 20% of the available physical memory capacity. Further, assume that the compression ratio is two times. With a swap space combined with compression, one will free up $0.8 \times 1 + 0.2 \times 2 = 1.2$, that is, 20% memory space in contrast to 100% if compression is applied to all data in the entire memory.

Clearly, systems and methods are needed to manage free space in a compressed memory that are transparent to operating systems and that allow all memory to be compressed without suffering from stability problems.

Another problem related to compressed memory systems is how to efficiently locate an item in the compressed memory. In a compressed memory, each individual cache line or memory block (henceforth, blocks and lines are used interchangeably), like memory pages, has variable sizes. In addition, variable-size compressed data must be compacted which may change the memory layout. Hence, memory pages and blocks are not necessarily placed in the original locations where they would be placed in a conventional uncompressed memory system.

One approach in prior art to orchestrate address translation between physical and compressed addresses partitions the physical memory into fixed-size units, here called segments. For example, a 4-KB memory page can be partitioned into four segments making the segment size 1 KB. Now, if a page is compressed by a factor of two, it would need two segments instead of four as in a conventional uncompressed memory system. To locate a memory block using the concept of segments, metadata is needed as part of the address translation to locate the segment in which the requested memory block resides. A large segment has the advantage of reducing the amount of metadata needed to locate the segment but the disadvantage of leading to more internal fragmentation and hence lower utilization of the memory. Hence, this approach either suffers from a large amount of metadata or poor utilization of the memory.

Cache systems typically manage data at the granularity of memory blocks whose size is typically 64 B. Since memory blocks have variable sizes in a compressed memory system, there is an additional problem of locating them within a compressed memory page. One approach in prior art is to use pointers to locate the blocks inside a memory page. For example, if the page size is 4 KB, a 12-bit pointer can locate any block inside a page. Assuming a block size of 64 B, there are 64 blocks in a 4-KB memory page. Hence, as many as 64×12 bits=768 bits of metadata per memory page is needed per memory page.

Another approach in prior art associates with each block the size of that block. For example, if 64 different sizes are accommodated, the metadata per memory block to encode the size would need 6 bits. In this case, the amount of metadata associated with a memory page to locate each block is 64×6=384 which is substantially less than using pointers. However, to locate a block, for example the last block, would require to sum all the sizes of all the blocks prior to that block in the memory page which can cause a substantial latency in the address translation process. To shorten that latency, one can restrict the size of compressed blocks. However, this can reduce the utilization of the compressed memory substantially. For example, let us suppose that four blocks are compressed by a factor two, four, eight and sixteen. With the pointer-based approach one would enjoy the full potential of compression leading to a compression factor of $4/(½+¼+⅛+1/16)=4.3$, whereas restricting the size to four would yield a compression factor of $4/(½+¼+¼+¼)=3.2$.

The metadata needed to locate a memory block in a compressed memory system is typically cached on the processor chip similarly with what a translation-lookaside-buffer does for virtual-to-physical address translation in conventional computer systems to avoid having to access memory to locate a memory block in the physical memory. Since such address translation mechanisms must be fast and hence are of limited size, they can typically not keep all the metadata needed. Hence, all metadata need to be placed in memory (or storage). Hence, there is a need to limit the amount of metadata to save memory space and to cut down on the extra memory accesses needed to bring metadata from memory to the address translation mechanism on the processor chip. However, as mentioned, approaches in prior art to cut down the size of the metadata may either add substantial latency in the address translation mechanism or may result in poor utilization of the compressed memory due to fragmentation.

Hence, address translation approaches in prior art suffer either from large amounts of metadata, substantial latency in the address translation process or poor utilization of the compressed memory due to fragmentation. Clearly, systems, devices and methods are needed to locate data in the modified physical address space or in an extra compressed address space more efficiently than approaches known in prior art.

Moreover, systems and methods are needed to manage free space in a compressed memory substantially more efficiently than approaches known from prior art.

SUMMARY

It is an object of the present invention to offer improvements in the field of data compression in memories in electronic computers, and to solve, eliminate or mitigate one or more of the problems referred to above.

A first aspect of the present invention is a device for accessing compressed computer memory residing in physical computer memory. The device comprises an address translation unit, a compressed address calculator unit, a sector request unit, a selector unit, a sector merge unit, a decompressor and a compressor.

The address translation unit, the compressed address calculator unit and the sector request unit are configured, in combination, for converting a physical memory access request to a sector-based compressed memory request, wherein a sector id is extracted automatically using an address of said physical memory access request, said sector id is used to determine from sector-based translation metadata the location of a sector in the compressed computer memory, a compressed address and size of the determined sector are calculated, and based on the compressed address and size, a sector request is made to the compressed computer memory.

The decompressor and the selector unit are configured, in combination, for operating on compressed sector data as retrieved from the compressed computer memory in response to the sector request to obtain read request response data from said compressed sector data using the address and a size of said physical memory access request, and to return the obtained read request response data in decompressed form to a source of said physical memory access request being a read request.

The sector merge unit and the compressor are configured, in combination, for merging data of said compressed sector data—as retrieved from the compressed computer memory in response to the sector request—with data in said physical memory access request to obtain sector-based write request data using the address and size of said physical memory access request being a write request, and to store the obtained sector-based write request data as compressed sector data in the compressed computer memory.

A second aspect of the present invention is a corresponding method for accessing compressed computer memory residing in physical computer memory. This method comprises: a) converting a physical memory access request to a sector-based compressed memory request, wherein a sector id is extracted automatically using an address of said physical memory access request, said sector id is used to determine from sector-based translation metadata the location of a sector in the compressed computer memory, a compressed address and size of the determined sector are calculated, and based on the compressed address and size, a sector request is made to the compressed computer memory.

The method also comprises: b) operating on compressed sector data as retrieved from the compressed computer memory in response to the sector request to obtain read request response data from said compressed sector data using the address and a size of said physical memory access request, and return the obtained read request response data in decompressed form to a source of said physical memory access request being a read request.

The method moreover comprises: c) merging data of said compressed sector data as retrieved from the compressed computer memory in response to the sector request with data in said physical memory access request to obtain sector-based write request data using the address and size of said physical memory access request being a write request, and store the obtained sector-based write request data as compressed sector data in the compressed computer memory.

A third aspect of the present invention is a method for accessing compressed computer memory residing in physical computer memory. The method comprises representing compressed memory blocks as sectors, wherein all sectors contain a fixed number of compressed memory blocks such as cache lines, have a fixed logical size in the form of the fixed number of compressed memory blocks, and have varying physical sizes in the form of the total size of data stored in the respective compressed memory blocks; providing sector-based translation metadata to keep track of the sectors within a compressed memory page; receiving a physical memory access request comprising an address in the physical computer memory; using the address in the physical memory access request to derive a memory block index; using the memory block index and the fixed logical size of the sectors to determine a sector id; using the sector-based translation metadata to locate a sector having the sector id in the compressed memory page; and using the address of the physical memory access request to locate the requested data within said sector.

A fourth aspect of the present invention is a device for accessing compressed computer memory residing in physical computer memory. The device comprises: means for representing compressed memory blocks as sectors, wherein all sectors contain a fixed number of compressed memory blocks such as cache lines, have a fixed logical size in the form of the fixed number of compressed memory blocks, and have varying physical sizes in the form of the total size of data stored in the respective compressed memory blocks; means for providing sector-based translation metadata to keep track of the sectors within a compressed memory page; means for receiving a physical memory access request comprising an address in the physical computer memory; means for using the address in the physical memory access request to derive a memory block index; means for using the memory block index and the fixed logical size of the sectors to determine a sector id; means for using the sector-based translation metadata to locate a sector having the sector id in the compressed memory page; and means for using the address of the physical memory access request to locate the requested data within said sector.

A fifth aspect of the present invention is a method for deriving compression metadata of a specific size that maximizes a target effect for compressing blocks of data. The method comprises: analyzing the sizes of compressed blocks; deriving frequency and size distributions of said compressed blocks; identifying one or a plurality of candidate compressed block sizes that compressed blocks will be rounded up to; evaluating whether said identified sizes maximize the target effect while being represented with metadata of said specific size; and, if so, accordingly generating a compression metadata format, or, otherwise, repeating the method from the deriving step.

A sixth aspect of the present invention is a device for deriving compression metadata of a specific size that maximizes a target effect for compressing blocks of data. The device comprises: means for analyzing the sizes of compressed blocks; means for deriving frequency and size distributions of said compressed blocks; means for identifying one or a plurality of candidate compressed block sizes that compressed blocks will be rounded up to; means for evaluating whether said identified sizes maximize the target effect while being represented with metadata of said specific size; and means for generating a compression metadata format subject to successful evaluation by the means for evaluating.

A seventh aspect of the present invention is a sector-based memory compression system comprising a compressed memory; a device for accessing compressed computer memory according to the first aspect of the present invention; and a free memory management device.

DESCRIPTION OF DRAWINGS

FIG. 16 comprises two figures FIGS. 16A and 16B. FIG. 16A depicts the layout of an uncompressed page comprising cache lines, while

FIG. 30A-B depict a first example of a sector-based hybrid translation method, wherein translation metadata follows the exemplary format of FIG. 29 and wherein a sector is fetched always upon read requests but compressed data is written in sector or cache-line granularity, wherein FIG. 30B is a detailed view of some parts of FIG. 30A.

FIG. 31A-D depict a second example of a sector-based hybrid translation method, wherein translation metadata follows the exemplary format of FIG. 29, wherein a Dynamic Data Selection Ctrl process has been added to decide whether compressed data fetched upon read requests are compressed sectors or compressed cache-lines, and wherein FIG. 31B-D are detailed views of FIG. 31A.

FIG. 39 comprises two figures FIGS. 39A and 39B.

FIG. 40 comprises two figures FIGS. 40A and 40B.

FIG. 41A-C depict an embodiment of a Sector Overflow method, wherein FIG. 41B-C are detailed views of FIG. 41A.

FIG. 45 depicts a method for accessing compressed computer memory residing in physical computer memory as described herein.

DETAILED TECHNICAL DESCRIPTION

Computer Systems without Compressed Memory

Figure 1:
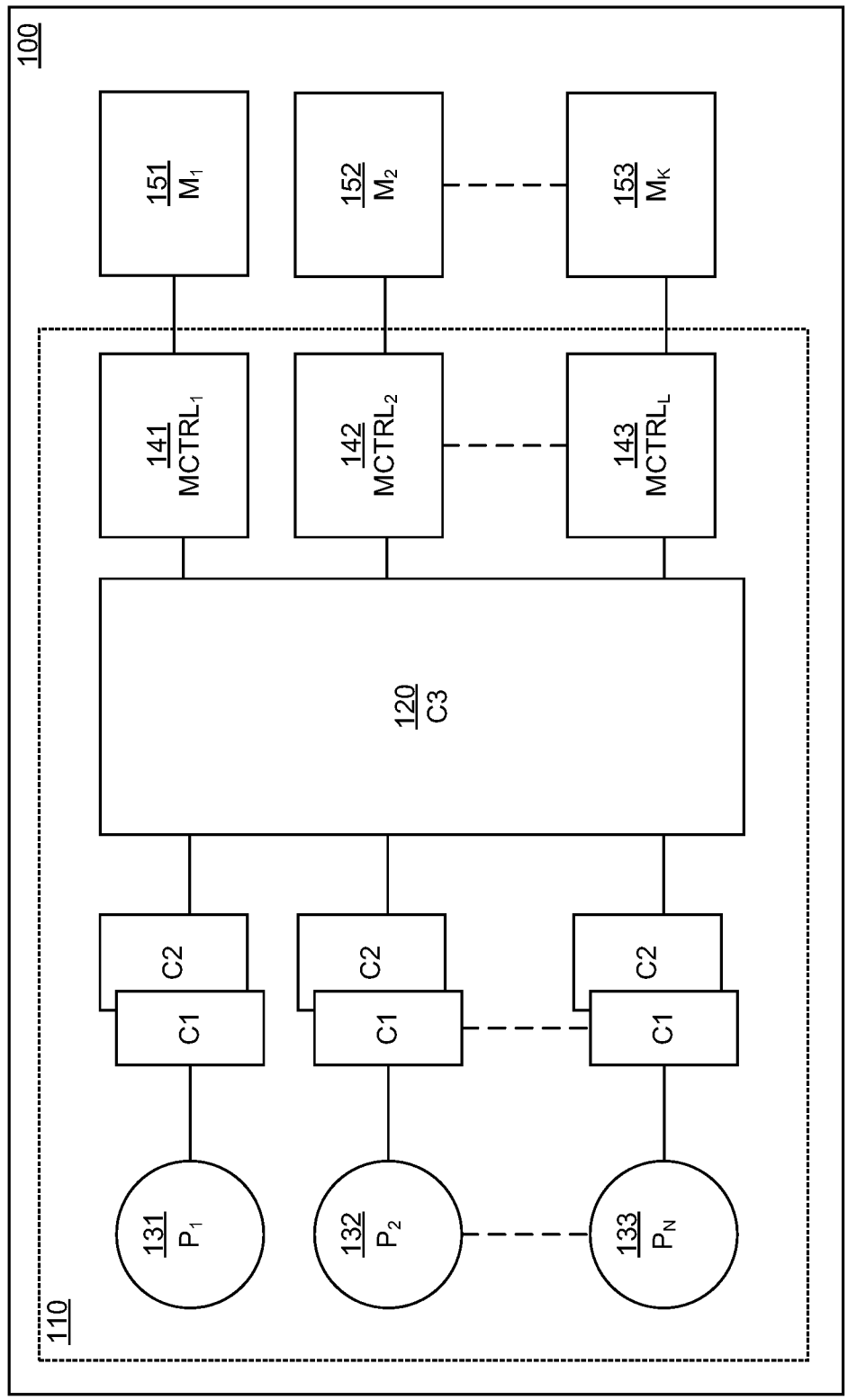
FIG. 1 depicts a computer system of the prior art, comprising a microprocessor chip with one or a plurality of processing units, an exemplary cache hierarchy of three levels, one or a plurality of memory controllers connected to one or a plurality of off-chip memories.

An exemplary embodiment of a conventional computer system 100 is depicted in FIG. 1. This system comprises a microprocessor chip 110 and one or a plurality of memory modules denoted $M_1$ 151, $M_2$ 152 through $M_K$ 153 and collectively referred to as main memory. The microprocessor chip could be a discrete system or integrated on a system-on-a-chip (SoC) in any available technology. The microprocessor 110 comprises one or several processing units, denoted $P_1$ 131 $P_2$ 132 through $P_N$ 133 sometimes called CPU or core and a memory hierarchy. The memory hierarchy, on the other hand, comprises several cache levels, e.g. three levels as is shown exemplary in FIG. 1 and denoted C1, C2, and C3. These levels can be implemented in the same or different memory technologies, e.g. SRAM, DRAM, or any type of non-volatile technology including for example Phase-Change Memory (PCM). The number of cache levels may vary in different embodiments and the exemplary embodiment 100 depicts three levels where the last cache level is C3 120. These levels are connected using some kind of interconnection means (e.g. bus or any other interconnection network such as a mesh or a torus). In the exemplary embodiment, levels C1 and C2 are private to, and only accessible by a respective processing unit i denoted $P_i$ (e.g. $P_1$ in FIG. 1). It is well known to someone skilled in the art that alternative embodiments can have any number of private cache levels or, as an alternative, all cache levels are shared as illustrated by the third level C3 120 in FIG. 1. Regarding the inclusion policy of the data in the cache hierarchy, any embodiment is possible and can be appreciated by someone skilled in the art. For example, C1 can be included in C2 whereas C2 can be non-inclusive with respect to level C3. Someone skilled in the art can appreciate alternative embodiments. The exemplary computer system 100 of FIG. 1 comprises one or a plurality of memory controllers, denoted $MCTRL_1$ 141, $MCTRL_2$ 142, through $MCTRL_L$ 143. The last cache level (C3 in FIG. 1) is connected to the memory controllers, which in turn are connected to one or a plurality of memory modules. Memory controllers can be integrated on the microprocessor chip 110 or can be implemented outside the microprocessor chip. Finally, a computer system runs one or more tasks. A task can be any software application or part of it that can run on the particular system.

Computer systems, as exemplified by the embodiment in FIG. 1, can suffer from a limited capacity of the memories denoted $M_1$ 151 through $M_K$ 153 and of the cache memories, regardless of level (e.g. C1, C2 and C3 in FIG. 1). A limited cache capacity can manifest itself as a higher fraction of memory requests having to be serviced at the next level in the memory hierarchy leading to loss in performance or higher energy consumption. To mitigate this problem, one can consider increasing cache capacity, thereby lowering the number of requests that need to be serviced by the next level of the memory hierarchy. Increasing the capacity of the cache levels on a microprocessor chip will lead to a number of problems. First, the cache access request time can increase leading to performance loss. Second, the energy consumed on an access request to a larger cache can potentially be higher. Third, using up more of the silicon or equivalent material on the microprocessor chip to realize larger cache levels may have to be traded for less processing capabilities. It is therefore desirable to realize more cache capacity without the problems identified above. A limited memory capacity has similar problems and can manifest itself in more memory requests that will have to be serviced at the next level of the memory hierarchy typically realized as the storage level of the memory hierarchy. Such storage-level accesses are, in general, considerably slower and may result in considerable loss in performance and energy expenditure. Increasing the memory capacity can mitigate these drawbacks. However, more memory capacity can increase the cost of the computer system both at the component level or in terms of energy expenditure. In addition, more memory consumes more space, which may limit the utility of the computer system, in particular in form-factor constrained products including for example mobile computers such as tablets, smart phones, wearables and small computerized devices connected to the Internet (also known as IoT (Internet-of Things) devices. Finally, the bandwidth provided by the memory modules may not be sufficient to respond to requests from the processing units. This may manifest itself in lower performance.

Computer Systems with Compressed Memory

Figure 2:
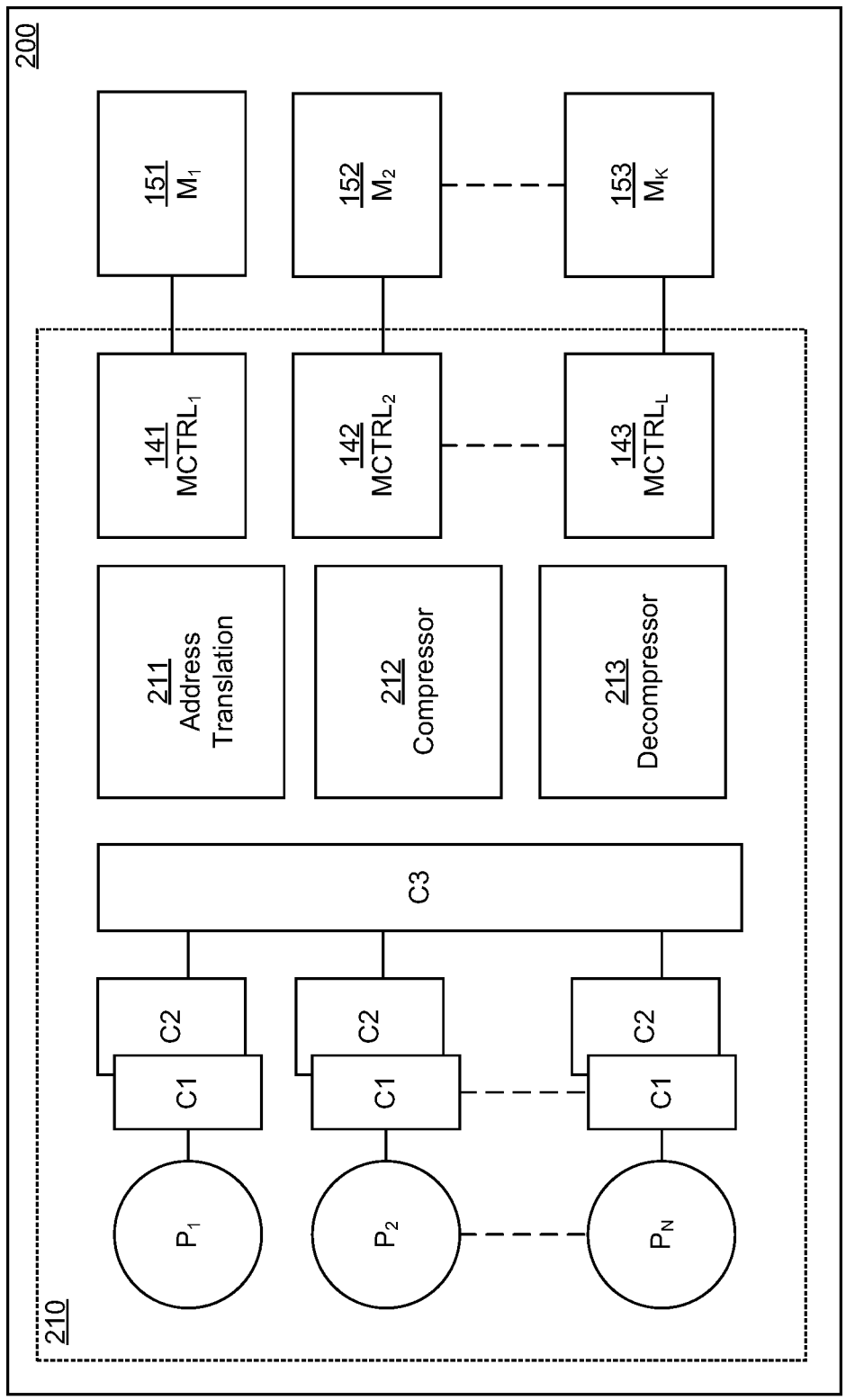
FIG. 2 depicts a computer system of the prior art, such as in FIG. 1, configured to compress and decompress data and instructions in memory.

To address particularly the problem of a limited main-memory capacity and a limited memory bandwidth, the exemplary system in FIG. 1 can be configured to allow data and instructions to be compressed in main memory. Such a computer system 200 is shown in FIG. 2. What has been added are three functional blocks on the microprocessor chip 210. These blocks comprise an address translation unit 211, a compressor unit 212 and a decompressor unit 213. These blocks are connected to the memory controllers on one side and the last-level cache C3 on the other side. The purpose of the address translation unit 211 is to translate a conventional physical address PA to a compressed address CA to locate a memory block in the compressed memory. Someone skilled in the art realizes that such address translation is needed in a compressed memory because fixed-size page (say 4 KB) used in conventional systems without compression can be compressed to any size less than the fixed size in the physical address space in a compressed memory system.

The purpose of the compressor unit 212 is to compress memory blocks that have been modified and are evicted from the last-level cache. To have a negligible impact on the performance of the memory system, compression must be fast and is typically accelerated by a dedicated compressor unit. Similarly, when a memory block is requested by the processor and is not available at any of the cache levels, e.g. C1, C2 and C3 in the exemplary embodiment of FIG. 2, the memory block must be requested from main memory $M_1$-$M_K$. The address translation unit 211 will locate the block but before it is installed in the cache hierarchy, e.g. in C1, it must be decompressed. The purpose of the decompressor unit 213 is to accelerate this process so that it has negligible impact on the performance of the memory system. Someone skilled in the art realizes that the functionality of the compressor and the decompressor unit depends on the type of compression algorithm being used. In one embodiment, one can use base-delta encoding where the difference between a value and a base value is stored rather than the value itself. In another embodiment, Huffman encoding can be used in which values that are more frequent than others use denser codes. Someone skilled in the art appreciates that there is a plurality of approaches with their own benefits and weaknesses when it comes to the compression ratio they achieve and the impact on performance in the compression and decompression processes.

Figure 3:
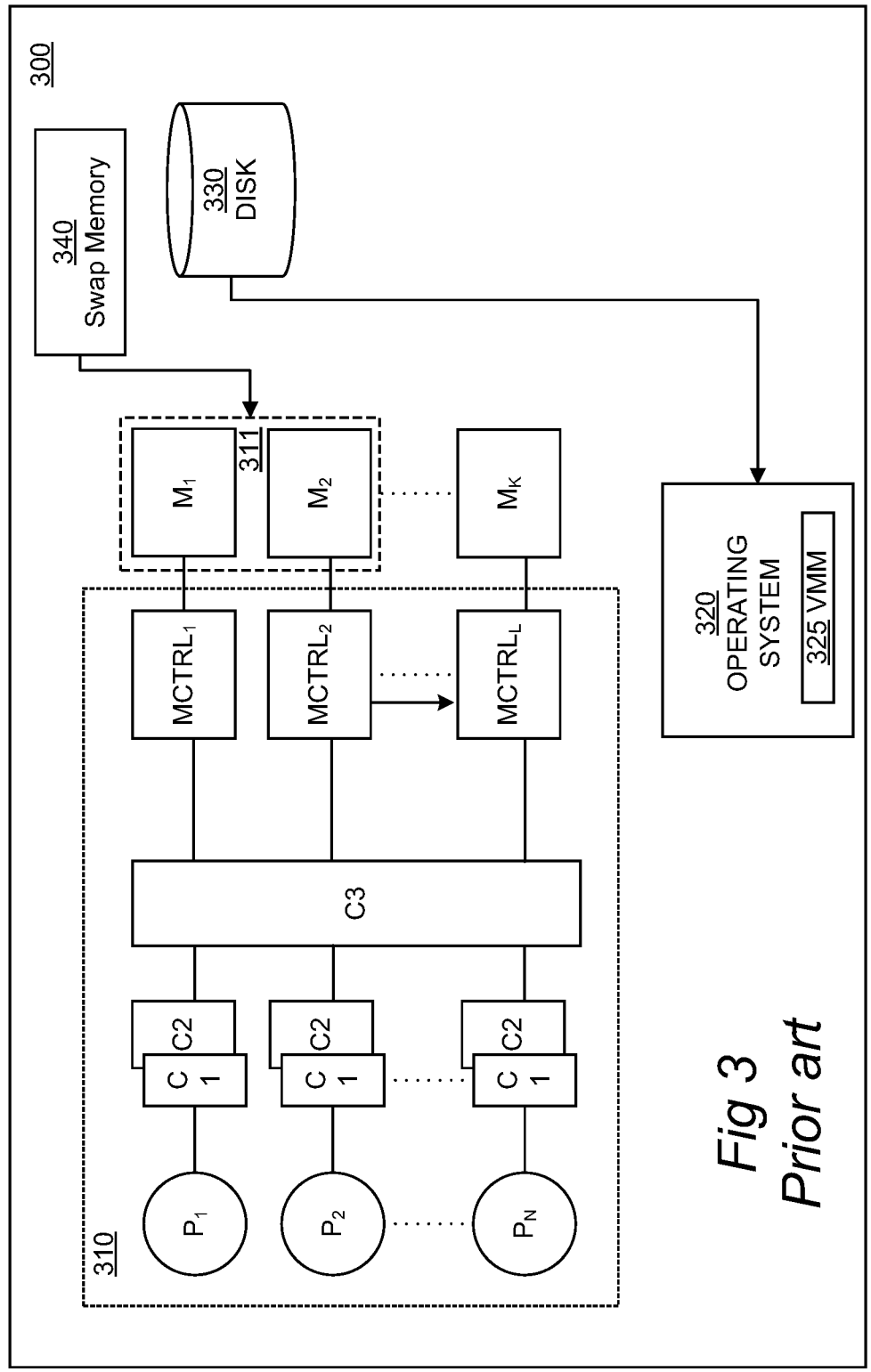
FIG. 3 depicts how a computer system of the prior art, such as in FIG. 1, can implement compressed memory using operating system functionality and the concept of swapped memory.

One of the objectives of a compressed memory system is to effectively increase the main memory and avoid costly accesses to secondary slower memory or secondary storage devices (e.g. the disks). FIG. 3 shows a computer system 300 which has been extended (compared to the computer system 200 in FIG. 2) with a secondary memory in the form of a disk 330 as an example embodiment. In a conventional computer system, when a memory block cannot be located in main memory, e.g. memory chips $M_1$ through $M_K$, the corresponding memory page is transferred from secondary memory, disk 330. By compressing the memory blocks in main memory, one can store more pages and thus avoid some of the costly page transfers from disk. These extra pages are stored in the memory space, henceforth referred to as the free space, freed up in the compression process.

Conventional computer systems without compressed memory, such as in FIG. 1, can still enjoy capacity increases using conventional support in the operating system. FIG. 3 shows a conventional computer system 300, without compressed memory, according to the embodiment of FIG. 1. In a conventional memory system, it is the responsibility of the Virtual Memory Manager (VMM) in the operating system 320 to make requests to the disk 330 when a new page is requested (page-in) or a modified page is evicted to leave room for another page (page-out). Some systems offer a fixed-size area in the physical memory (here exemplified by the memory modules $M_1$ and $M_2$ 311), referred to as swap memory 340, to host some of the pages being evicted or paged-out regardless whether they have been modified or not. Optionally, they are compressed before being stored in the swap memory (e.g. as in ZSWAP or ZRAM). However, such swap memory dedicates typically small portions, typically a few tens of percent, say 20%, of the available physical memory for avoiding costly disk accesses and does not use the free space made available by compressed memory systems that potentially can compress all pages. In contrast, what is disclosed next is an auxiliary memory that manages the space freed up in the available physical memory through compression to make the illusion of a larger physical memory. Next we provide an overview of the basic concept and operation of the auxiliary memory. Later on, we will explain in detail how the auxiliary memory is implemented and operated.

Auxiliary Memory—Basic Concept

In a compressed memory system, some portion of a fixed-size physical memory will be used for the compressed-memory blocks—called the active portion, whereas the rest of the physical memory will comprise a portion of the memory that is freed up through memory compression and not used—the passive portion. The auxiliary memory is made up of the passive part to expand the capacity of the physical memory. The auxiliary memory management expands memory by placing pages in the freed up part for use by the processor. In some embodiment, the pages are moved between the active and passive portions of the physical memory and in others the active and passive portions are accessed directly.

Figure 4:
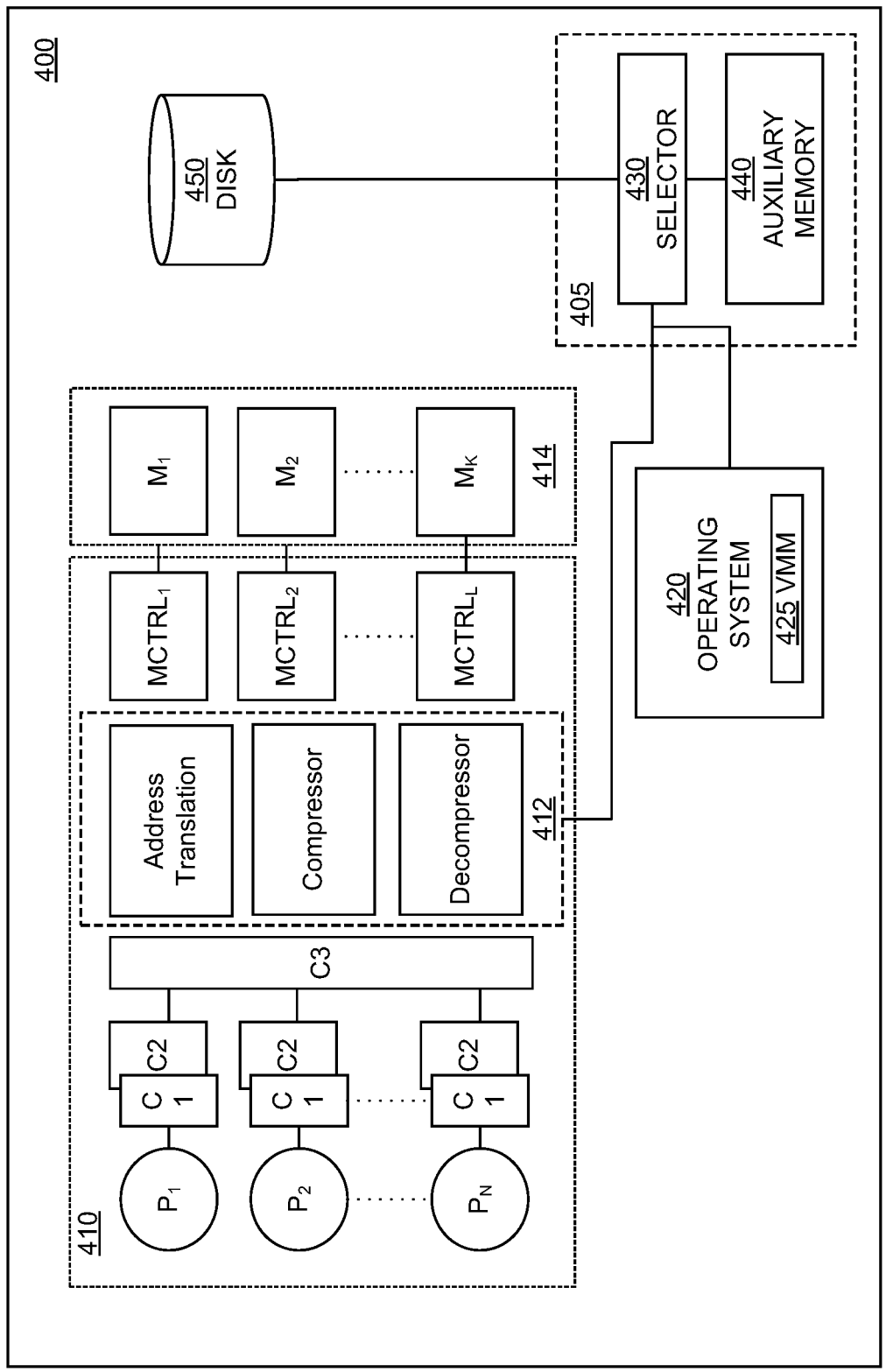
FIG. 4 depicts how a computer system with compressed memory, such as in FIG. 2, augmented with a selector and all auxiliary memory as disclosed in this document interacts with the operating system and the disk.

FIG. 4 provides an overview of the disclosed concept of an auxiliary memory. A compressed memory management arrangement 405 is provided for a computer system 400. The computer system 400 has one or more processors $P_1$-$P_N$, compressible main memory 414, secondary memory 450 and an operating system 420. The compressible main memory 414 has a compressed memory space comprising an active part directly accessible to said one or more processors $P_1$-$P_N$, as well as an inactive part not directly accessible to said one or more processors $P_1$-$P_N$ in the form of memory freed up by memory compression.

The compressed memory management arrangement 405 comprises an auxiliary memory 440 for maintaining a layout of the compressed memory space of the compressible main memory 414. The layout includes size and location of individual memory pages as well as free memory regions in the compressed memory space. The compressed memory management arrangement 405 moreover comprises selector functionality 430 interfacing the operating system 420, the secondary memory 450 and the auxiliary memory 440.

As will be explained in more detail with reference in the following, the memory management arrangement 405 is configured to a) trigger the compression of a memory page in the compressible main memory 414, b) intercept a page-in request from the operating system 420 to the secondary memory 450, use the layout of the compressed memory space maintained by the auxiliary memory 440 to locate, when available, in the auxiliary memory 430 a page requested by the page-in request, and make the located requested page available in the active part of the compressed memory space, and c) intercept a page-out request from the operating system 420 to the secondary memory 450, use the layout of the compressed memory space maintained by the auxiliary memory 440 to obtain a free region for a page requested by the page-out request, and accommodate the requested page in the obtained free region of the auxiliary memory 440.

In some embodiments, the auxiliary memory 440 (i.e. the inactive part of compressed memory space) physically resides in the compressible main memory 414 and is a representation of regions in the compressible main memory 414 freed up by memory compression. In other embodiments, the auxiliary memory 440 may maintain the layout of the compressed memory space of the compressible main memory 414 in a memory physically separate from the compressible main memory 414.

As will be explained in further detail below, the selector functionality 430 of the compressed memory management arrangement 405 may be configured to trigger the compression of a memory page depending on system conditions and relevant policies. Moreover, the selector functionality 430 may be configured to trigger the compression of a memory page when a new memory page is allocated (cf. 611 in FIG. 6 below), when a memory page is to be paged out, or when a memory page is to be paged in.

Figure 44:
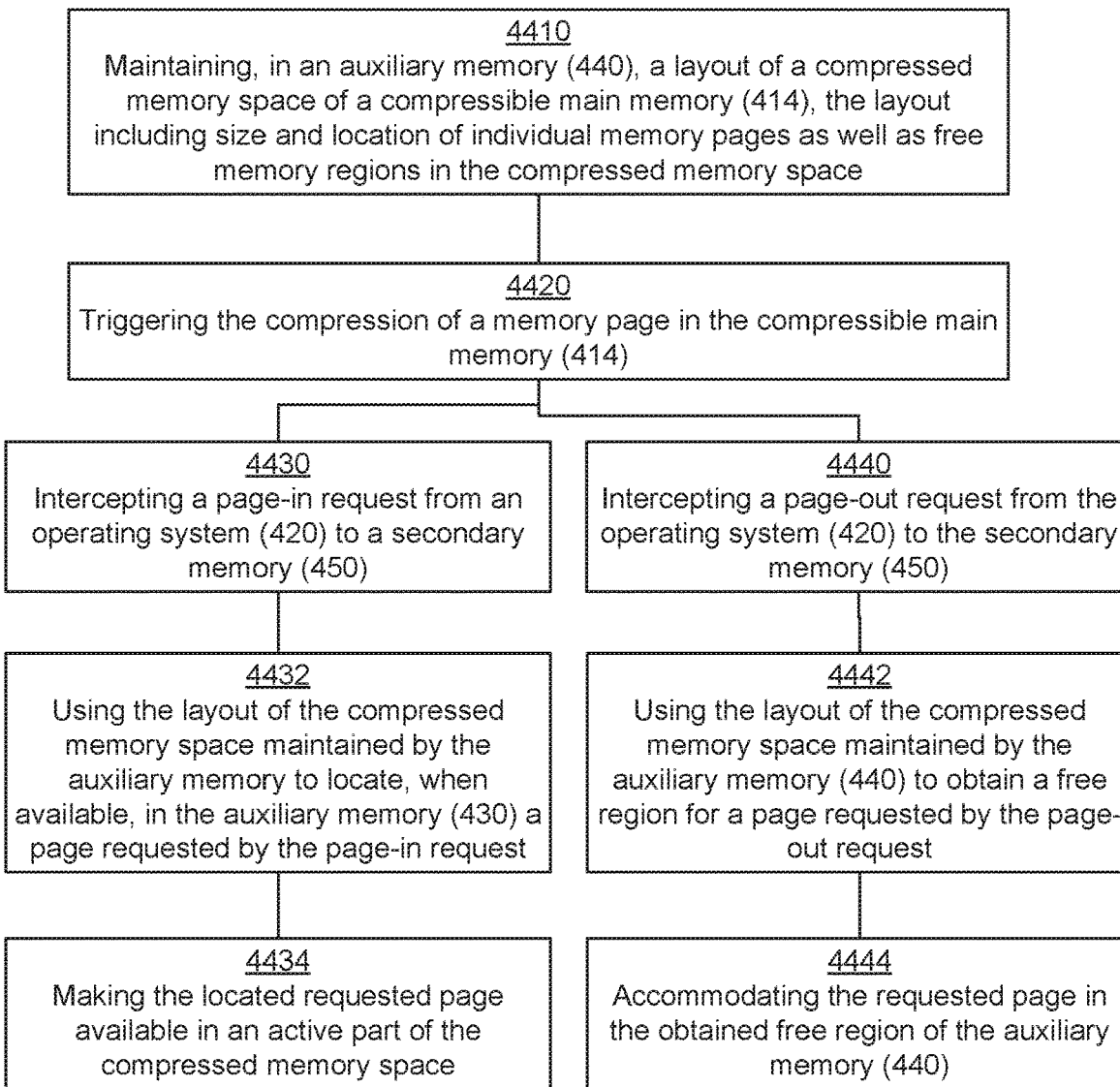
FIG. 44 depicts a compressed memory management method for a computer system as described herein.

A corresponding general compressed memory management method 4400 for the computer system 400 is disclosed in FIG. 44. The compressed memory management method 4400 comprises maintaining 4410, in the auxiliary memory 440, a layout of the compressed memory space of the compressible main memory 414, the layout including size and location of individual memory pages as well as free memory regions in said compressed memory space. The method further comprises a) triggering 4420 the compression of a memory page in the compressible main memory 414, b) intercepting 4430 a page-in request from the operating system 420 to the secondary memory 450, using 4432 the layout of the compressed memory space maintained by the auxiliary memory 440 to locate, when available, in the auxiliary memory 430 a page requested by the page-in request, and making 4434 the located requested page available in the active part of the compressed memory space, and c) intercepting 4440 a page-out request from the operating system 420 to the secondary memory 450, using 4442 the layout of the compressed memory space maintained by the auxiliary memory 440 to obtain a free region for a page requested by the page-out request, and accommodating 4444 the requested page in the obtained free region of the auxiliary memory 440.

Referring back to FIG. 4, the free space is kept track of and managed by the Auxiliary memory 440 shown in FIG. 4 at any point in time. The Auxiliary memory 440 can be interfaced to the computer system 410 which has support for compressed memory as in FIG. 2, through a device driver, here called Selector and implementing the aforementioned selector functionality 430, typically accessible by conventional operating system routines. In one example embodiment said device can have a similar interface to a disk. In another example embodiment said device can have an interface similar to Frontswap. The Selector 430 may also trigger the compression of a page. The Auxiliary memory can access the free space of the main memory in a way that will be described later. Similar to memory devices proposed in prior art, such as ZSWAP or ZRAM, the objective of the Auxiliary memory is to avoid costly accesses to disk by swapping them to a region in the physical memory—the freed-up space—rather than to the disk. However, techniques such as ZSWAP dedicate a fixed memory area for the memory device and optionally try to compress its content to get room for more pages in the aforementioned region. However, they do not utilize the memory space freed up in the entire physical memory as made available by a compressed memory system.

The Auxiliary memory disclosed in this document gathers all the memory space freed up in a compressed memory system. As the amount of freed up memory varies over time, depending on the current compression ratio, the Auxiliary memory does not have a fixed size. Its size is the same as the current amount of free space available and will vary correspondingly with the compressibility of pages present in main memory over time.

Auxiliary Memory—First Embodiment

Let us now describe in detail how the Auxiliary memory is implemented and operated in one embodiment. This is illustrated in FIG. 5-9. This embodiment should not be interpreted as a preferred embodiment. Someone skilled in the art can realize alternative embodiments. It is the intention that such alternative embodiments are also covered by this invention disclosure.

Figure 5:
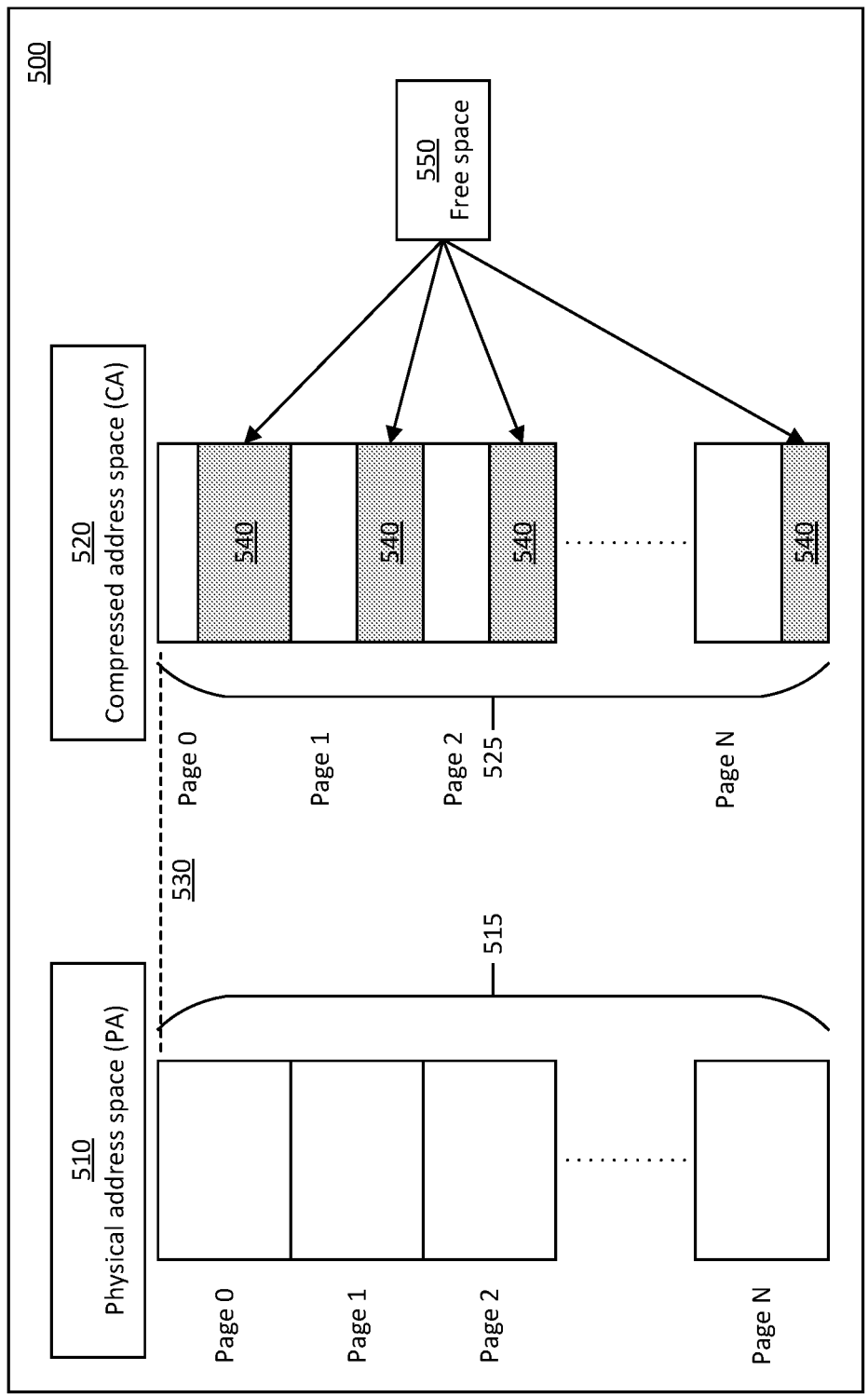
FIG. 5 depicts the memory layout of the disclosed compressed memory space.

FIG. 5 shows an exemplary memory layout of how physical pages in the physical address space 510 are mapped in the compressed memory in the compressed address space 520. In a conventional memory system, physical pages are mapped one after the other in main memory as shown in the memory layout of the physical address space 515. For example, assuming a page size of 4 KB, the first page starts at address 0 and the next page starts at the byte address $2^{12}$ and so on.

In the described embodiment, we assume that any physical page will start at the same address in the compressed memory space as in a conventional uncompressed (linear) physical address space. For example, as seen in the memory layout of the compressed address space 525 page 0 starts at the first address in the physical address space as well as in the compressed address space as depicted by the dashed line 530. Similarly, the second page starts at byte address $2^{12}$ in both the physical and the compressed address space. The difference between the mapping of pages in the physical and in the compressed address space is that a physical page always occupies the same amount of memory as defined by the page size, e.g. 4 KB. In contrast, a page in the compressed address space can occupy less space. For example, FIG. 5 shows that page 0 occupies only a fraction of the space of a physical page and the freed-up space is shaded in grey 540. The accumulated free space in the compressed memory system is made up of all the grey shaded fragments of all pages as illustrated by the arrows (550). It is the purpose of the Auxiliary memory of FIG. 4 to collectively manage the free space made up of fragments. such as the ones marked grey 540, and we will describe how this is done next.

Figure 6:
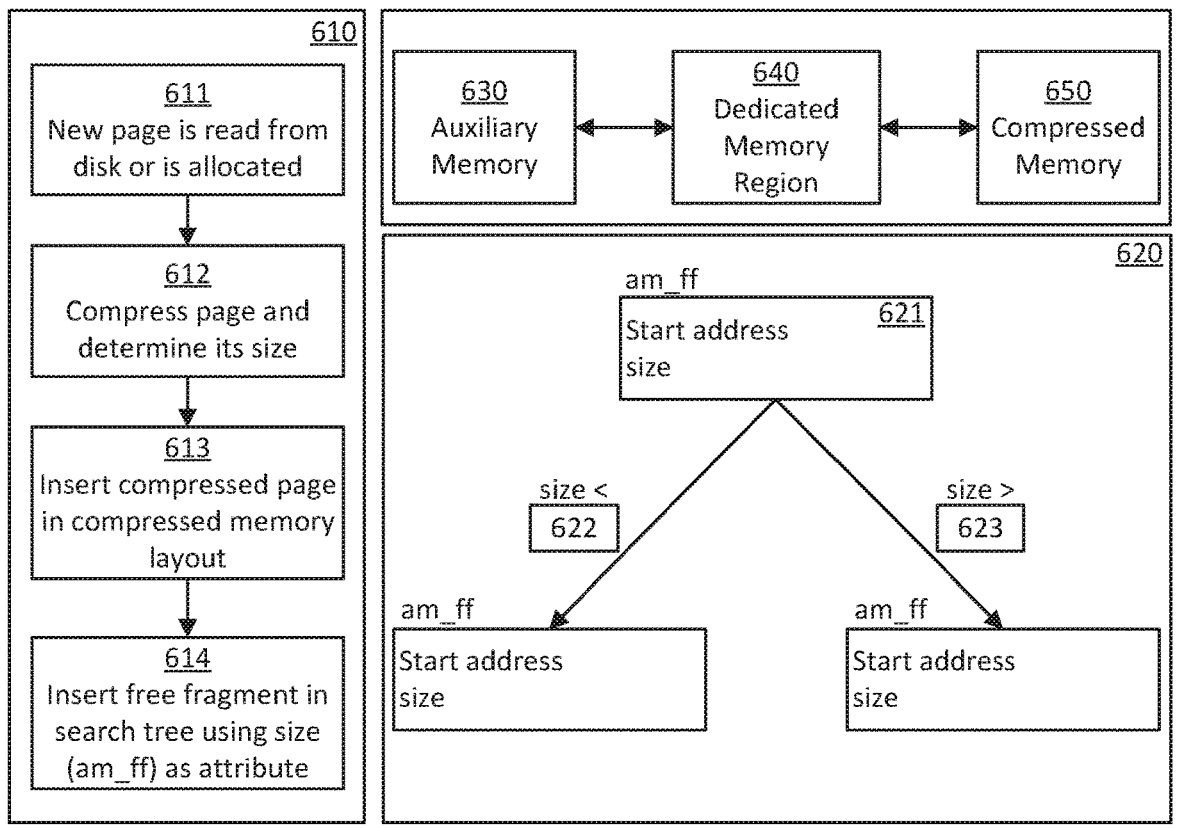
FIG. 6 depicts the process by which an auxiliary memory maintains the memory layout of a compressed memory space.

FIG. 6 shows a process 610 by which the Auxiliary memory at any point in time may trigger the compression of a page and keeps an up-to-date record of how physical pages are mapped in the compressed address space and where all free segments are located in the compressed address space. Just like in a conventional memory system, a new page is allocated in main memory in response to either a disk read operation or a page allocation event 611. Unlike in a conventional memory system, in a compressed memory system, and with reference to the first action in the process 612, every new page entering the main-memory system will potentially be first compressed, potentially by a hardware accelerator. In this process, the size of the page is determined in addition to the start address and size of the free fragment. This is recorded in a dedicated region of the memory 640 that the Auxiliary memory 630 and the mechanisms in the compressed memory 650 agree upon and both can read and modify. The dedicated memory region 640 is referred to also as MetaStorage (henceforth, dedicated memory region and MetaStorage are used interchangeably). In alternative embodiments, pages may or may not be compressed when they are allocated, while they may be compressed under certain system conditions, e.g. when the system memory utilization is high or when they are swapped out.

The Auxiliary memory keeps track of the location of each newly compressed page 613 and all free fragments contributing to the free space 614 as follows. Each time the VMM allocates a new page, this allocation request is intercepted by the Selector 430 in FIG. 4 which forwards the request along with the physical start address of the page to the Auxiliary memory 440. In alternative embodiments the Selector 430 may decide which pages to be compressed depending on the system conditions. For example, in one embodiment pages are compressed when they are evicted by the VMM. As the Auxiliary memory has access to the size of each compressed page through the aforementioned dedicated region 640, it can calculate the size and start address of the corresponding free fragment. The Auxiliary memory maintains an index of the free fragments in a data structure that allows efficient searches using the fragment's size as an attribute. FIG. 6. shows an exemplary embodiment of such a search tree 620, that provides search operations in logarithmic time, where the size of the fragment of each record (am_ff) 621 is the attribute. As shown in the exemplary search tree, if the size is less or equal to the current record, the search proceeds leftwards 622 and if the size is greater than the current topmost record, the search proceeds rightwards 623. In a different embodiment data structures with probabilistic guarantees (e.g. skip lists) could be used. The end result is that the auxiliary memory at any point in time keeps track of the memory layout concerning where each page is mapped and the location and size of all free fragments, that is, the current available freed-up memory gained from memory compression.

Thus, as has been explained above for FIG. 6, the compressed memory management arrangement 405 in FIG. 4 may be configured, when a memory page is triggered to be compressed, for: compressing 612 the memory page; determining 612 a size of the compressed memory page; determining a start address and size of a memory region freed up by the compression of the memory page; inserting 613 the compressed memory page in the layout of the compressed memory space maintained by the auxiliary memory 440; and inserting 614 the start address and size of the freed up memory region in the layout of the compressed memory space maintained by the auxiliary memory 440.

Also, the compressed memory management arrangement 405 in FIG. 4 may be configured for inserting 614 the start address and size of the freed up memory region in a data structure, such as a search tree 620, attributed by the size of the freed up memory region, said data structure being part of the layout of the compressed memory space maintained by the auxiliary memory 440.

We now turn our attention to how the Auxiliary memory can act as a fast backing store for pages evicted by the VMM. These pages would in a conventional system typically be discarded if they are not modified or otherwise sent to disk or to a fixed-size dedicated swap space, such as ZSWAP or ZRAM. In a fixed-size dedicated swap space, page-in (pages read from disk to physical memory) and page-out (pages evicted from physical memory) operations are trivial and well understood. In contrast, the size of the Auxiliary memory varies and so does the size of individual fragments depending on how well each page compresses in the compressed memory. This opens up a number of issues that the disclosed invention addresses.

Recalling again FIG. 4, on a page-out operation, the operating system will send a request to the disk using a device driver. In the disclosed invention, a new device driver—called Selector 430—is proposed that will intercept all page-out operations from the VMM in the operating system. Instead of discarding the page or writing the page back to disk, the Selector will attempt to store it in the free space available in the Auxiliary memory 440 to later avoid a costly disk access. In the event that the Auxiliary memory does not have space for the page, it will have to make space for it by evicting one or many currently stored pages. These pages are then evicted to disk 450. Likewise, on a page-in operation, instead of requesting a page from disk, the Selector will intercept the request. If the page is present in the Auxiliary memory, the Auxiliary memory will respond and transfer the page from the free fragment to the location as determined by the operating system. Alternatively, to avoid a costly transfer operation by basic load and store operations, this operation can be accelerated using DMA (Direct Memory Transfer) support. Notice that the page transferred from the Auxiliary memory will not be decompressed. In the event that the Auxiliary memory does not have the requested page, the page will have to be retrieved from disk 450. Let us now describe each of these processes in detail as they are described in FIG. 7-9.

Figure 7:
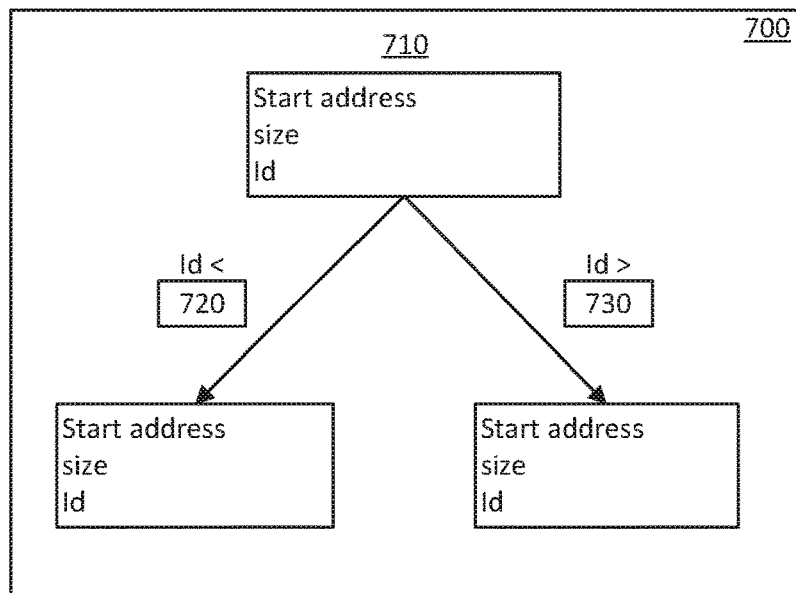
FIG. 7 depicts a data structure for locating a page stored in an auxiliary memory.

For the embodiment described, we start with describing some key data structures that are used by the Auxiliary memory to locate pages residing therein. FIG. 7 shows a data structure, in the form of a tree, that keeps track of the location of each page stored in the Auxiliary memory. Each page residing in the Auxiliary memory is associated with a start address, its size (after compression) and an identity (denoted Id). The start address is determined by where the page is stored in the Auxiliary memory and the process of determining it will be described later. The size is known from the aforementioned data structure called "dedicated memory region" described in relation to FIG. 6. The identity, the "Id", is provided by the VMM in the operating system. Any request to disk from the VMM, that according to the description in relation to FIG. 4 is intercepted by the Selector 430. The Selector builds a data structure that contains information about any page stored in the Auxiliary memory with Id as a unique identifier. Hence, Id can be used by the Selector to determine whether or not the page resides in the Auxiliary memory. Going back to FIG. 7, pages resident in the Auxiliary memory are kept track of by the exemplary tree structure shown. To locate a page, the Id is used as a key and the tree is traversed to locate the record for the page located for in logarithmic time. At each node, if the Id is less than the node's Id, then the search proceeds in the left branch 720, otherwise the search proceeds in the right branch 730. In a different embodiment, other data structures supporting key-based search instead of a tree may be used, for example hash tables and key-value stores.

Figure 8:
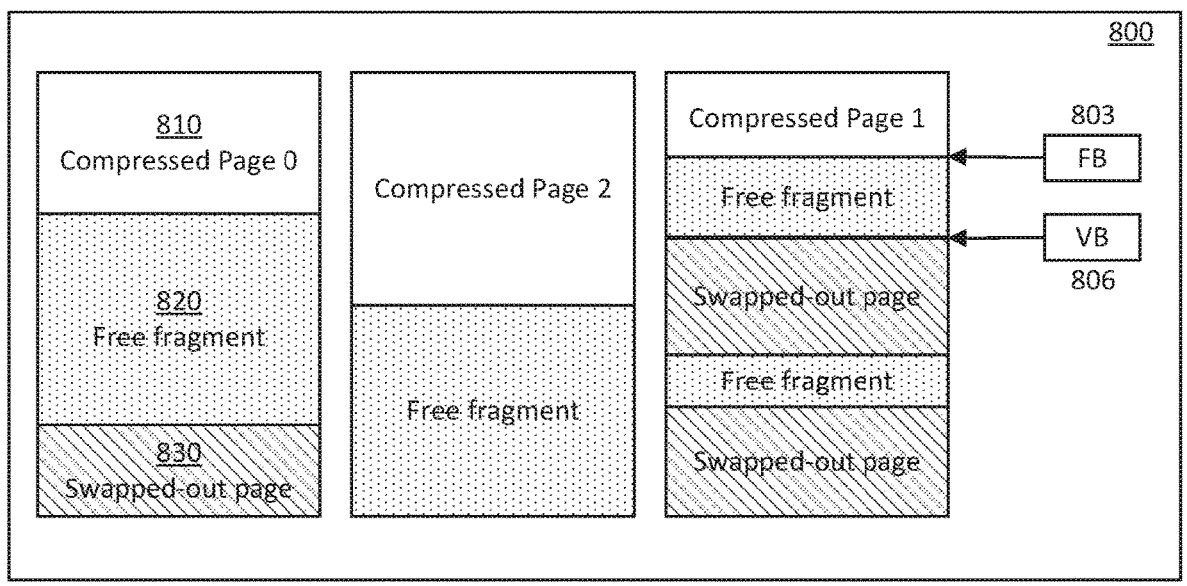
FIG. 8 depicts an exemplary layout of the content of an auxiliary memory.

Going back to the memory layout at an exemplary but arbitrary point in time of a compressed memory system, according to FIG. 5, the free space 550 is made up of all free fragments. Recalling that these free fragments make up the memory available for the Auxiliary memory, let's consider an exemplary snapshot how this "freed-up" space is used. This is illustrated in FIG. 8. The memory layout of three exemplary pages (Page 0, Page 1 and Page 2) are shown. Focusing on the exemplary use of the page frame that stores Page 0 (810), to the left in FIG. 8, we note that Page 0 (810) occupies the first portion of the physical page frame allocated for it. The freed-up space, if not used, is associated with the rest. In the exemplary snapshot, a page currently using up the freed-up space, denoted "Swapped-out page" 830 is allocated in the free fragment. In the described embodiment, a page stored in the Auxiliary memory that will be al located in a yet unallocated free fragment will be stored at the end of the page frame. Hence, the placement of the "Swapped-out page" 830. After a swapped-out page has been allocated, a new free fragment will be created (820) whose size is the difference between the size of the page frame minus the compressed page and the size of swapped-out page, that is, the allocated stored page in the original free fragment.

As requests from the VMM for allocations and deallocations arrive at the Auxiliary memory, the free fragments will be occupied by pages swapped out and new free fragments will be created. As an exemplary snapshot, consider the layout of the page frame that stores Page 1 in FIG. 8. Here, Page 1 is allocated in the beginning of the page frame followed by a free fragment, followed by a page stored in the Auxiliary memory (a swapped-out page), followed by a free fragment, and finally another swapped out page. Finally, to the far right of FIG. 8, the page frame is occupied by the allocated page, denoted Page 2 and the rest of the page frame is a free fragment.

Figure 9:
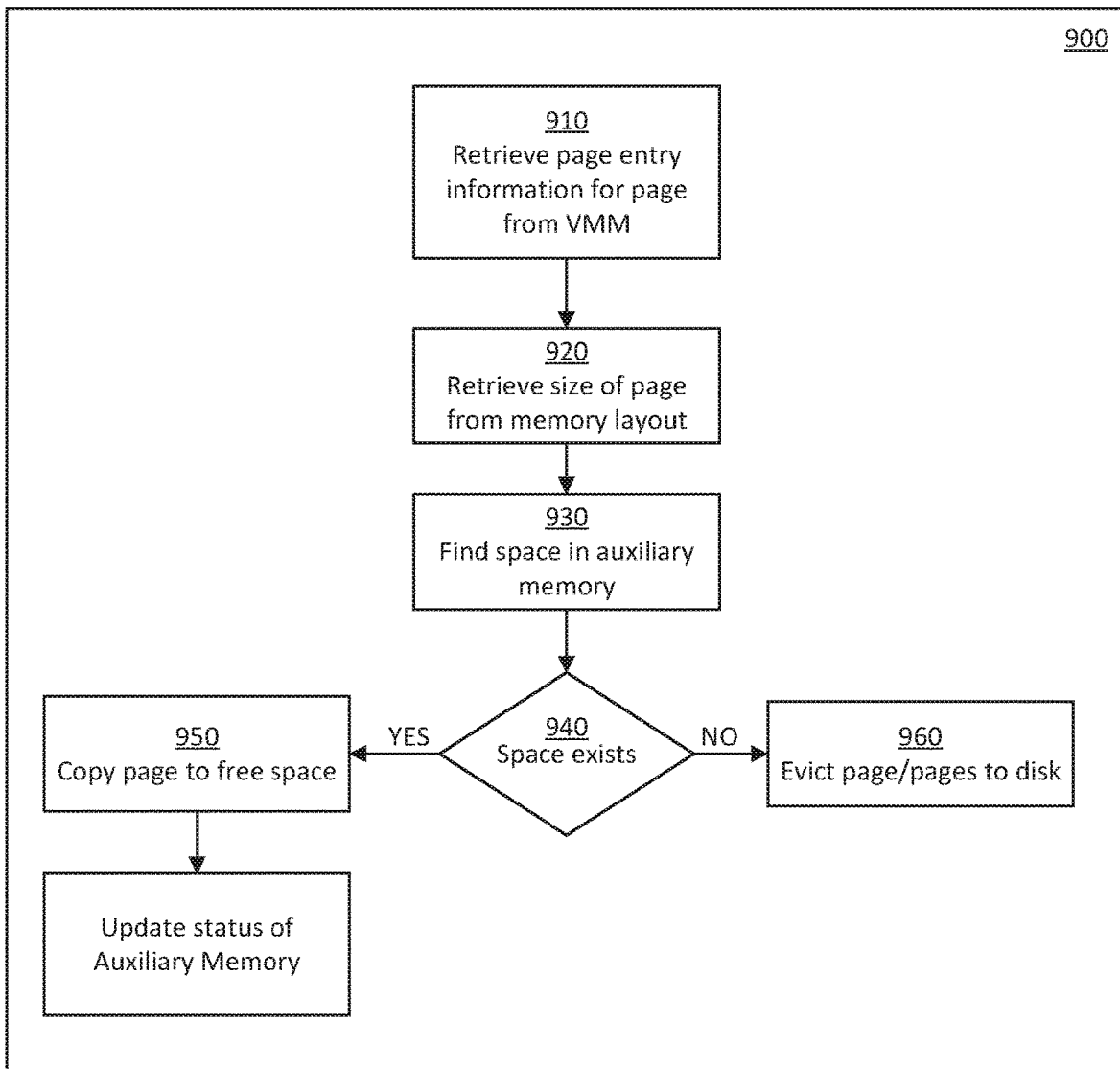
FIG. 9 depicts a process by which an auxiliary memory intercepts and responds to page-out requests from the VMM.

FIG. 9 describes the process by which the Auxiliary memory handles page-out requests. When the VMM of the operating system has decided to evict a page, recall that the corresponding page-out request is intercepted by the Selector 430, as explained in relation to FIG. 4. The Auxiliary memory starts by retrieving the page entry information 910 of that page from the Selector 430. The next step is to retrieve the size of the page from the memory layout 920. As explained in relation to FIG. 6, the Auxiliary memory has access to the size of each page in its memory layout as described in the context of FIG. 5 through the dedicated region in the memory 640. It then uses that information to find space for the page 930 by doing a search in the tree data structure 620 of FIG. 6. If space exists, corresponding to YES in the decision box 940, a page transfer from its current position to the free fragment identified in the search space is initiated 950. This can be done by simple load/store operations or accelerated by Direct Memory Access (DMA). The search structure 700 described in relation to FIG. 7 is updated with a new record corresponding to this page so that it can later be located. On the other hand, if no space exists, one or possibly several pages currently residing in the Auxiliary memory may have to be evicted and transferred to disk 960. When there is space for an evicted page in the Auxiliary memory, that page is copied from the end of the fragment so as to be as far away from the compressed page that shares the same page frame as shown in the exemplary memory layout of FIG. 8. This is important when the size of the compressed page will increase as a result of dynamic data changes. In a different embodiment, if the page to be evicted is compressed and in the same frame reside other swapped out pages, as for example in page 0 of FIG. 8, then the selector may opt to transfer to another part of the auxiliary memory both the compressed page 810 and the swapped-out page 830, what we refer to as eager page-out eviction. Someone skilled in the art can consider alternative embodiments using lazy eviction relying on the overflow mechanism described later.

Regardless, unless the page having been deposited in the Auxiliary memory has the exact same size as the free fragment, a new free fragment, which is smaller than the original one will be created. This free fragment is book-kept in the search structure of 620 in FIG. 6 to aid in subsequent page-out operations.

As will be understood from the above, the compressed memory management arrangement 405 in FIG. 4 is thus further configured to obtain a free region for a page requested by a page-out request by checking the layout of the compressed memory space maintained by the auxiliary memory 440 to find a free region big enough for the requested page. If a big enough free region is found, the compressed memory management arrangement 405 accommodates the requested page in the free region found, and otherwise selects a victim page in the auxiliary memory 440, evicts the victim page by writing it to the secondary memory 450, and obtains the free region from space freed by the eviction of the victim page. In an alternative embodiment, if a big enough free region is not found, a victim page is selected in the auxiliary memory 440, and the victim page is split into a plurality of sub-pages as long as there are free regions big enough to accommodate them all. Otherwise, the victim page is evicted by writing it to the secondary memory 450 to obtain the free region from space freed by the eviction of the victim page. In another alternative embodiment, if a big enough free region is not found, the requested page is split into a plurality of sub-pages as long as there are free regions big enough to accommodate them all. Otherwise, a victim page is selected in the auxiliary memory 440, and the victim page is evicted by writing it to the secondary memory 450, wherein the free region is obtained from space freed by the eviction of the victim page.

Figure 10:
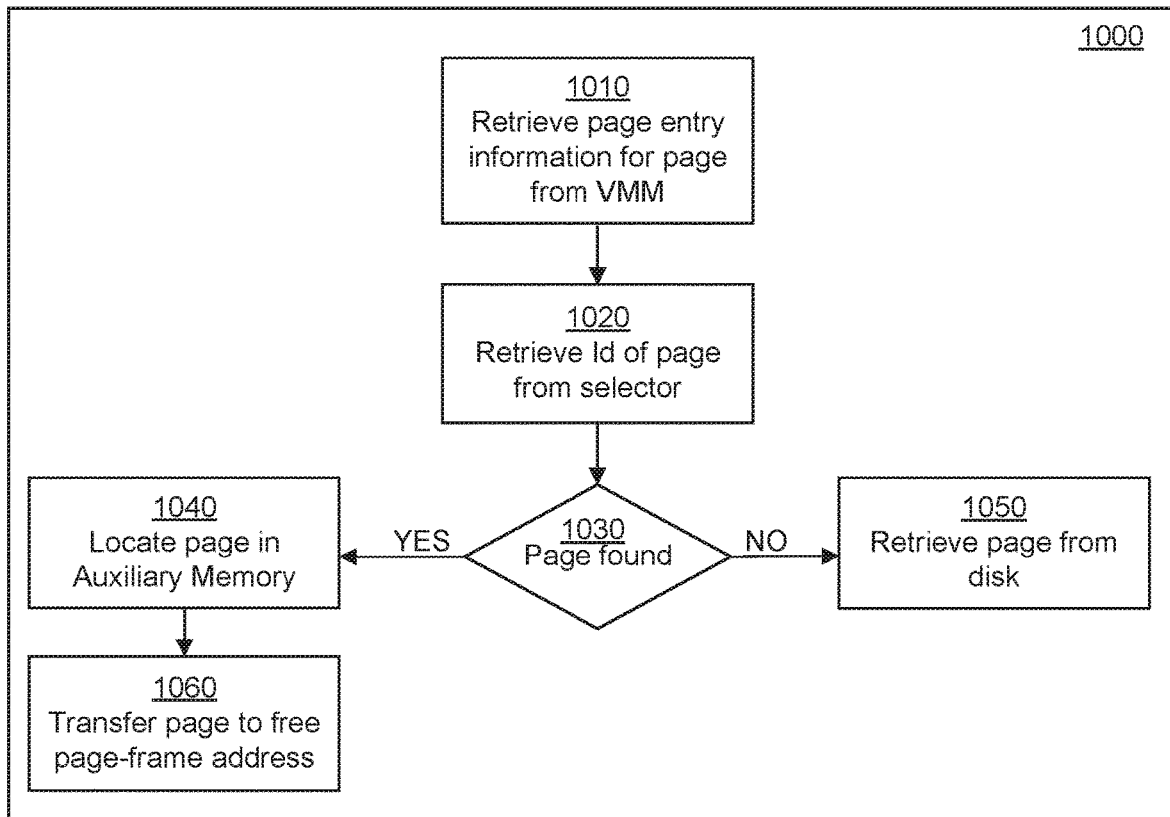
FIG. 10 depicts a process by which an auxiliary memory intercepts and responds to page-in requests from the VMM

FIG. 10 describes a process 1000 by which the Auxiliary memory handles page-in requests. First, on each page-in request, the VMM will provide page entry information comprising the virtual address or the requested page or a unique Id, as well as the physical address, let's call it "free page-frame address" for later reference, where that page will be copied 1010 to. The Selector 430 keeps track of all pages currently stored in the Auxiliary memory and their associated Id. If the page is not found, that is, there is not a matching Id, the decision box 1030 selects the next step to be to retrieve 1050 the page from disk, as in a conventional system. On the other hand, if there is a match, the next step 1040 is to locate the page in the Auxiliary memory. The request is then forwarded to the Auxiliary memory with the aforementioned "free page-frame address". The Auxiliary memory uses the Id provided by the Selector to locate the block by identifying the record associated with the page in the search data structure 700 described in relation to FIG. 7. When the record is located, it can retrieve the size and the start address in the free space maintained by the Auxiliary memory of the requested page. However, before it can copy that page to the "free page-frame address" dictated by the VMM, it has to ascertain that the requested page has a size that is the same or less than the size of the aforementioned "free page-frame address". The Auxiliary memory will do a lookup in the Dedicated Memory Region 640 described in relation to FIG. 6 to establish the size available for the requested page. If the requested page size is greater than the available size, space has to be reclaimed. This comprises moving one or several pages stored in the free fragment of that page frame to other available free fragments in the Auxiliary memory. This follows the process of page-out described in relation to FIG. 9. This can lead to many memory-to-memory copy operations that can be supported by ordinary loads/stores or alternatively by DMA. To avoid some such copy operations, several heuristics can be used. One heuristic is to not consider storing uncompressed pages in the Auxiliary memory. Another heuristic is to only store pages in Auxiliary memory that compress to a certain level. Other heuristics can be considered that can be appreciated by someone skilled in the art and are intended to be part of this patent disclosure.

As already mentioned, the size of a compressed page may vary dynamically during its lifetime. This invention includes systems, devices and methods to track such changes and assist in maintaining the memory layout. When the size of a compressed page is modified during a memory write operation, which may be done by a hardware accelerator, the page may either expand to a subsequent free fragment (e.g. as in page 0 of FIG. 8) or shrink creating more free space. A device responsible for handling the changes of the actual compressed size of a page as new write requests for a page arrive into memory, is from now called overflow device. One exemplifying embodiment of a sector overflow device and associated handling of sector overflow will be described later with reference to FIG. 39-43; other embodiments are however also fully conceivable, as the skilled person would readily realize. In the case where a compressed page expands long enough to consume the entire following free fragment and collides with a swapped-out page, an interrupt mechanism is included in the invention. Said interrupt mechanism ensures that a swapped-out page will not be overwritten and that the Auxiliary memory shall move it appropriately to free space for the compressed page to expand.

Let us now elaborate on one embodiment of the system that tracks the dynamic changes of page sizes. Information on the size of the compressed pages and the boundaries between them and free fragments is tracked in the Dedicated Memory Region (640). Exemplary page frames are shown in FIG. 8. Said information includes the size of a compressed page, a boundary showing where the first free fragment starts (803) and a boundary showing where swapped-out pages reside (806)—if any. Since both the compressed memory mechanisms, i.e. the aforementioned overflow device, and the Auxiliary Memory may modify the information in the Dedicated Memory Region (640) a locking mechanism is included to protect the data from corruption. The overflow device may freely expand the size of a compressed page utilizing the following free fragment and moving the relevant boundary (FB 803) appropriately but without surpassing the boundary indicating where swapped-out pages are (VB 806). Modifications of the compressed size may be tracked by the Auxiliary Memory by verifying the contents of the Dedicated Memory Region whenever free fragments need to be used. In a different embodiment, this verification could be done periodically. In another embodiment, an additional hardware accelerated messaging system may be used for propagating such changes from the overflow device to the Auxiliary Memory. The Auxiliary Memory modifies the contents of the Dedicated Memory Region (640) when it utilizes free fragments and places swapped-out pages or when it handles a page-in request. Going back to the case where the overflow device may expand a compressed page, if the following free fragment is not large enough and the two boundaries collide, then the overflow device raises an interrupt and a method of the auxiliary memory handles it by moving swapped out pages, similarly to a page out operation. in order to free more space.

As has been described above, the memory management arrangement 405 is configured to handle dynamic data changes in the compressed pages. Furthermore, the memory management arrangement 405 is configured to track dynamic data changes by: as a result of one or more new write requests, allowing a compressed memory page to expand into a free memory region (possibly an adjacent free memory region) in the compressed memory space; causing an interrupt if the compressed memory page expands into an adjacent swapped-out page in the compressed memory space; and protecting the swapped-out page from being overwritten by capturing the interrupt and moving the swapped-out page to a free memory region, thereby allowing the compressed memory page to expand.

Auxiliary Memory—Second Embodiment

We define an active page, as a page of memory that is currently being used by the application or the system, meaning that it is present in the physical memory, i.e., there is a valid mapping between its virtual address and its physical address in the operating system's page table. Hence, it can be read or written by the processor straightforwardly using standard load and store instructions. We refer to memory pages that have been discarded from the physical memory as inactive pages, for example pages that have been selected to be stored in the lower part of the hierarchy e.g. the swap storage space. Hence, based on the present invention as described in the previous embodiments of the Auxiliary memory both an active and an inactive page can be present in the main memory (i.e., the actual compressed memory) that is addressed using the compressed address space. The difference is that an active page must be able to be found on-the-fly for example, when a processor load or store command is triggered or as a second example, when the operating system triggers a page-out operation. On the other hand, an inactive page that has been placed in the compressed memory by the Auxiliary memory is retrieved by said memory.

In the exemplary memory layout of FIG. 5, the physical address space maintains an uncompressed view of the memory which is the one exposed to the operating system and the processor so that memory compression is transparent to the rest of the processor/operating system. The compressed address space is divided also in page frames where each frame has the same fixed size as in the physical address space. In said exemplary memory layout, an active page mapped by the OS to a physical page frame, say page 1 (left of FIG. 5), is also expected to be found in the same frame in the compressed address space, i.e., also page 1 (right of FIG. 5). What is different is that the size of the pages in the physical address space is always fixed (e.g., 4 KB), while in the compressed address space page sizes may be different. With such a memory layout, the translation from the physical address space to the compressed address space requires therefore to comprise only the actual size of the compressed active page so that the Auxiliary memory knows the amount of data to copy or move when needed e.g., on a page-out operation.

In other words, all active pages are located and aligned to the memory frames as in an uncompressed memory system. This means that the address of the physical page frame given by the operating system points implicitly to the beginning of the data in the compressed space. In order to support this translation, the system needs to copy or move compressed pages back-and-forth within the Auxiliary memory space whenever a page is selected for a swap-in or swap-out event. This can cause unnecessary transfers of data.

Figure 11:
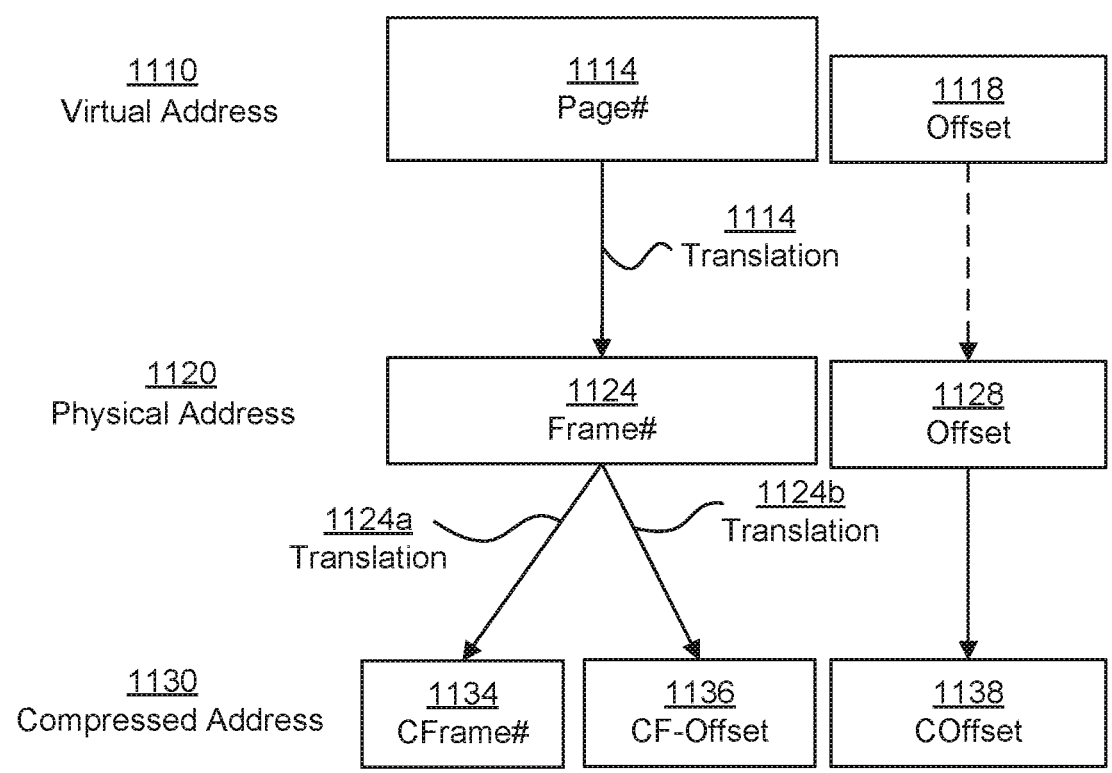
FIG. 11 depicts address translation from Virtual to Physical to Compressed addresses.

In a second embodiment of the proposed Auxiliary memory, referred to as Zero-Copy, it is possible to avoid the previously mentioned transfer of pages between the auxiliary memory space and the operating system managed physical memory space by introducing an alternative memory translation process from physical to compressed addresses. In this case, as shown in FIG. 11, the page number 1114 in the virtual address 1110 is translated by the operating system to a frame number 1124 resulting in the physical address 1120. This frame number, which in case of the Zero-Copy is a virtual frame, is then translated to a physical memory frame (also known as compressed frame—CFrame) 1134 and a compressed frame offset (CF-Offset) 1136 since there is no alignment between the starting address of a page in the physical and compressed address space. This last translation 1124 is performed using extra metadata (detailed in the next paragraph) that is typically stored in the MetaStorage (dedicated memory region 640 of FIG. 6).

Figure 12:
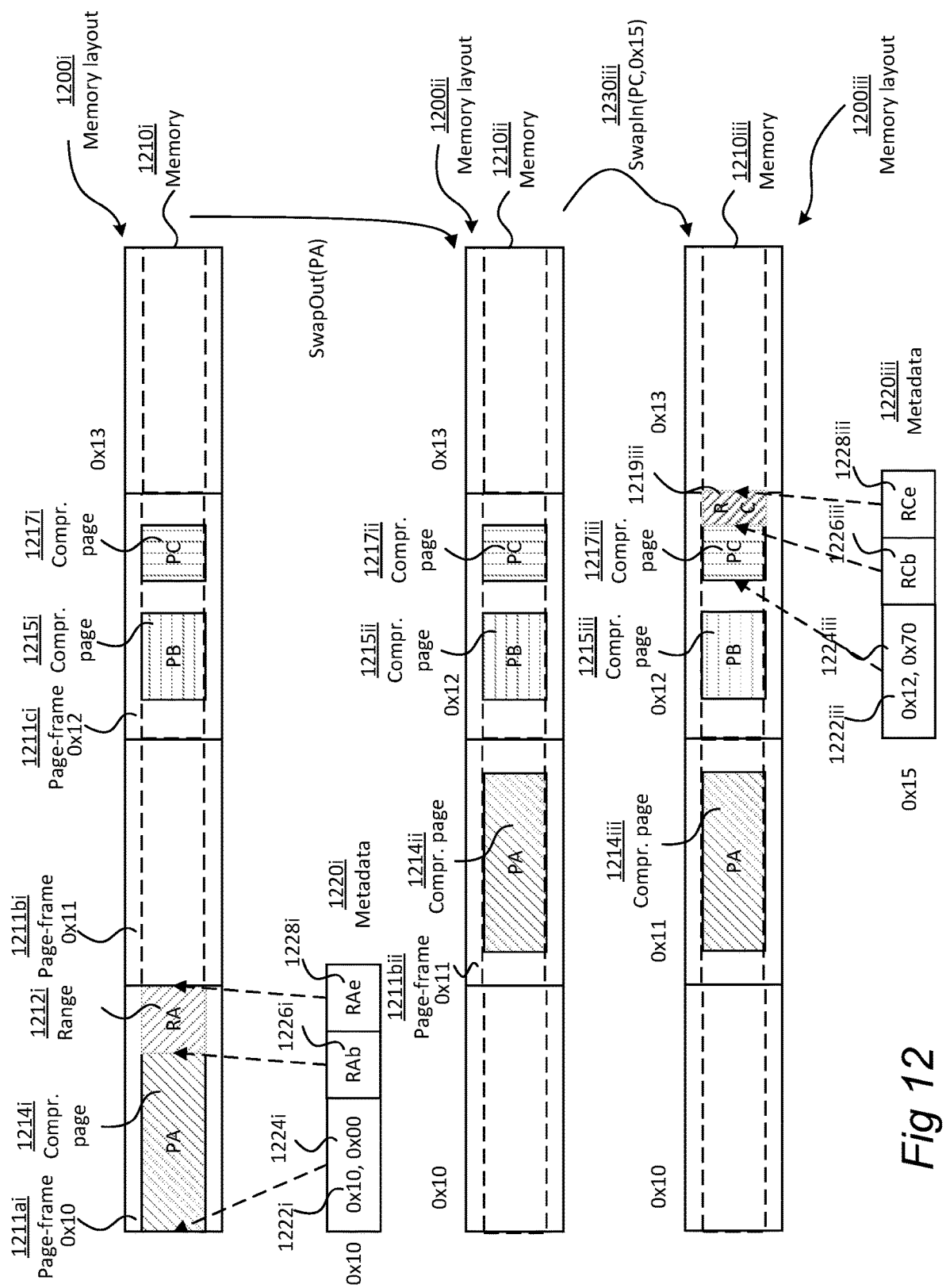
FIG. 12 depicts an exemplary memory layout of compressed pages for a Zero-copy Auxiliary memory embodiment and the metadata needed to support said layout.

In a first exemplary management of the compressed and free space, the beginning of the compressed frames is left empty for the OS to be able to easily allocate new memory space. Thus in Zero-Copy, pages are moved once at the first time they are target of a swap out event. An example of the evolution of the memory layout with the sample swap events is shown in FIG. 12; there are three example instances of said layout for three execution points denoted with Latin numbering: i, ii and iii.

The compressed memory 1210 comprises page frames 1211 (e.g., 1211ai, 1211bi, etc in the memory layout 1210i). An active page PA 1214i is initially aligned to the Page-frame 0x10 1211ai. An active page has also a corresponding space for growing its size in case its contents result in a change in the compression ratio; in the previous Auxiliary memory embodiment said space is a free fragment defined with the boundaries FB 803 and VB 806 in FIG. 8. Said space is referred to as Range; for PA 1214i the range is RA 1212i, which is the rest of the space in Frame 1211ai. The translation metadata for the compressed page PA 1214i comprises two pair of fields: one pair is the CFrame 1222i and CF-offset 1224i which define where in the compressed memory the page is stored; the second pair RAb 1226i and RAe 1228i define the Range boundaries associated with PA;

RAb 1226*i* is the beginning address of the Range RA and RAe 1228*i* is the ending address of said Range. Moreover, in the first layout instance i, there are two other pages PB 1215*i* and PC 1217*i* which are inactive and stored in the Frame 1211*ci*. If the system now requests the swap out event for PA 1214*i* the Auxiliary Memory is called and gives PA a free fragment in the Frame 1211*bii* (layout instance i). The page is selected to not be placed completely at the end of said Frame 1211*bii* so that a Range can be allocated there whenever the PA becomes active. For a further new event which is a swap in event for page PC 1217*ii*, said page which is inactive, is not moved to the Frame 0x15 mentioned in the swap in request 1230*iii* but instead it remains in the frame 0x12 where it is and is set to "active" by the Zero-copy Auxiliary memory system by modifying the corresponding entry in the MetaStorage 1220*iii*. The first pair of fields is the CFrame 0x12 1222*iii* and the CF-Offset 0x70 1224*iii*, indicating the starting address and offset for the compressed page PC; the second pair of fields define the Range associated to PC which is the RC 1219*iii* with addresses ranging from RCb 1226*iii* and RCe 1228*iii*. Notice that the MetaStorage entry for said page PC is determined by the number of the frame (0x15) provided by the OS on the swap-in event. As shown, active pages can now be in any place in memory, not only aligned to the frame boundaries.

In an alternative embodiment, when PA 1214*i* is swapped out to frame 1211*bii*, the page is placed at the end of the frame utilizing the free area more efficiently than the previous embodiment. However, if it becomes active, then if there is no available space in said frame to allocate for the Range, the page can be selected to be moved to another frame where there is space for a range, or to be assigned a remote range or to not be assigned any range at all and need to be moved to another frame if it expands.

Figure 13:
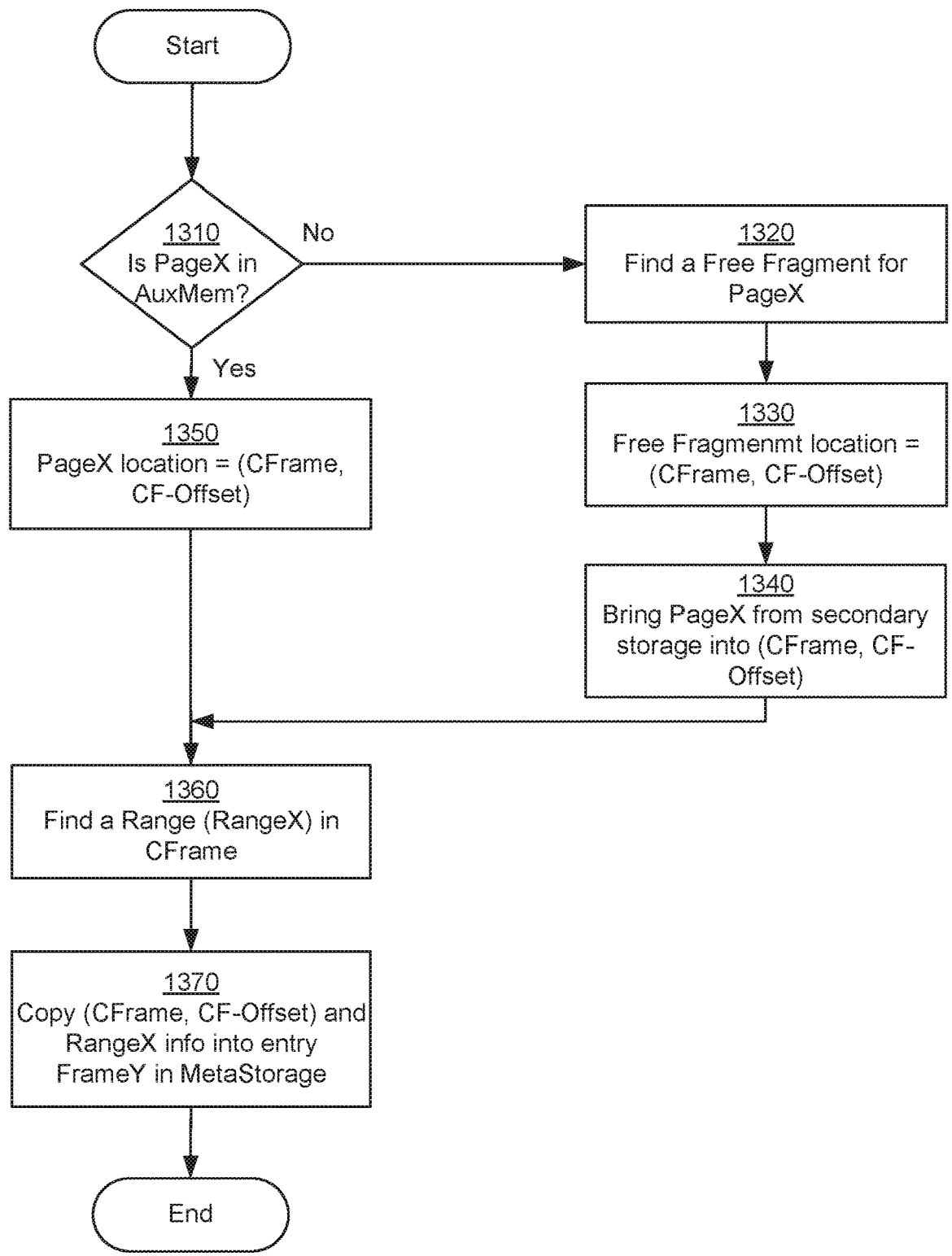
FIG. 13 depicts an exemplary process for a swap-in operation in the Zero-copy Auxiliary memory embodiment.

The sequence of events followed for a swap in event in the Zero-Copy embodiment is presented in the flow diagram in FIG. 13. If a swap in event is issued to bring Page X from the swap space to Frame Y, it is first checked 1310 whether Page X is present in the Auxiliary Memory space. If the page is not present, then a free fragment large enough to bring the page contents needs to be found 1320 and the free fragment location is recorded 1330. Notice that this free fragment does not need to be aligned with the beginning of the frame as in the previous embodiments. Then the page is transferred 1340 using for example a DMA operation as describe before. The starting address for its location is provided by the CFrame and CF-Offset which need to be copied to the first pair of fields in the Metadata for Frame Y (1370). The rest of the free fragment space is used as a Range assigned to the incoming page 1360 and thus its boundary addresses (begin and end) are also copied to the MetaStorage entry for Frame Y 1370.

If the page is present in the Auxiliary Memory (Yes outcome in the check 1310 then its starting address (i.e., the pair of CFrame and CF-Offset) is filled in the MetaStorage entry for Frame Y. A Range is assigned to the page by filling in the rest of the field in the MetaStorage entry for Frame Y with the beginning and ending address for that Range (Rb and Re). Notice that in this case there is no data transfer to set a page in the Auxiliary Memory active.

Figure 14:
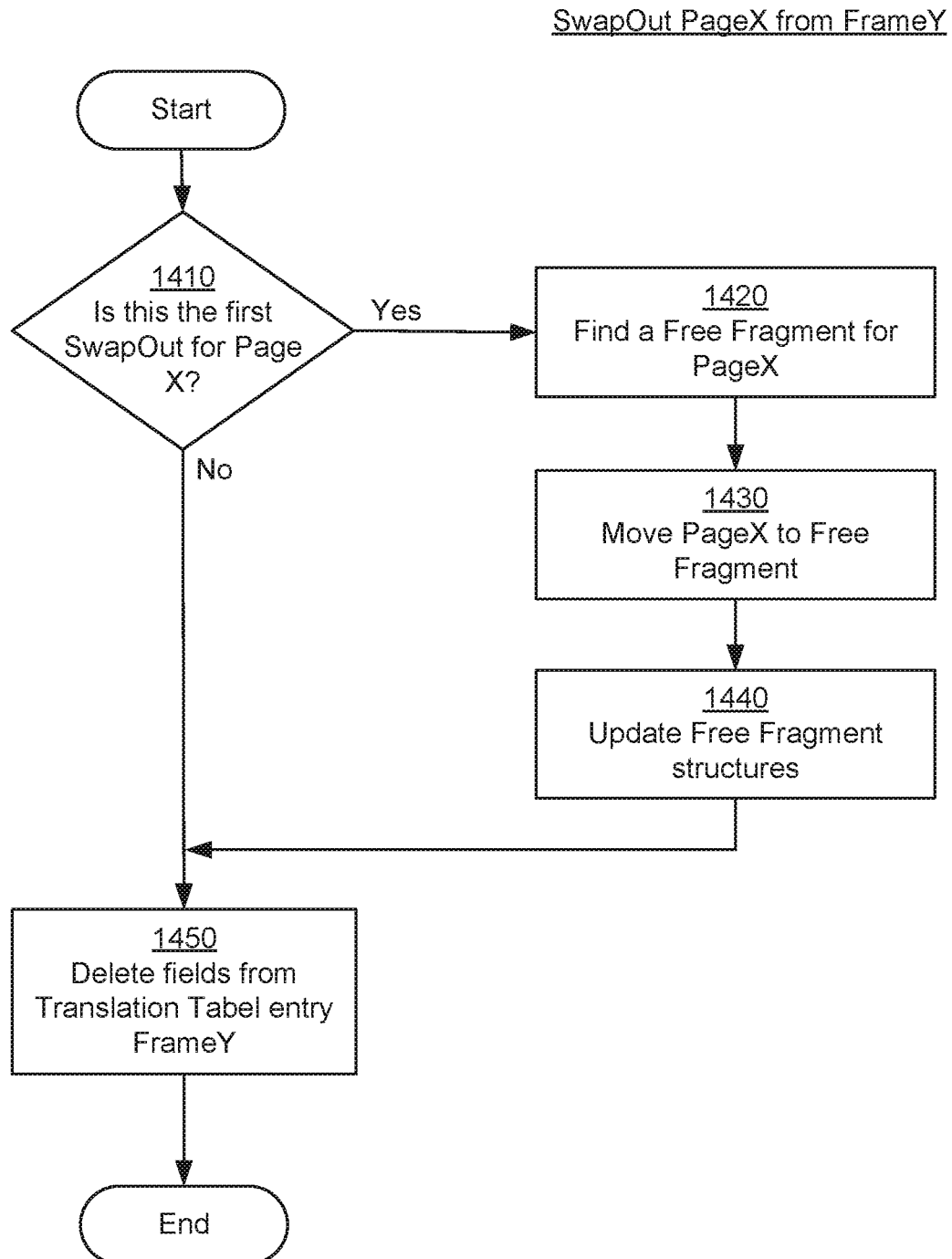
FIG. 14 depicts an exemplary process for a swap-out operation in the Zero-copy Auxiliary memory embodiment.

The sequence of steps followed for a swap out event in the Zero-Copy Auxiliary memory embodiment is presented in the flow diagram in FIG. 14. A swap out event is issued for Page X that is currently assigned to Frame Y; said frame Y assignment is done by the OS but is not necessarily the frame where Page X is stored in compressed memory. It is first checked 1410 whether this is the first swap out for this page X. This is done by checking whether the CF-Offset is equal to 0, meaning the page is aligned to the Frame boundary because as previously mentioned, the execution brings pages from the beginning of the frame to the end of it. In case this is the first swap out for Page X then the Auxiliary Memory is queried for a free fragment to store this page 1420. Note that if a free fragment cannot be found a procedure is put in place to evict pages from the Auxiliary Memory to free the space requested as described in the passage above that describes FIG. 9. When the free fragment is identified, the page is moved to that destination 1430. This is the only default data transfer in the Zero-Copy embodiment. Both the page's information and the updated size for the free fragment are managed by the Auxiliary Memory runtime 1440. The metadata in the MetaStorage for Frame Y is deleted (1450) since the page now is inactive.

For the case that this is not the first swap out for Page X (No outcome of 1410) then the procedure is to make the page inactive by deleting the entry for Frame Y in the MetaStorage 1450.

In addition to the default page transfer upon the first swap-out operation, no further page moves are needed in the embodiment of the Zero-Copy Auxiliary memory. In one alternative embodiment, page moves can occur if the page's compressed size changes due to dynamic changes of the page data resulting in a situation that the page cannot fit in the specified area in the frame, and thus it needs to be moved. In a second alternative embodiment, other pages or data may be moved instead. In a third embodiment, the page can be decompressed. Other alternatives can be realized by someone skilled in the art.

In the previously described embodiments of the Auxiliary memory, when there is a request to move a page to a free fragment in the Auxiliary memory, if there is no free fragment that is large enough to store said page, then said page needs to be stored in a lower level of the memory hierarchy (i.e., swap space). While a single free fragment may not be able to satisfy the request, the total free fragment space available may be large enough to satisfy that same request. As such an optimization for these embodiments is called Split-Page and allows to split the compressed page into different blocks that can be stored into multiple available free fragments. Said blocks are not of fixed-size, thus the Split-page does not suffer from internal fragmentation.

Figure 15:
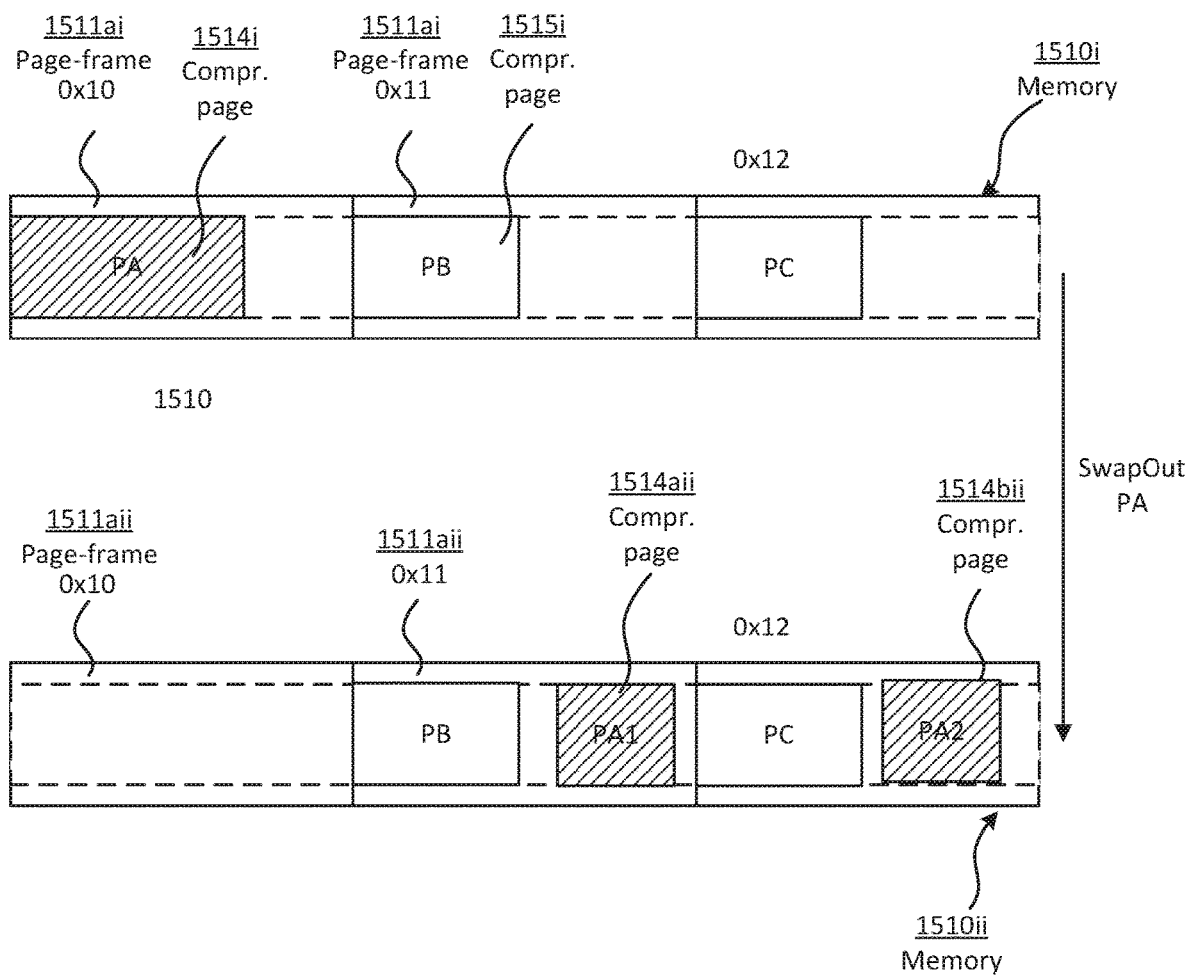
FIG. 15 depicts an exemplary memory layout of compressed pages for an embodiment of compressed page splitting for better utilization of the free memory space.

In an example embodiment 1500 of FIG. 15, the compressed page 1514*i* is split into two blocks 1514*aii* and 1514*bii* upon a swap out event. In an alternative embodiment, splitting can be extended to any number of blocks with the cost of extra metadata information to track the free fragments where the different portions of the original page are stored. If each page may be stored into two different free fragments, it is necessary to keep track of the two starting addresses for said two fragments used to store the two split portions of the originally compressed page. It is obvious to extrapolate that if splitting the compressed page into N portions is to be supported, this results in storing N pointers to possible blocks where said portions would be stored in the Auxiliary memory.

In the first embodiment of the Auxiliary memory management system, where compressed pages are aligned to the physical frames, said system needs to keep track of where the swapped out pages are stored; thus the internal data structures for the location of the stored compressed inactive pages need to be extended to support two pointers to the starting address of the two portions where the data may be stored.

On the other hand, for the Zero-Copy Auxiliary memory embodiment each MetaStorage entry must be extended to hold two pairs of a frame number and offset, one for each of the starting addresses of the free fragments where the split data is located because each entry can now hold an active or an inactive page. Thus every entry of the MetaStorage contains two pairs in which either both contain valid values or just one of them in case the page content has not been split. It is important to notice that for Zero-Copy a page may become active after having been split thus the metadata entry needs to be updated accordingly. The Split-Page optimization can use better the available free fragment space thus avoiding data transfers to the lower level of the memory hierarchy. However, some data operations may be slower: For the first embodiment of the Auxiliary Memory the inactive split page must be combined upon a swap-in operation thus reading from different memory locations. For the Zero-Copy embodiment, after a swap-in operation for a split page, its contents would still be split; this can cause slower memory access time than a non-split page if more memory rows need to be activated at the same time in the former than in the latter. In an alternative embodiment, whenever larger free fragments are made available split pages can be recompacted to reduce said overheads.

A concluding remark on differences between the first and second embodiments of auxiliary memory is as follows. In the first embodiment, the memory management arrangement 405 is configured to make the located page of the page-in request available in the active part of the compressed memory space by transferring the located page from the inactive part to the active part of the compressed memory space, wherein the memory management arrangement 405 is configured to accommodate the page requested by the page-out request in the obtained free region of the auxiliary memory 440 by transferring the requested page from the active part to the inactive part of the compressed memory space.

On the other hand, in the second embodiment, the memory management arrangement 405 is configured to make the located page of the page-in request available in the active part of the compressed memory space by updating metadata to reflect that the located page belongs to the active part of the compressed memory space, wherein the memory management arrangement 405 is configured to accommodate the page requested by the page-out request in the obtained free region of the auxiliary memory 440 by updating metadata to reflect that the requested page belongs to the inactive part of the compressed memory space.

A method corresponding to the memory management arrangement 405 and its different embodiments as described herein will comprise the functional steps performed by the memory management arrangement 405 and its different embodiments.

Optimizations

Many optimizations are possible that can be considered beyond the described embodiment. One area of optimizations relates to making space for a new paged-out page when the Auxiliary memory does not have space for the paged-out page. The other area of optimizations relates to how to manage the free fragments more effectively. In the next paragraphs, we contemplate a few such optimizations.

As for making space for a new paged-out page, when a free fragment of sufficient size cannot be found, there are several alternatives. One alternative is to keep track of the "age" of the pages currently stored in Auxiliary memory. With age, it is understood how long (logical or physical wall-clock) time a page has resided in the Auxiliary memory. Age can be kept track of based on Auxiliary memory requests as the "wall clock" or, logically by request rate from the VMM. Each page stored in the Auxiliary memory associates an "age" taking the form as a counter. At each request to the Auxiliary memory, counter values for all pages currently stored in it, are incremented. The one page that has the largest counter value is evicted and sent to disk if space is requested.

In a compressed memory, pages have varying size. Only pages with a low age and a small size (highly compressible) are chosen to be stored in the Auxiliary memory. Conversely, pages with a high age and large size (low compressibility) may be chosen to be evicted and sent to disk. To this end, heuristics for evicting pages from Auxiliary memory to disk can be built on age and size characteristics. It is appreciated by someone skilled in the art that age can be modelled by the concept of Least-Recently-Used (LRU) and heuristics can be built on that concept with approximations used in VMM based on for example reference bits.

Regarding how to manage the free fragments more efficiently, a goal is to use the free fragments as efficiently as possible. Going back to FIG. 8 and considering how the page frame storing Page 1 is used, we note that it stores three pages: Page 1 and two swapped-out pages currently using the free fragment associated with the page frame and managed by the Auxiliary memory. We note that the utilization of the page frame in the exemplary scenario can be low. One way of improving the utilization of the free space is to occasionally run a compaction process that aims at compacting the space inside a page frame.

One approach is to form as much space between the page currently mapped to the page frame and the pages residing in the Auxiliary memory and utilizing the free fragment. This approach can be realized by pushing all the pages residing in the Auxiliary memory towards higher addresses in the page frame. This will yield the largest free fragment in the middle of an allocated page and pages utilizing the free fragment in the Auxiliary memory. Other alternatives are possible, as realized by someone skilled in the art, and they are all contemplated in the disclosed invention.

On a page-out operation, the proposed Selector 430 will intercept all page-out operations from the VMM in the operating system. In the case were the outgoing page is not compressed, the Selector may opt to compress it utilizing the compressor unit 212, potentially using a hardware accelerator. Then the same process described in FIG. 9 will be attempted from step 930, wherein the Selector will attempt to store it in the free space available in the Auxiliary memory 440 to later avoid a costly disk access.

Address Translation

Figure 16A:
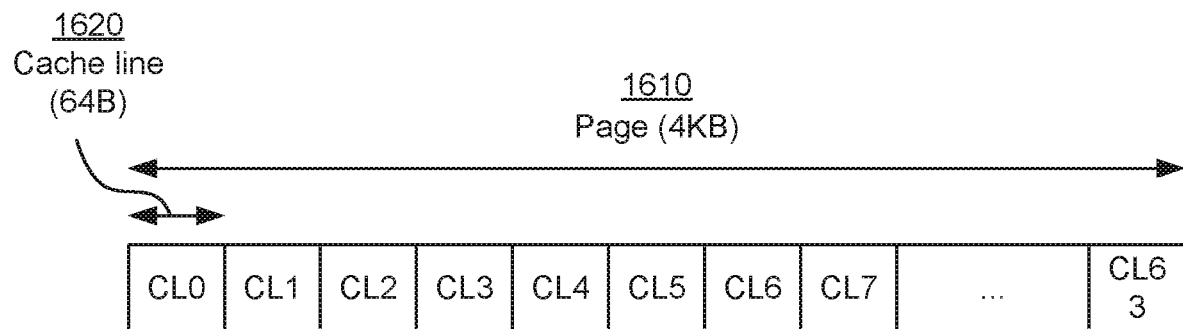
Figure 16B:
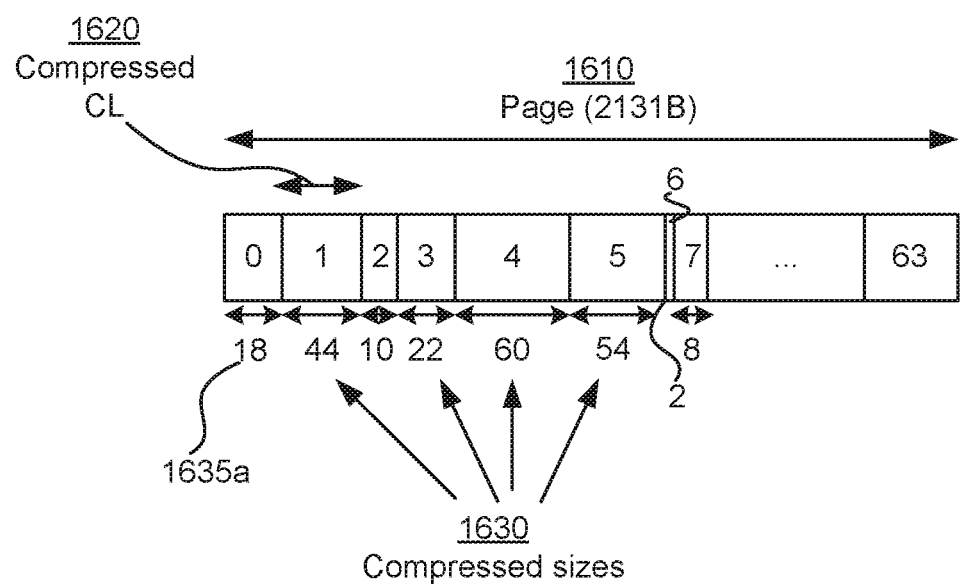
FIG. 16B depicts the same page in compressed form, comprising compressed and compacted cache lines.

Let us now turn the attention to the address translation needed between the physical addresses and addresses in the compressed memory. As mentioned, memory pages are not necessarily placed in the original locations where they would be placed in a conventional uncompressed memory system requiring a translation step to locate them in the compressed address space (CAs). Furthermore, cache systems typically manage data at the granularity of memory blocks or cache lines (henceforth, blocks and lines are used interchangeably) whose size is typically 64 B. Said cache lines have also variable sizes in a compressed memory system, thus there is an additional step of locating them within a compressed memory page. FIG. 16A shows an exemplary memory page 1610 comprising uncompressed cache lines 1620, while FIG. 16B depicts the same page 1610 whose cache lines 1620 are compressed and compacted. Said translation must be supported when translating from a conventional physical address (PA) to a compressed address (CA) for example by the address translation unit (211) in the exemplary system of FIG. 2.

Prior art follows different approaches to provide address translation between PAs and CAs. One approach uses a large amount of metadata to determine the exact location of each compressed block within a page by keeping an indirection pointer per compressed block; a page that has 64 cache-lines (64B each when uncompressed) requires metadata of 64×12b=768 bits (b) in size because a pointer of 12 bits is used to point at any byte location within the page. A second approach uses the compressed size only thus it requires significantly less metadata (64×6b=384b per page) but suffers from high latency in calculating the compressed location as it needs to accumulate the compressed sizes; for example, calculating the compressed address of the $64^{th}$ block needs to accumulate 63 sizes. A further approach restricts the cache lines to one size (i.e., the maximum compressed size in the page); such approach requires a negligible amount of metadata (2b per page) but limits significantly the compression (and free space) potential.

Figure 17:
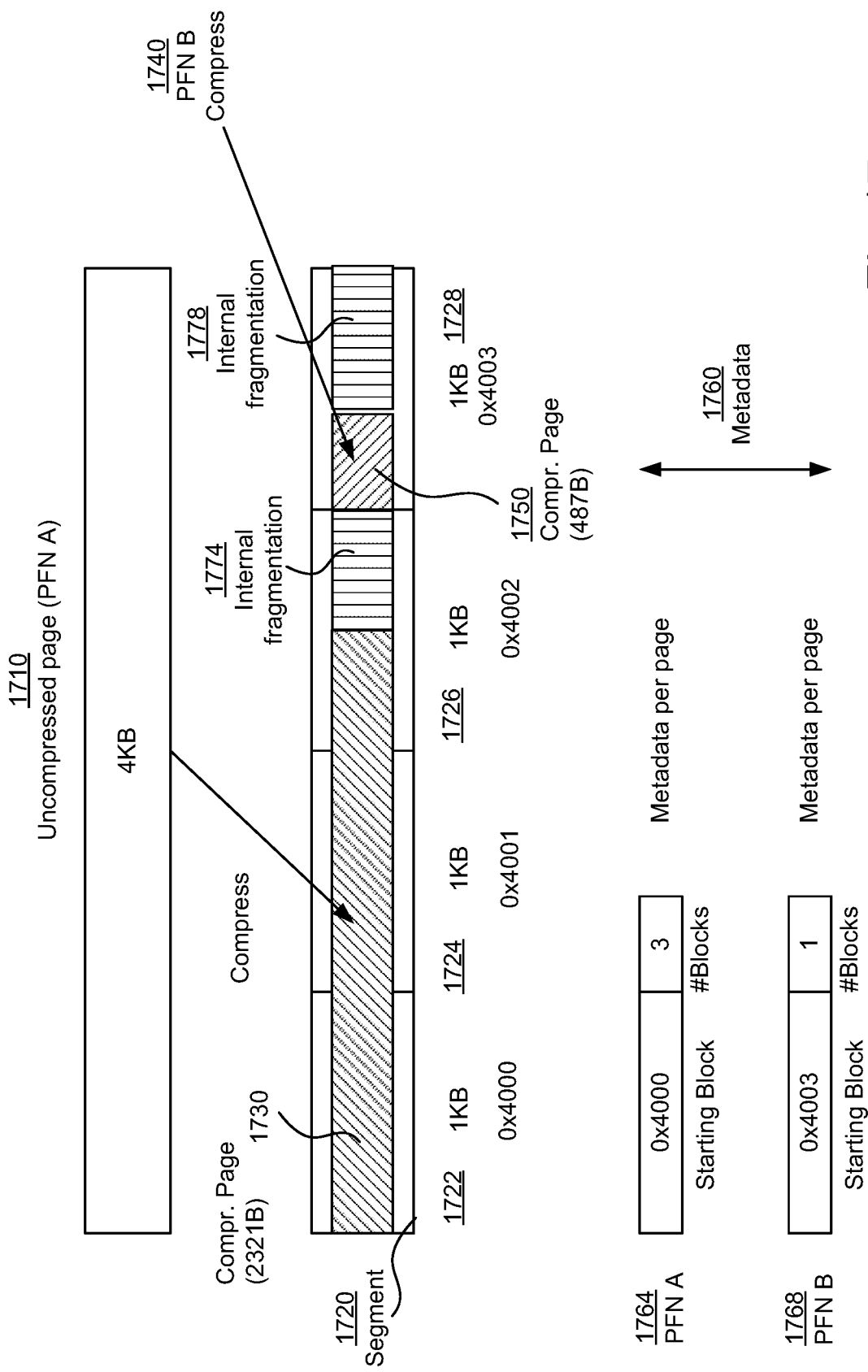
FIG. 17 depicts an exemplary memory layout of coarse-grain segmented memory wherein compressed pages are associated with contiguous segments.
Figure 18:
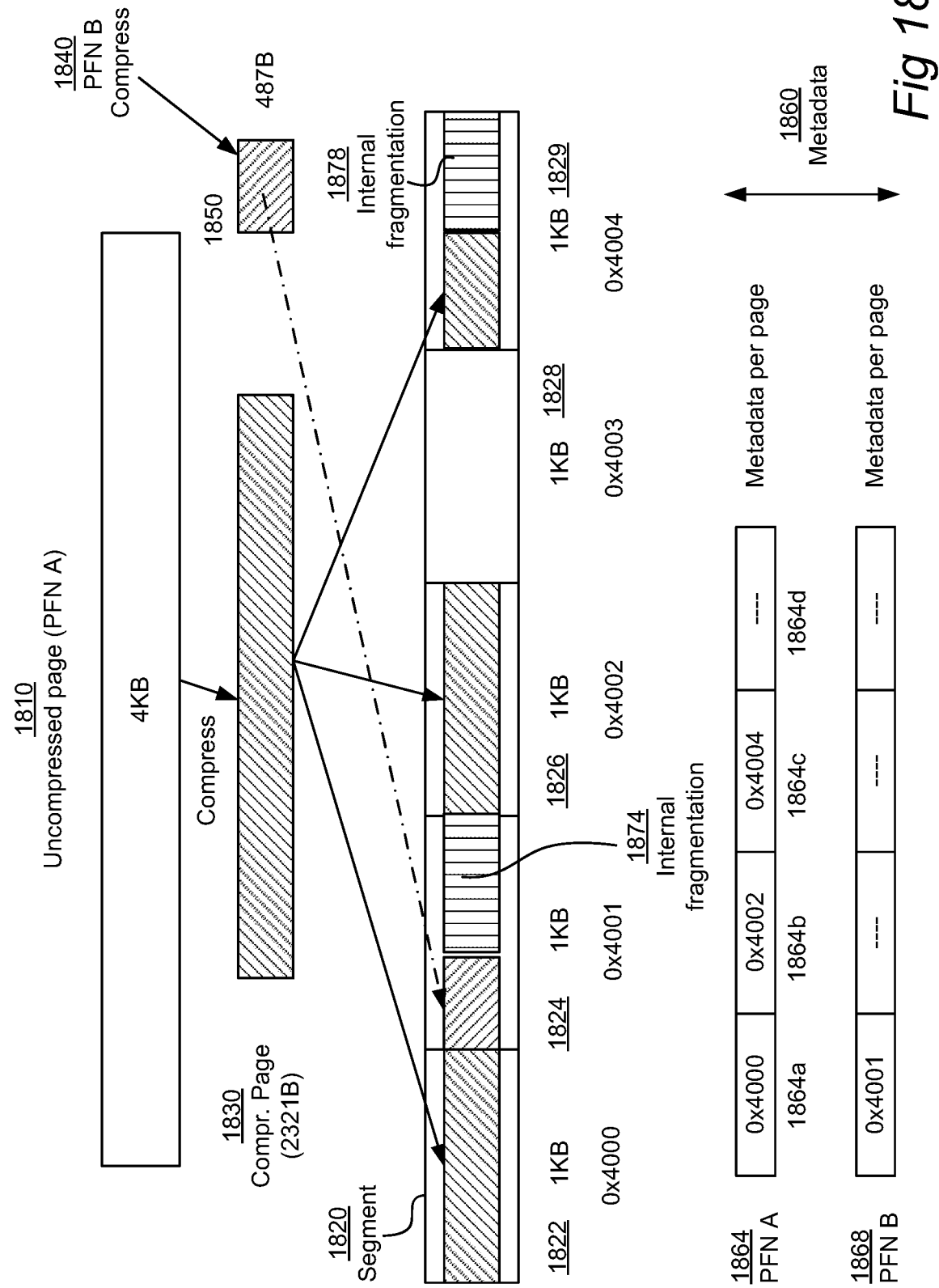
FIG. 18 depicts an exemplary memory layout of coarse-grain segmented memory wherein compressed pages are associated with non-contiguous segments.
Figure 19:
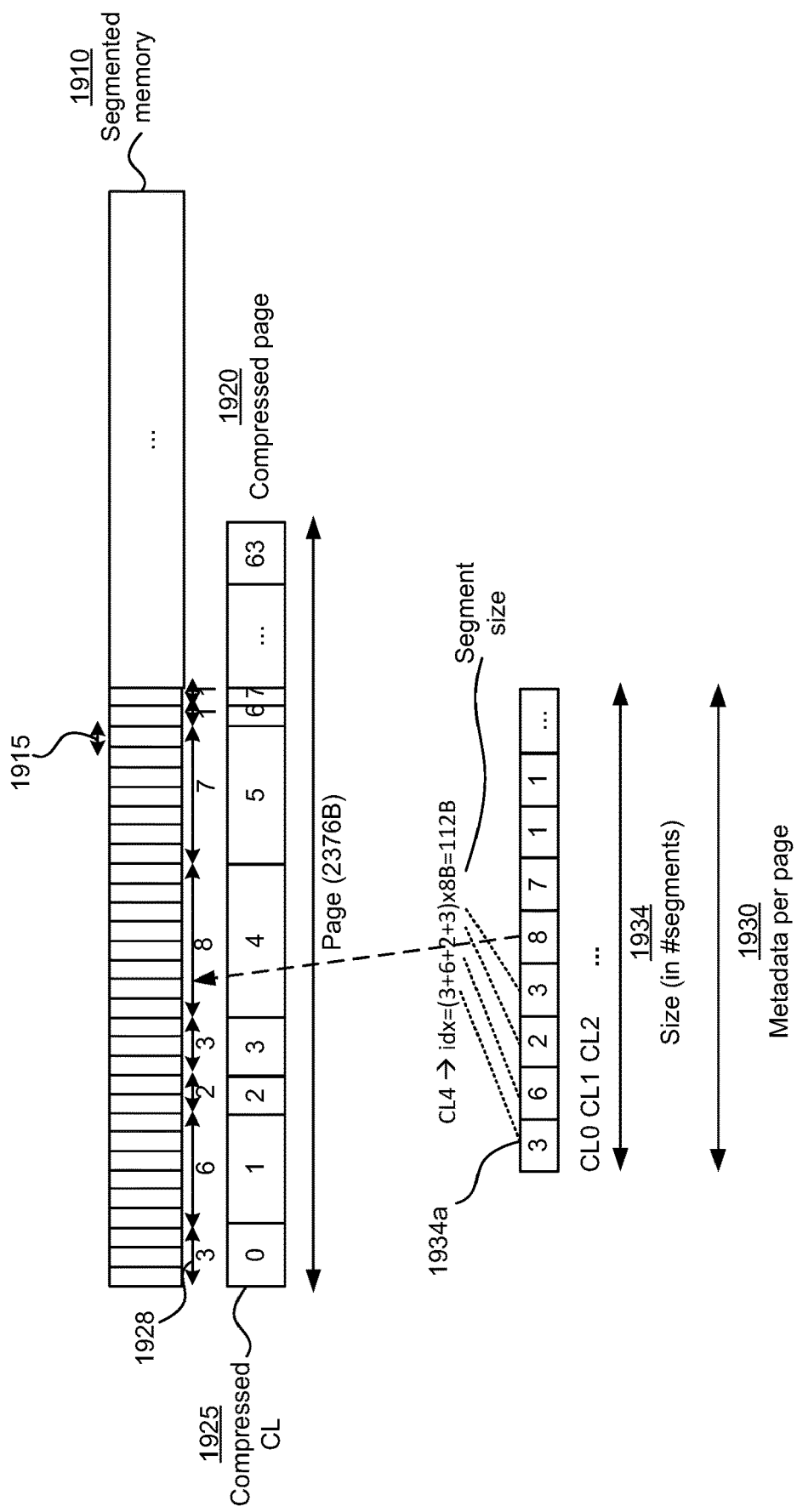
FIG. 19 depicts an exemplary memory layout of fine-grain segmented memory wherein compressed pages are associated with contiguous segments.

Other approaches try to reduce the translation metadata by dividing the memory into fixed-size segments and encode in metadata the number of segments used by the compressed data. Segmentation can be coarse-grain or fine-grain. FIG. 17 shows a coarse-grain segmentation embodiment, where the memory is divided in 1 KB segments (1720). In the example, an uncompressed page 1710 is 4 KB and the same page compressed 1730 is 2321B and uses 3 segments (1722, 1724 and 1726). Another page 1740 when compressed 1750 may need only one segment 1728. The metadata 1760 need to encode the starting segment and the number of segments per page, as compressed pages are mapped to contiguous segments. However, because the actual compressed sizes of the pages are not perfectly aligned to the segment size, the compressed space is underutilized leading to internal fragmentation (1774 and 1778). FIG. 18 shows an alternative embodiment of FIG. 17 where the compressed page 1830 is mapped to non-contiguous segments 1822, 1826 and 1829. This results in more metadata fields (1864a-d), however, the internal fragmentation problem (1874 and 1878) remains. FIG. 19 shows a fine-grain segmentation layout, where the memory 1910 is divided into 8B segments 1915. The page metadata 1930 comprises the compressed size 1934 (i.e., number of segments) for each compressed cache-line 1925. For example, CL0 has a size of 3 segments 1934a (24B), while in the non-segmented translation layout of FIG. 16B, CL0 has a size of 18 Bytes 1635a. Hence, although segmentation can help reducing metadata, it has a negative effect on compressibility.

Even if there is a buffer (similar to the translation lookaside buffer) on chip to keep translation metadata for the physical to the compressed address translation, this buffer will not be able to cache all the metadata due to area constraints. Hence, metadata must be stored in memory. Large amount of metadata introduces a significant overhead in the memory capacity while bandwidth gains due to compression can be vanished if said metadata need to be transferred from memory to the address translation unit on the chip. Reducing the metadata overhead either increases latency causing performance degradation or restricts the compression ratio resulting in devastating effects in memory capacity and bandwidth gains. Moreover, all the segmentation-based approaches suffer from internal fragmentation which limit the capacity and bandwidth gains as they allocate unnecessary space to align compressed data to the segment boundaries.

Address Translation: Sector-Based Embodiments

Figure 20:
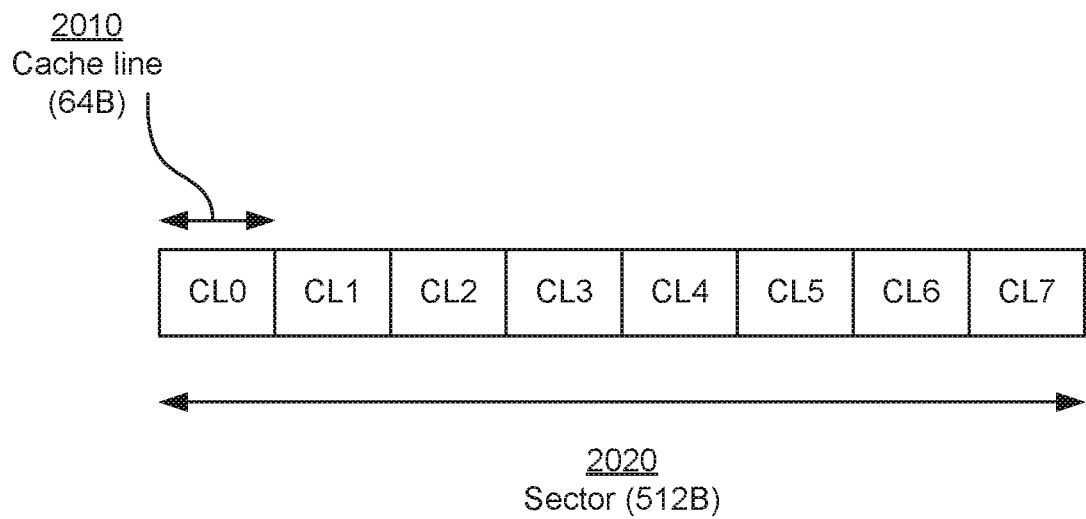
FIG. 20 depicts an exemplary sector layout in uncompressed form.
Figure 21:
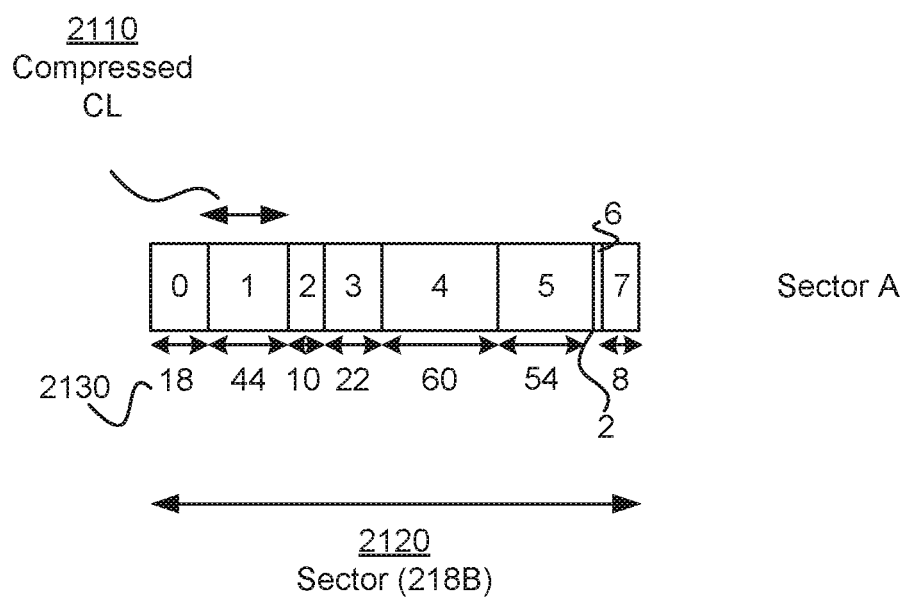
FIG. 21 depicts an exemplary sector layout in compressed form.

The present invention discloses devices and methods that solve the aforementioned problems by introducing a new data entity, referred to as sector. A sector has a fixed logical size (referred to as SectorLogSize) but variable physical size (referred to as SectorPhysSize) depending on its compression ratio. The logical size quantifies the number of cache lines (or in general blocks) it comprises, whereas the physical size quantifies its size (e.g., in bytes). A sector comprises a fixed number of cache lines, for example, 2, 3 or 10, but the logical size is typically preferred to be a power of 2: 2, 4, 8, 16, etc. FIG. 20 illustrates a sector 2020 in uncompressed form, while FIG. 21 illustrates the same sector 2120 in compressed form wherein the physical size is measured in bytes; the SectorLogSize is 8 cache lines while the SectorPhysSize is the sum of the compressed CL sizes 2130 which in the exemplary sector is 18+44+10+22+60+54+2+8=218B.

The fixed logical size (SectorLogSize) allows any memory request to be automatically translated into a sector request without any need to keep extra metadata. The right sector is automatically found based on the address of the original memory request, by using the integer part of the outcome of dividing the cache line index with the SectorLogSize. For example, if the SectorLogSize is 8 and the memory request goes after cache line 5, then it is sector 0 ($\lfloor 5/8 \rfloor$=0) that must be requested; if it is cache line 50 then it is sector 6 ($\lfloor 50/8 \rfloor$=6) that must be requested. Moreover, whether one or a plurality of sectors must be accessed is determined by both its address and size; for example, if cache lines 6-10 are requested, then both sectors 0 and 1 must be accessed.

The motivation behind the variable physical size is that it alleviates the problem of internal fragmentation as variable-size compressed data can be accessed from the memory. A further advantage of the sector is that it packs together a number of contiguous cache lines. Therefore, if the running system and/or applications exhibit spatial reference locality, the bandwidth improvement due to compression is guaranteed even if data has to be rearranged to handle changes in dynamic data. For example, if the size of the compressed cache line increases, this will potentially lead to an increased sector size. If the compression overflow mechanism is to move the sector somewhere else, then all the cache lines within that sector will be moved together. The compression overflow mechanism handles dynamic data changes and is detailed in the passage below that describes FIG. 41A-C and FIG. 42.

Figure 22:
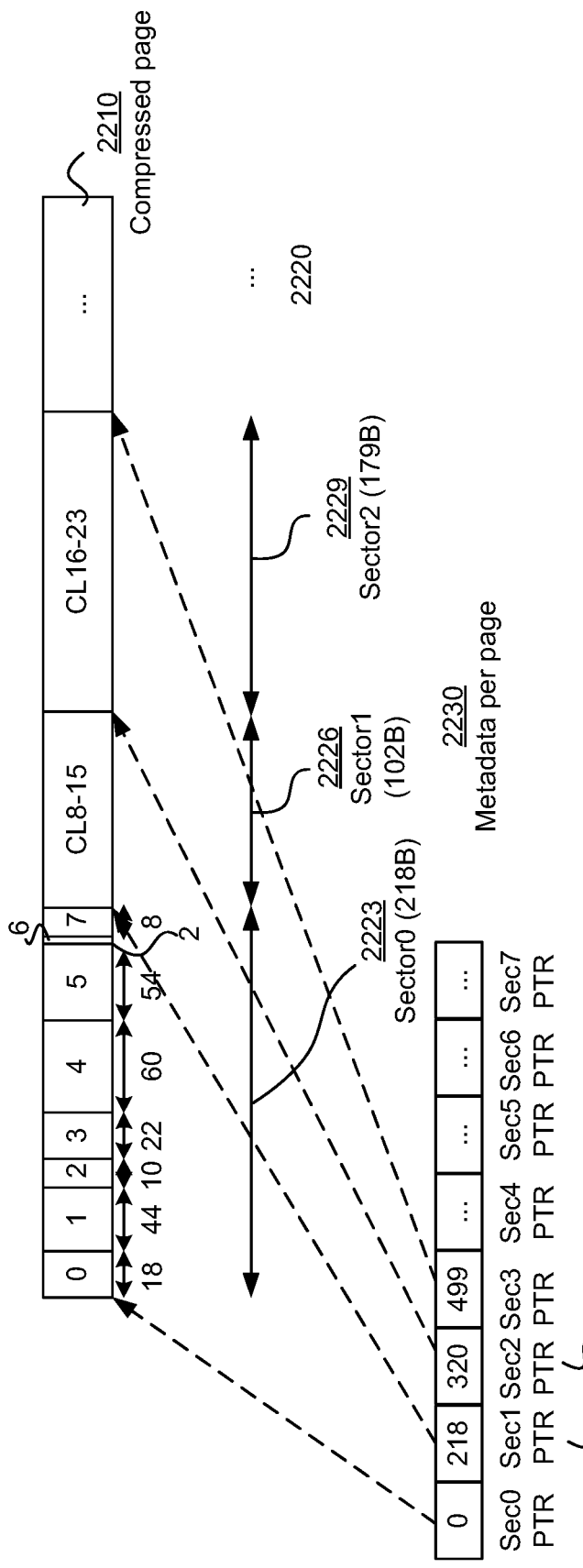
FIG. 22 depicts an exemplary sector-based translation metadata format wherein sector metadata comprises sector pointers (PTR).
Figure 23:
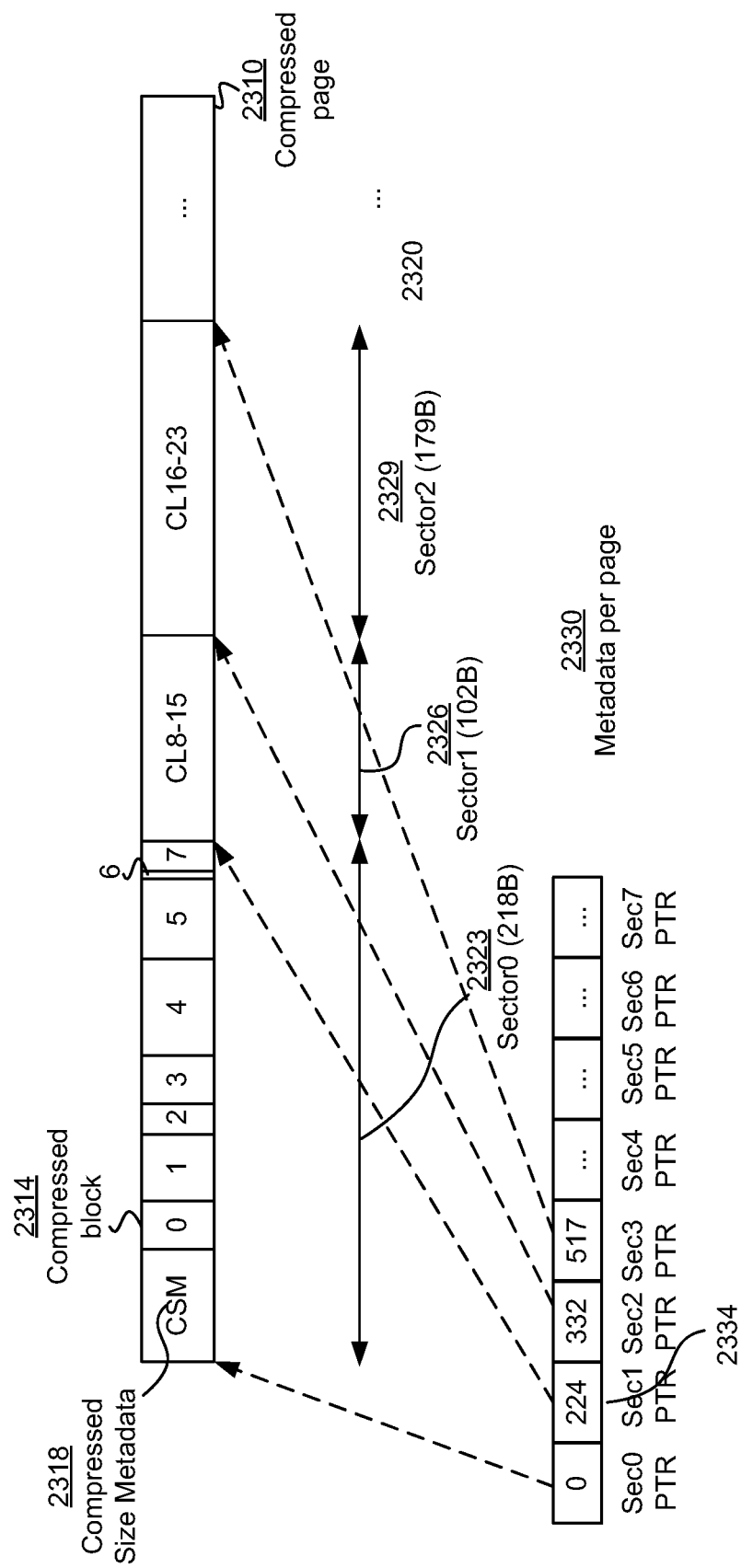
FIG. 23 depicts an exemplary sector-based translation metadata format wherein sector metadata comprises sector pointers (PTR) and compressed size metadata (CSM) is mixed with compressed data.

Another important benefit of sector-based translation is that it requires substantially less metadata. In a first embodiment of a sector-based translation metadata format, the metadata comprises pointers that identify the location of the sector within a compressed page. FIG. 22 shows how compressed sectors 2220 can be identified within a compressed page 2210. There are 8 sectors (a 4 KB uncompressed page comprises 64 CLs, thus 8 sectors of SectorLogSize of 8); the required metadata is 8 (sectors)×12b; each of the pointers (PTR 2234) identifies the sector location within the compressed page, i.e., <=4 KB). The metadata per page 2230 is only 96 bits. The sector size is determined by subtracting from the next pointer the current pointer; for example the size of Sector1 2226, is derived from: Sec2 PTR 2234b—Sec 1 PTR 2234a. The size of the last sector is derived by subtracting its PTR from the compressed page size; if the page size is not kept in the metadata, then the size of the last sector is part of the metadata. In an alternative embodiment of a sector-based translation metadata format, as depicted in FIG. 23, compressed size metadata (CSM) 2318 are saved mixed with the data in a fixed area in the beginning of the sector (2323, 2326, etc). Said CSM determines the amount of shifting within a sector if one or a plurality of specific compressed blocks 2314 within the sector must be decompressed and returned first when a sector is accessed. In yet another embodiment, the CSM can be spread across the sector by placing each of them prior to each compressed block. Other alternative embodiments can be realized by someone skilled in the art. In the present embodiments, CSM corresponds to metadata of the compressed cache lines but can be generalized to any compressed block entity. In a fourth embodiment of a sector-based translation metadata format, depicted in FIG. 24, metadata comprises pointers (PTR) 2434 that identify the location of the sector within a compressed page as well as the size (SIZE) 2438 of the sector. The amount of metadata needed is only 8 (sectors)×12b+8 (sectors)×8b=160b. The width of the sector size metadata field is determined by the maximum size of the sector, which is 512B in uncompressed form when it has a SectorLogSize of 8. An uncompressed sector is encoded as of size 0 in the SIZE, however another compressed sector size (e.g., 511) can be used to encode an uncompressed sector. The advantage of said sector-based metadata translation format is that it allows sector reordering to be able to handle dynamic changes in sector data more flexibly. This is achieved with a small amount of metadata (~60b) on top of one of the three former embodiments whereas in prior art it would require substantially more, potentially as much as eight times more metadata. Other alternatives can be realized by someone skilled in the art.

The benefit of reducing the width of translation metadata is that said metadata need less space in memory, reducing the overall metadata overhead in memory. Furthermore, in the presence of a translation metadata buffer on the chip, the value of smaller metadata width is converted to less area overhead in the chip's real estate leading to potentially less power and energy. Conversely, the area savings can be used to increase the reach, meaning the number of page translations, of the translation metadata table for increased performance.

FIG. 45 depicts a general method 4500 for accessing compressed computer memory residing in physical computer memory according to the teachings of this document. The method comprises representing 4510 compressed memory blocks as sectors, wherein all sectors contain a fixed number of compressed memory blocks such as cache lines, have a fixed logical size in the form of the fixed number of compressed memory blocks, and have varying physical sizes in the form of the total size of data stored in the respective compressed memory blocks. The method also comprises providing 4520 sector-based translation metadata to keep track of the sectors within a compressed memory page, receiving 4530 a physical memory access request comprising an address in the physical computer memory, using 4540 the address in the physical memory access request to derive a memory block index, using 4550 the memory block index and the fixed logical size of the sectors to determine a sector id, using 4560 the sector-based translation metadata to locate a sector having the sector id in the compressed memory page, and using 4570 the address of the physical memory access request to locate the requested data within said sector.

A corresponding device for accessing compressed computer memory residing in physical computer memory will comprise means for performing the functional steps of the method 4500.

Figure 25:
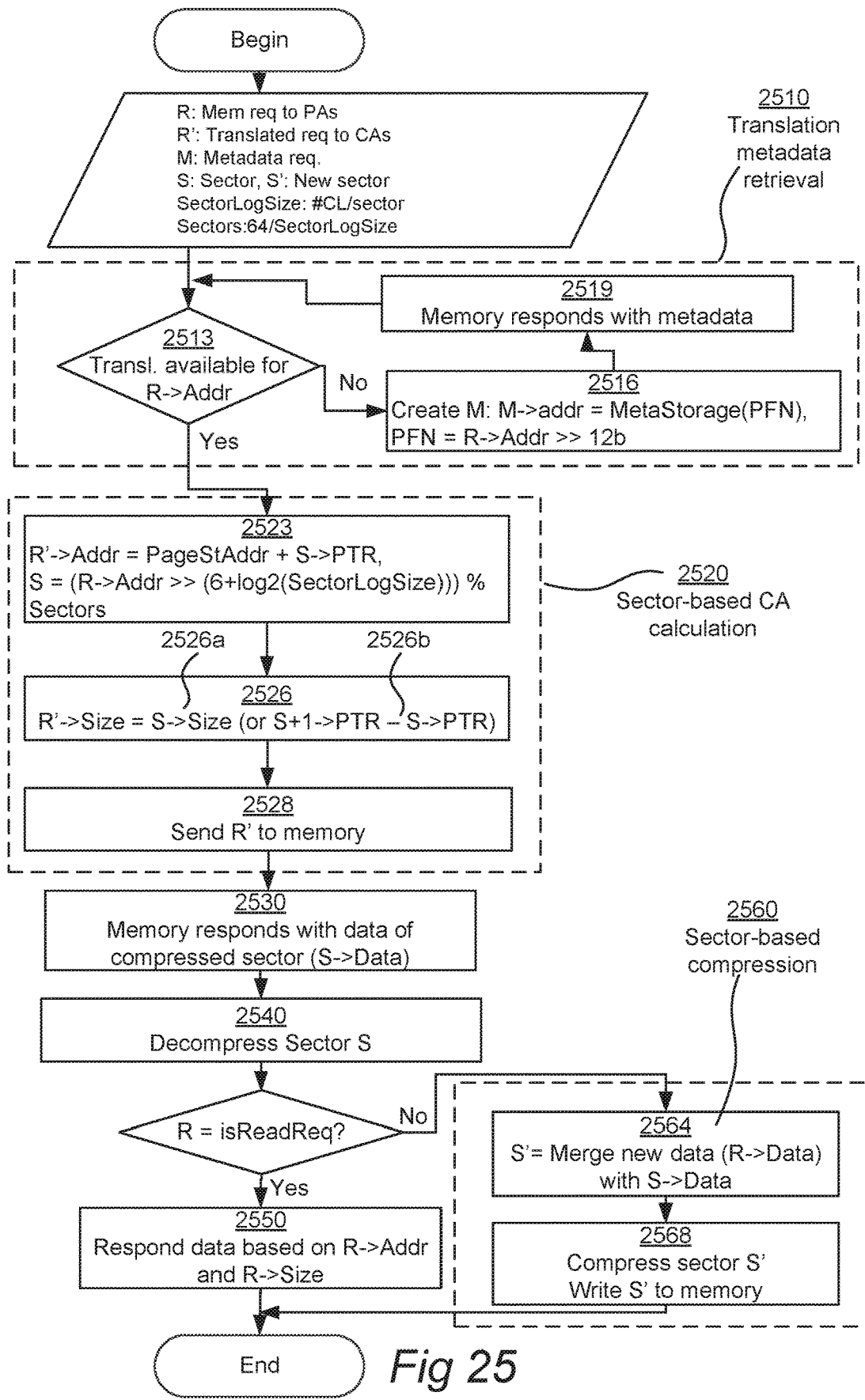
FIG. 25 depicts a first embodiment of a method for accessing compressed computer memory residing in physical computer memory, wherein translation metadata follows the exemplary format of FIG. 22, and wherein the method is associated with the device in FIG. 27.
Figure 27:
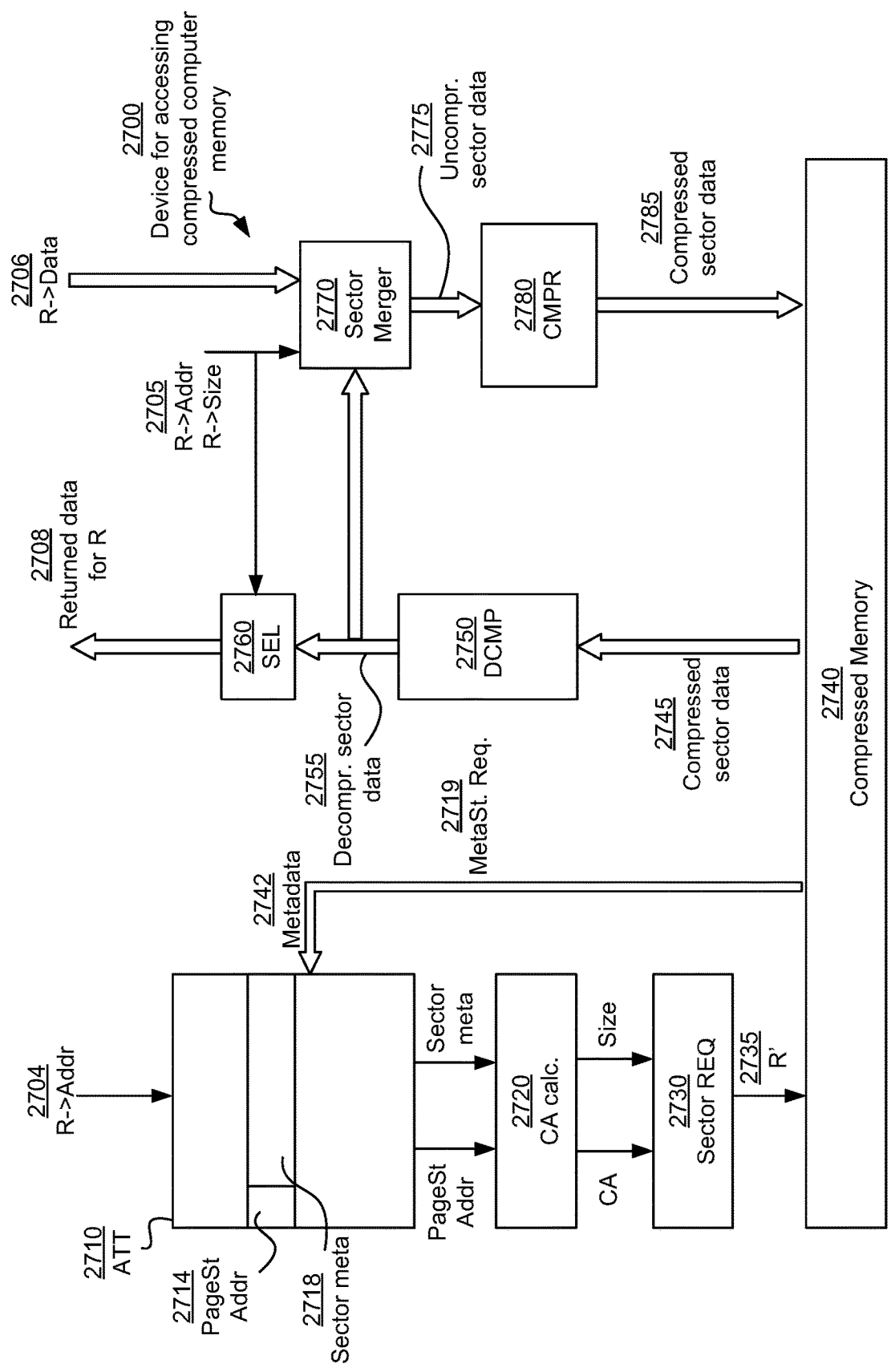
FIG. 27 depicts a first embodiment of a device for accessing compressed computer memory residing in physical computer memory, wherein the device is associated with the method in FIG. 25.

A first embodiment of a method for accessing compressed computer memory residing in physical computer memory, involving sector-based metadata translation including compression and decompression as part of a memory read or write request, is depicted in FIG. 25. An associated device is depicted in FIG. 27. The translation metadata of the compressed page comprises also the start address of said page (PageStAddr), which is used as the base address in the calculation of the compressed address using the sector-based metadata. In the exemplary layout of FIG. 5, PageStAddr is not needed as physical frames are aligned to frames in the compressed address space as described earlier. In a second exemplary layout of FIG. 12, the PageStAddr comprises a PFN and an offset. In a third exemplary layout, PageStAddr can be omitted if sector metadata can point anywhere to memory instead of within the compressed page.

Figure 24:
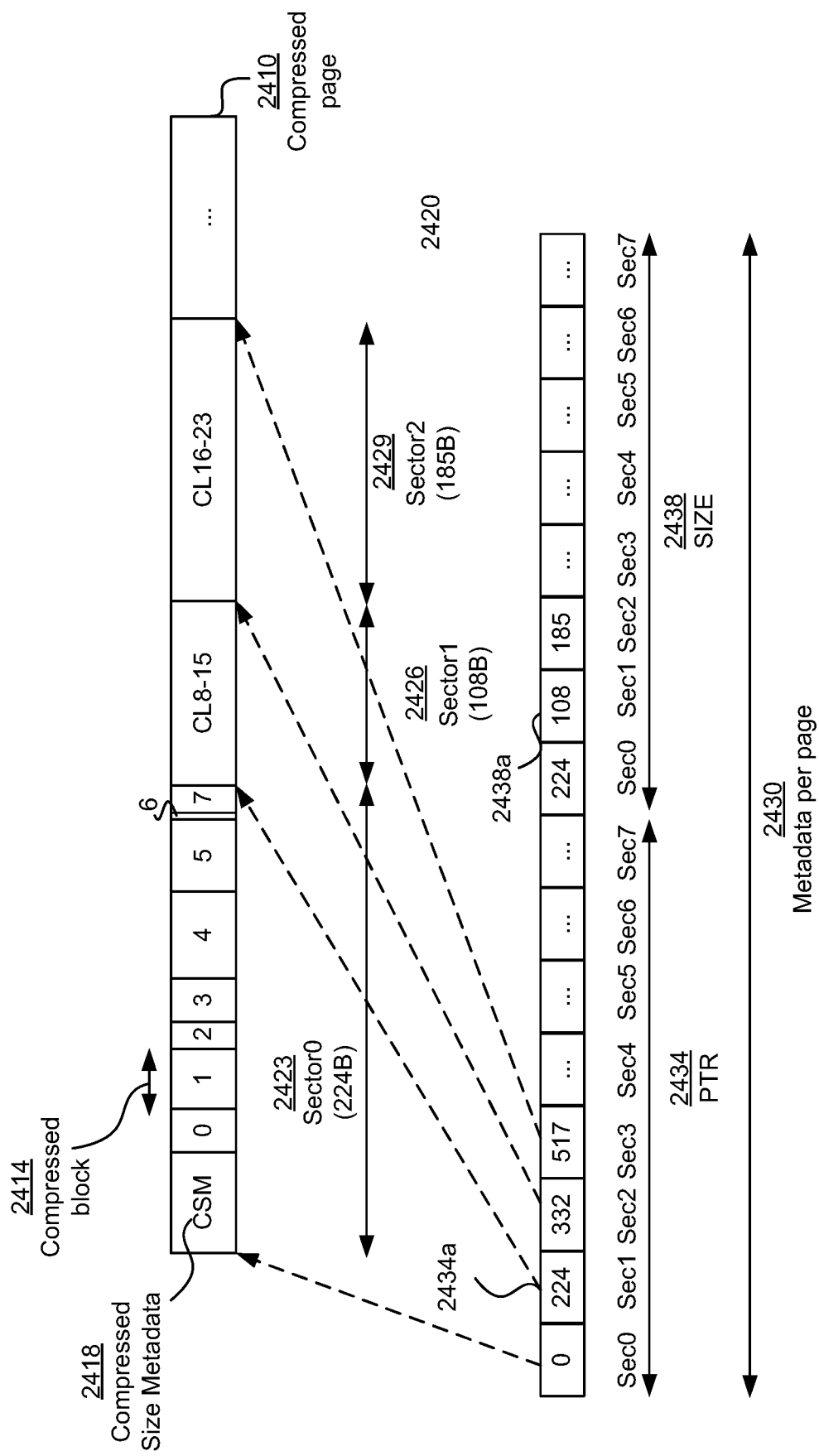
FIG. 24 depicts an exemplary sector-based translation metadata format wherein sector metadata comprises sector pointers (PTR) and compressed sector sizes (SIZE) as well as compressed size metadata (CSM) are mixed with compressed data.

In this first embodiment, every memory request must be converted to a sector-based request. In this method embodiment, sector-based translation converts a request R to one or a plurality of sector requests R' depending on the original size of the request R. Firstly, the translation metadata retrieval process 2510 is triggered where it is checked whether the translation metadata is available (2513). If not, a metadata request is triggered to the MetaStorage (2516). When the translation is available, the sector-based calculation 2520 is triggered and the R' address is calculated based on the PageStAddr and the sector pointer 2523. One or a plurality of the sectors S may need to be requested depending on the address of the request R and its size. The size of R' is the sector size 2526, which in the exemplary sector metadata format of FIG. 24 is available (2526a) while in the second exemplary sector metadata format of FIG. 23 it is calculated using the sector pointers (2526b). When the request R' attributes are ready, R' is sent to memory 2529. When the memory responds with the compressed sector data 2530 and the sector is decompressed 2540. If the request R was a read request then the requested data (based on the R→addr and R→size) are returned 2550; otherwise (R is a write request), the sector-based compression process 2560 is followed: old sector data is merged with the new data (merging is driven based on R→addr and R→size) 2564, the new sector S' is re-compressed 2568 and then written to memory; the translation metadata (i.e., sector SIZE and/or sector PTR) is also updated accordingly when the request is a write request. Said MetaStorage is saved, in one embodiment, in the main memory. In a second embodiment it is stored as a file in the disk. Other alternatives can be realized by someone skilled in the art.

Figure 26:
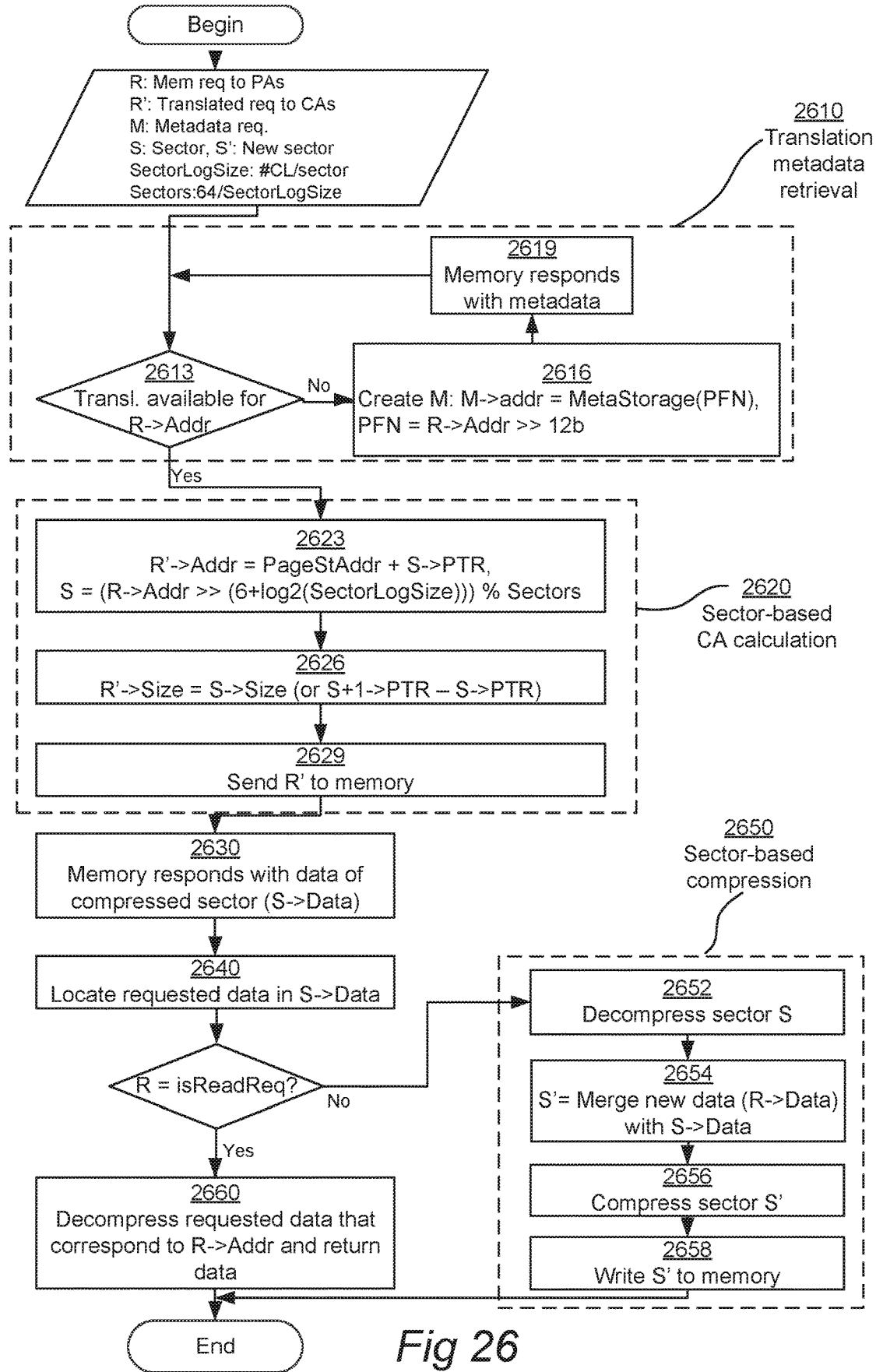
FIG. 26 depicts a second embodiment of a method for accessing compressed computer memory residing in physical computer memory, wherein translation metadata follows the exemplary format of FIG. 23 or FIG. 24, and wherein the method is associated with the device in FIG. 27B.

A second embodiment of a method for accessing compressed computer memory residing in physical computer memory is depicted in FIG. 26, wherein the exemplary metadata format of FIG. 23 or FIG. 24 is used instead. Translation metadata retrieval 2610 and sector-based CA calculation 2620 are similar to the embodiment of FIG. 25. However, when the memory responds with the compressed sector data 2630, one or a plurality of compressed blocks that correspond to the requested data (derived based on R→addr and R→size) can be located based on the CSM 2318/2418, and prioritized to be decompressed instead of decompressing the whole sector 2660, reducing potentially the decompression latency. This applies only to read requests; sector-based compression 2650 is followed as in the previous embodiment if the request is a write request. The method in FIG. 26 is associated with the device in FIG. 27B.

In an alternative to the second embodiment, the exemplary metadata format of FIG. 23 or FIG. 24 is used instead.

If the request R is a write request then the compressed sector S data and new data (R->data) can be merged without decompressing and recompressing the whole sector S but only by compressing the R->data and replacing the old compressed data with said new compressed data using the CSM metadata. A device operating in accordance with this alternative is depicted in FIG. 27C.

In another alternative, if the whole sector is decompressed upon a read request the rest of decompressed data that has not been requested can be buffered in case it is requested in the future. This happens often if the running applications or programs exhibit spatial reference locality. In yet another, if the whole sector is decompressed upon a read request, all the decompressed data can be buffered in case it is requested in the future. This can happen often if the running applications or programs exhibit temporal and/or spatial reference locality. In still another alternative, upon a write request the whole sector can be buffered (in compressed or decompressed form) in case other write requests targeting this sector follow. This can happen if the running applications or programs exhibit temporal and/or spatial reference locality.

Other alternatives can be realized by someone skilled in the art and the intent is to contemplate all of them.

FIG. 27 depicts a first embodiment of a device 2700 for accessing compressed computer memory residing in physical computer memory. The device 2700 is associated with the method in FIG. 25. The device 2700 includes a sector-based translation device (2710-2730, 2760-2770) along with a compressor 2780 (CMPR) and decompressor 2750 (DCMP) in a sector-based memory compression system. At the bottom of FIG. 27, there is also the main memory 2740 that stores data in compressed form. In a specific CPU system embodiment, such as in the exemplary system of FIG. 2, the depicted compression system is between the memory controller 210 (that is connected to the compressed main memory) and processors and the cache hierarchy. The compression system receives memory requests (2704-2706) from the top of the block diagram. Such memory requests can be issued by the C3 cache as depicted in the exemplary system of FIG. 2. However other units can generate memory requests for example, the GPU, the display controller, etc.

In the system of FIG. 27, the sector-based translation device comprises the Address Translation Table (ATT) 2710, the Compressed Address Calculator unit (CA Calc) 2720, a Sector REQ unit 2730, a Sector Merger unit 2770 and a selector (SEL) 2760. All the memory requests are intercepted by the compression system of FIG. 27. Independently of whether the memory request is a memory read request or a memory write request (R in either case), its physical address 2704 is passed to the ATT 2710. The ATT is physical-page based (i.e., Physical Frame Number (PFN)) addressable and caches the translation metadata of each physical page. Such translation metadata comprises the PageStAddr 2714 and the sector metadata 2718. The Sector metadata further comprises a pointer for each sector if the metadata format is the one of FIG. 22 or 23, or the pointer and size for each sector if the metadata format is the one of FIG. 24. If the ATT 2710 has cached the page translation of an incoming request R, then it is an ATT hit, otherwise it is an ATT miss. In the latter case, a metadata request 2719 is issued to the memory (MetaStorage). The metadata 2742 are returned from the memory and the ATT is updated. As mentioned earlier, the ATT is addressed based on the Physical Frame Number (PFN), which is calculated as follows: R→Addr>>12b assuming that a physical page is 4 KB. The CA Calc unit 2720 converts the physical address to the compressed address as follows: CA=PageStAddr+Sector→PTR; the size of the request R is converted to the sector size request (i.e., calculated for the metadata format of FIGS. 22 and 23, or returned from the ATT for the metadata format of FIG. 24. The Sector REQ unit 2730 creates a new request R' that is a sector request and is associated with the request R. Said unit 2730 also bookkeeps the association of original requests R 2704 to converted requests R' 2735. When compressed sector data 2745 is returned from the memory, it is decompressed by the DCMP 2750. If the original request R 2704 is a read request then the decompressed data corresponding to the R are returned 2708 and the rest is discarded. This is controlled by the Selector 2760 using the R→<Addr,Size> 2705. If the original request R 2704 is a write request, then the decompressed sector 2755 is merged with the new data (of R) 2706 by the Sector Merger unit 2770: Old data is overwritten by new data based on the R→<Addr,Size>2705 as depicted in FIG. 27. The new sector is compressed by the CMPR 2780 and written back to the memory 2740. If the size of the original write request is aligned to one or a plurality of sectors then the sector read and merge step can be omitted.

Figure 25B:
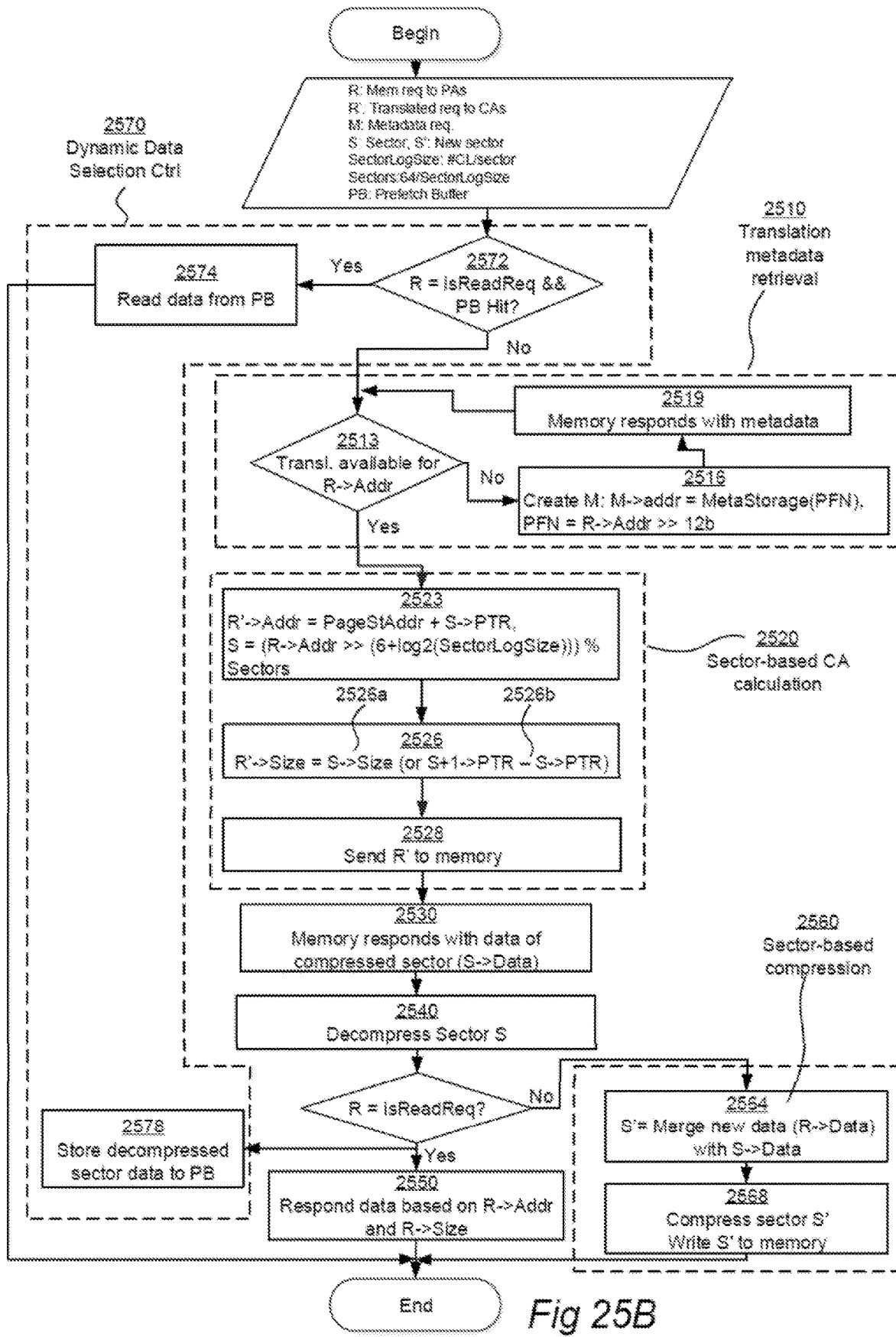
FIG. 25B depicts a third embodiment of a method for accessing compressed computer memory residing in physical computer memory, wherein the method is associated with the device in FIG. 28.
Figure 28:
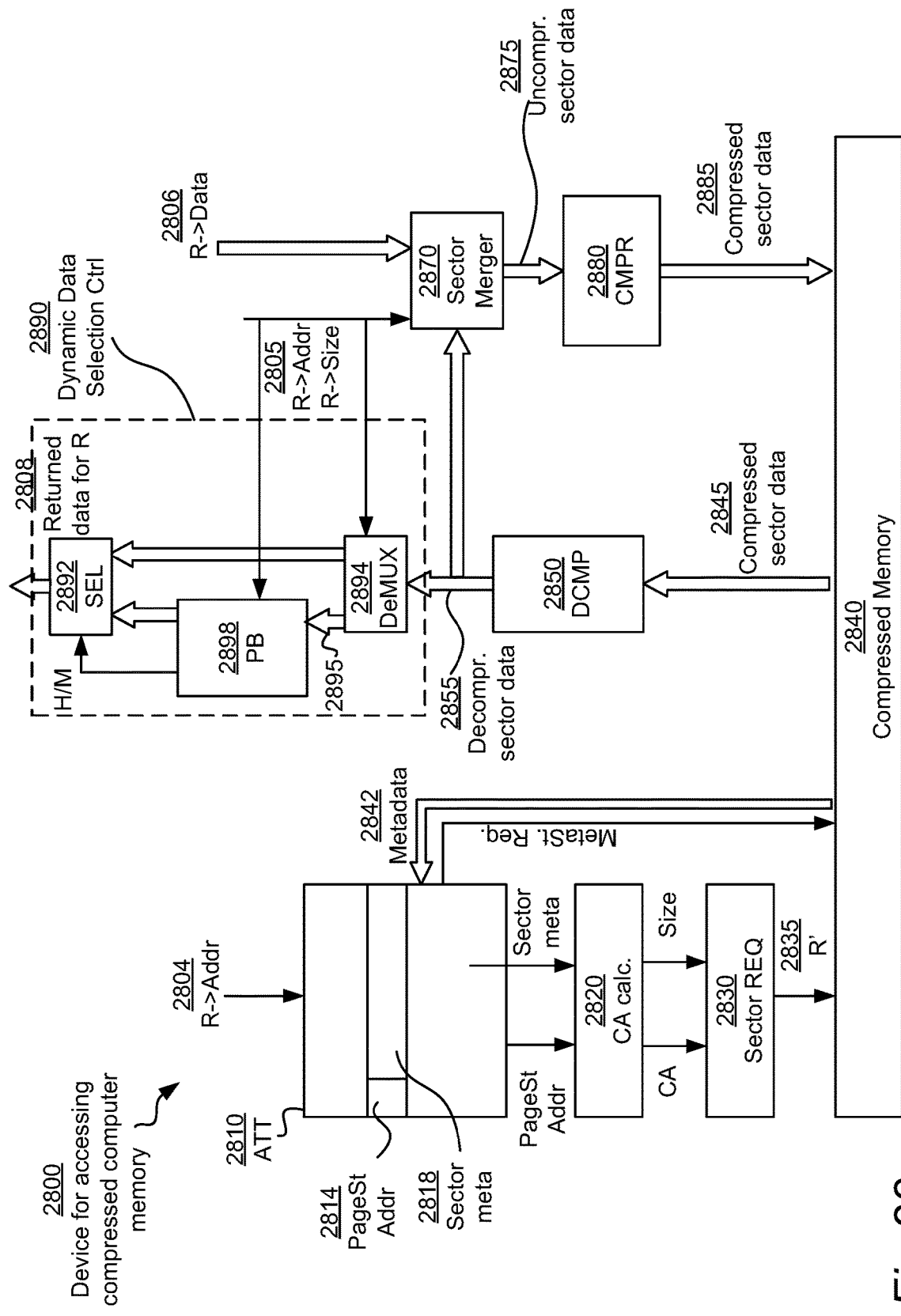
FIG. 28 depicts a third embodiment of a device for accessing compressed computer memory residing in physical computer memory, wherein a Dynamic Data Selection Ctrl mechanism has been added, and wherein an associated method is shown in FIG. 25B.

A third embodiment of a device 2800 for accessing compressed computer memory residing in physical computer memory is depicted in FIG. 28. The device 2800 is associated with the method in FIG. 25B. In the second embodiment, a Dynamic data selection control unit 2890 has been added. Said unit comprises a PB (Prefetch Buffer) 2898 that buffers in uncompressed form the (decompressed) sector data 2855 that arrives from memory upon a memory request R', a demux 2894 and a selector 2892. Based on the fact that running applications and/or operating systems can exhibit high spatial reference locality and because a sector has a larger logical size than the typical cache-line granularity that is demanded by processors and caches, "prefetched" sector data that is accessed because a request R demanded a specific cache line within said sector, can now be pre-decompressed (prefetched ahead of time) and stored in the PB in anticipation of future access to it. In said sector-based translation device embodiment of FIG. 28, the PB is accessed using the address and size (R→<Addr, Size>2805) of an incoming read request (the PB is not checked for write requests in this embodiment). If the data exists in the PB (PB Hit), no memory request is needed to be scheduled towards the memory and the data is returned from the PB through the selector 2892. Said selector is controlled by the Hit (H)/Miss (M) signal of the PB 2898. If it is a PB miss, then the request R 2804 must be converted to a sector request R' 2835 following the same procedure as described in the previous embodiment of FIG. 27. The data flow 2895 shows that only the sector data that has not been returned corresponding to a request R is stored in the PB 2898. However, in an alternative embodiment all the decompressed sector data 2855 could be stored. This selection is done by the Demux unit 2894, which is also controlled by the R→><Addr,Size>2805. The translation device of FIG. 28 shows the full potential of the sector-based translation as enormous amount of bandwidth as well as latency in the compressed system can be improved by combining the effect of compressibility and spatial reference locality that are both exhibited by the running programs in processor systems. In an alternative embodiment, the PB 2898 and ATT 2810 can be accessed in parallel reducing the overall translation latency.

In an alternative, write requests could also benefit from the presence of the PB, if there are back-to-back read and write requests to the same sector. If the sector data that is untouched by a write request is found in the PB, then no read request needs to be scheduled prior to the write request saving even more bandwidth. In another alternative embodiment, the same PB or another PB can be placed in front of the Sector Merger to store sectors. This can be beneficial if there are back-to-back write requests that are destined to the same sector.

In an alternative that uses the metadata format of FIG. 23 or 24, where the CSM can be used to selectively decompress the requested compressed block within a sector, the whole sector, or part of it, can be stored in a PB that is placed before the DCMPR so that it keeps the incoming (from memory) sector data in compressed form. This PB works similarly to the PB of the previous embodiments. However, data will not be decompressed unless they are explicitly requested to be decompressed. This can potentially save both bandwidth and dynamic energy due to decompression if there is low or no spatial reference locality.

In another alternative, each one of all the previous embodiments of the translation device can be pipelined to be able to translate and process many memory requests at the same time.

Other embodiments and alternatives can be realized by someone skilled in the art.

The sector-based translation format described above solves the problem of internal fragmentation due to its variable physical size, while at the same time it can substantially decrease the amount of metadata needed and improve bandwidth. However, in order to avoid or mitigate severe overhead in memory bandwidth due to the sector reads needed for memory writes, especially if said memory writes have no spatial reference locality or if the reuse distance of the read sector (to be merged with write requests) is larger than the size of the prefetch buffer itself, further improvements may be made. Examples of such improvements will now be described.

Address Translation: Hybrid Sector-Based Embodiments

Figure 29:
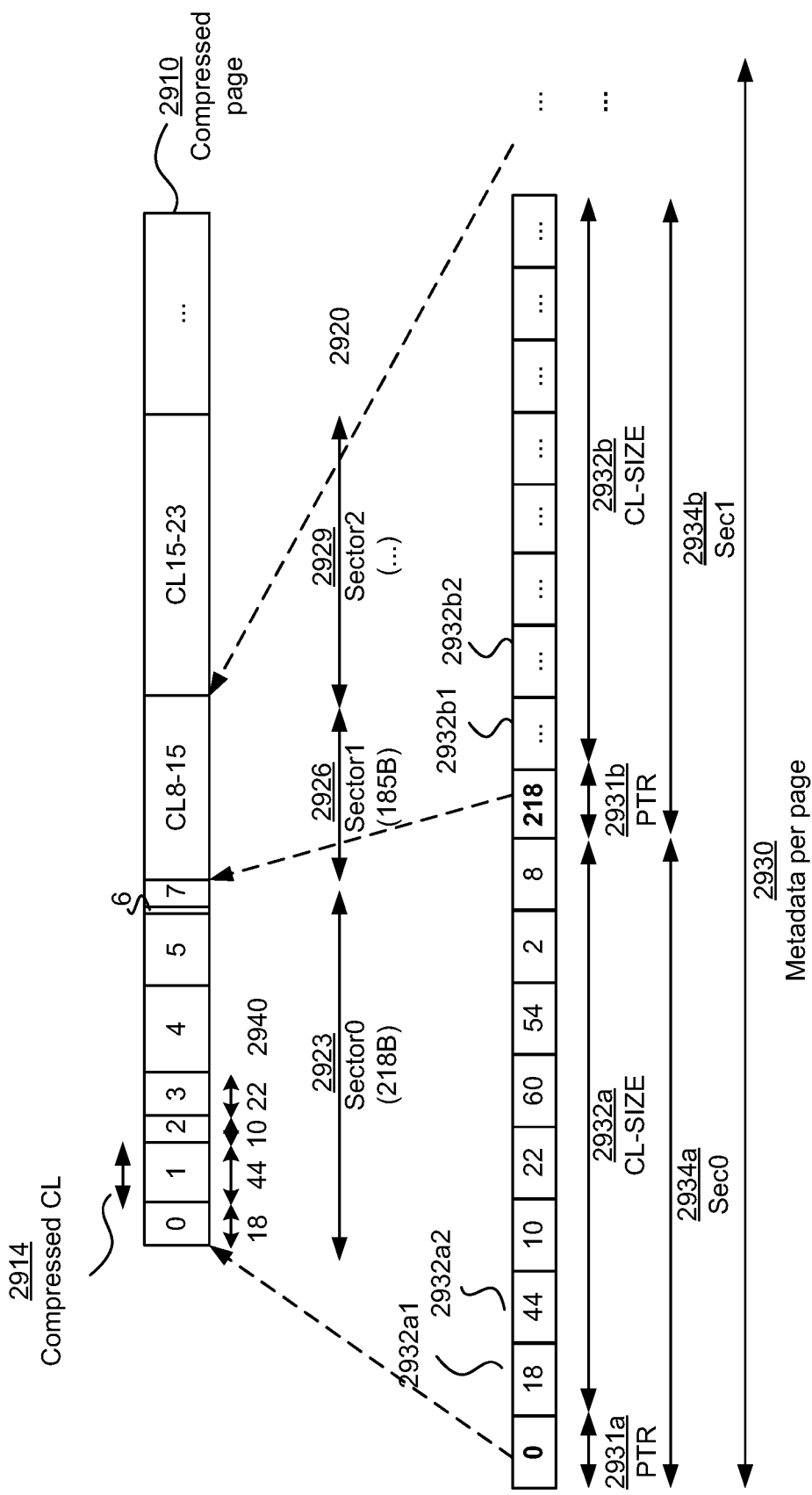
FIG. 29 depicts an exemplary sector-based hybrid translation metadata format wherein address translation metadata comprises sector pointers (PTR) and cache-line sizes (CL-SIZE).

An alternative to pure sector-based translation format combines sector metadata with cache-line metadata and is depicted in FIG. 29. Such a translation format is referred to as hybrid metadata. In said format, for a compressed page 2910 comprising compressed sectors 2920 metadata per page 2930 comprises sector metadata 2931 and cache-line metadata 2932 for each sector 2934. Sector metadata 2931 comprises only the sector pointers 2931$a$, 2931$b$, etc. and cache-line metadata comprises the cache-line size (CL-SIZE) 2932$a$, 2932$b$, etc. Each CL-SIZE subfield metadata encodes the cache-line size 2940 of the respective CL. For example, the CL-SIZE subfield 2932$a$1 encodes the compressed size of the first cache-line of sector0 2923. In the embodiment of FIG. 29, the SectorLogSize is 8, thus cache-line metadata comprises 8 CL sizes. In alternative embodiments wherein the SectorLogSize differs, both the sector and cache-line metadata would comprise more or fewer subfields. Such metadata format can allow more flexibility when accessing compressed data as it can now fetch or write either one or a plurality of sectors or one or a plurality of cache-lines. Moreover, it can reduce the overhead of sector reading for write operations improving potentially bandwidth usage, as mentioned in the previous paragraph. The size of translation metadata in this hybrid format embodiment has increased to: (8×12b)+(64×6)=96b+384b=480b, i.e., 320b more metadata overhead in comparison to the sector metadata format (sector pointers+sizes) of FIG. 24.

In an alternative, the cache-line metadata can be replaced with other metadata, for example, the compressed size metadata (CSM) if data is compressed in smaller granularity than the cache line granularity.

A first example of a sector-based hybrid translation method is depicted in FIG. and comprises the Translation Metadata Retrieval process 3010, the Sector-based Hybrid CA calculation process 3020, Sector-based compression 3070, Sector-based decompression 3050 and other processes that exist in a memory compression system. The Translation Metadata Retrieval process 3010 is similar to 2510/2610 of FIGS. 25 and 26. When a translation is available for an incoming request R (Yes arrow of 2513), it is first checked whether it is a read or a write request. If it is a read request, the whole sector is going to be requested 3023 after the compressed address 3021 and size 3022 are calculated similarly to the example method of FIG. 25. However, if it is a write request, then the write data of the request R can be immediately compressed 3030; its size (CS) is compared 3027 to the old size, which is further determined by the CLi→Size metadata of the sector the write request belongs to. The sector is calculated 3025 as in 2523/2623 of FIG. 25/26; the CLi (i.e., index of the CL within said sector) is calculated 3025 by shifting the 6 least significant bits of the address (for a physical cache line of 64 Bytes), and calculating the modulo of the rest of the address with the SectorLogSize. If the size of the write request is larger than one cache line, then the old size is determined by a sum (CL→Size) of the CLs involved in this write request. Comparing CS to the old CL size can lead to three possible outcomes: if CS>old (Yes outcome of 3027), then the sector's cache lines that follow the cache lines involved in said write request must be shifted in the compressed memory to avoid being overwritten by the new written data. Thus, the whole sector needs to be read (steps 3021-3023, 3040), decompressed 3050, merged with new data 3073, compressed (3076) and written to memory (3079). An optimization to reduce the memory traffic is to read only the sector's cache lines affected in memory (instead of the whole sector), decompressed 3050, merged with new data 3073, compressed 3076 and written to memory as a sequence of consecutive cache lines (i.e., a sub-sector request). This optimization can be applied only if the write request does not cause a sector overflow, otherwise the whole sector (or, in alternative, all the lines of the sector except for the one(s) currently modified by said write request) must be read. The sector overflow handling is described later with reference to FIG. 39-43. If CS=old (No outcome of 3027), the compressed data can be written immediately to memory 3080 after calculating its exact compressed address and size, by step 3029, without requiring to read the sector.

Finally, if CS<old, writing the new compressed data and updating the CL-Size in metadata will result in wrong translation metadata. Hence, there are different ways to handle this. In one embodiment, the compressed data can be written immediately to memory (path of steps 3029 and 3080) but padding first the compressed data with as many "don't care" bits as the difference (old−CS), this way creating internal fragmentation which is not trackable. In a further alternative, internal fragmentation can be tracked by adding one bit per CL per sector (64b in total for the page metadata), which is set when internal fragmentation is created. In yet another embodiment, one of the possible CL→Size values can be "borrowed" to encode internal fragmentation in the most usual case when uncompressed cache lines turn gradually into compressed form so that it can be detected when the cache lines within the sector are ready to be compacted to form a compressed sector. In yet another alternative, this case can be handled as a CS>old case (Yes outcome of 3027), creating external fragmentation though (i.e., fragmentation is no longer part of the sector).

External fragmentation can however be eliminated without extra metadata by recompacting the sectors (periodically or on demand). The space occupied by external fragmentation can be retrieved using the sector pointer metadata and CL-size metadata as realized by someone skilled in the art. In this latter alternative, the same optimizations as described in the preceding paragraph can be applied by reading only the affected cache lines of the sector and after merging with the modified data of the current write request, to create a sub-sector write request.

The translation metadata (i.e., sector SIZE and/or sector PTR and/or CL(s) size) need to be updated accordingly after it is determined which write scenario must be applied.

In an alternative, when the whole sector needs to be read, merging new with old sector data may not require to decompress the sector as was described previously.

If the size of the write request is not aligned to cache lines for which there are available translation metadata, either the whole sector is read, decompressed, merged with new data and written back, or the involved cache lines. Those skilled in the art can realize other alternative implementations whose complexity can be higher or lower depending on how often such request cases occur. Such other embodiments are also contemplated.

In a second example of a sector-based hybrid translation method of FIG. 31A-D (where FIG. 3B-D are detailed views of FIG. 31A), the selective fetching of compressed sectors or compressed cache lines can be also applied to read requests improving read bandwidth and latency accordingly. Reading the whole sector is beneficial either when there is spatial reference locality or when the compression ratio (CR) is high (i.e., CR>=SectorLogSize), otherwise it may be preferred to read as much as the size of the original request R. Hence, this second example requires some changes to the method: 1) to add a Dynamic data selection control process 3190 that comprises a Prefetch Buffer functionality 3193 similar to the functionality of the PB unit 2890 of FIG. 28, a decision mechanism 3196 and a selector 3199; 2) to modify the Sector-based Hybrid CA calculation process 3020 by adding the process step 3124 which calculates the CA and compressed size of R' that is smaller than a sector. Spatial reference locality can be determined by measuring in one embodiment the utilization of the prefetch buffer, while the CR is known already from the translation metadata. The utilization of the prefetch buffer is tracked by measuring for example the hit ratio of the sector data stored in the buffer. In an alternative, it can be selected to read only compressed cache fines but mark the prefetch buffer with shadow sector data to emulate the utilization of the prefetch buffer.

In the second example of a sector-based hybrid translation method 3100, the decision criterion of the decision process step 3196 therefore can be determined by the following formula:

$$\frac{512}{CR} \leq (1 + 7 \times U) \times 64,, \qquad (1)$$

where 512 is the sector's uncompressed physical size in bytes (8×64B, if the SectorLogSize is 8), 1+7×U: 1 cache line is accessed in a non-compression system while 7×U, is the number of extra cache lines fetched by a sector read and U is the prefetch buffer utilization (i.e., how many of those are actually accessed), 64: the cache line's uncompressed physical size in bytes.

If the formula is solved so that the CR is the variable to decide upon, it must hold that:

$$CR \geq \frac{8}{1 + 7 \times U},, \qquad (2)$$

In a different alternative, the formula can be modified to compensate for the extra traffic due to metadata, for example as follows:

$$\frac{512}{CR} + \text{avg\_metadata\_per\_request} \leq (1 + 7 \times U) \times 64,, \qquad (3)$$

Someone skilled in the art can solve this equation under different parameters for example another SectorLogSize value. Moreover, the decision criterion of the present disclosure is not limited to the specific formula but someone skilled in the art can realize other similar formulas to combine the impact of compressibility and sector prefetch utilization, or other criteria; for example, using only the compressibility, or the PB utilization or monitor and predict the access pattern to determine whether fetching a sector or individual cache lines is preferable.

Figure 32:
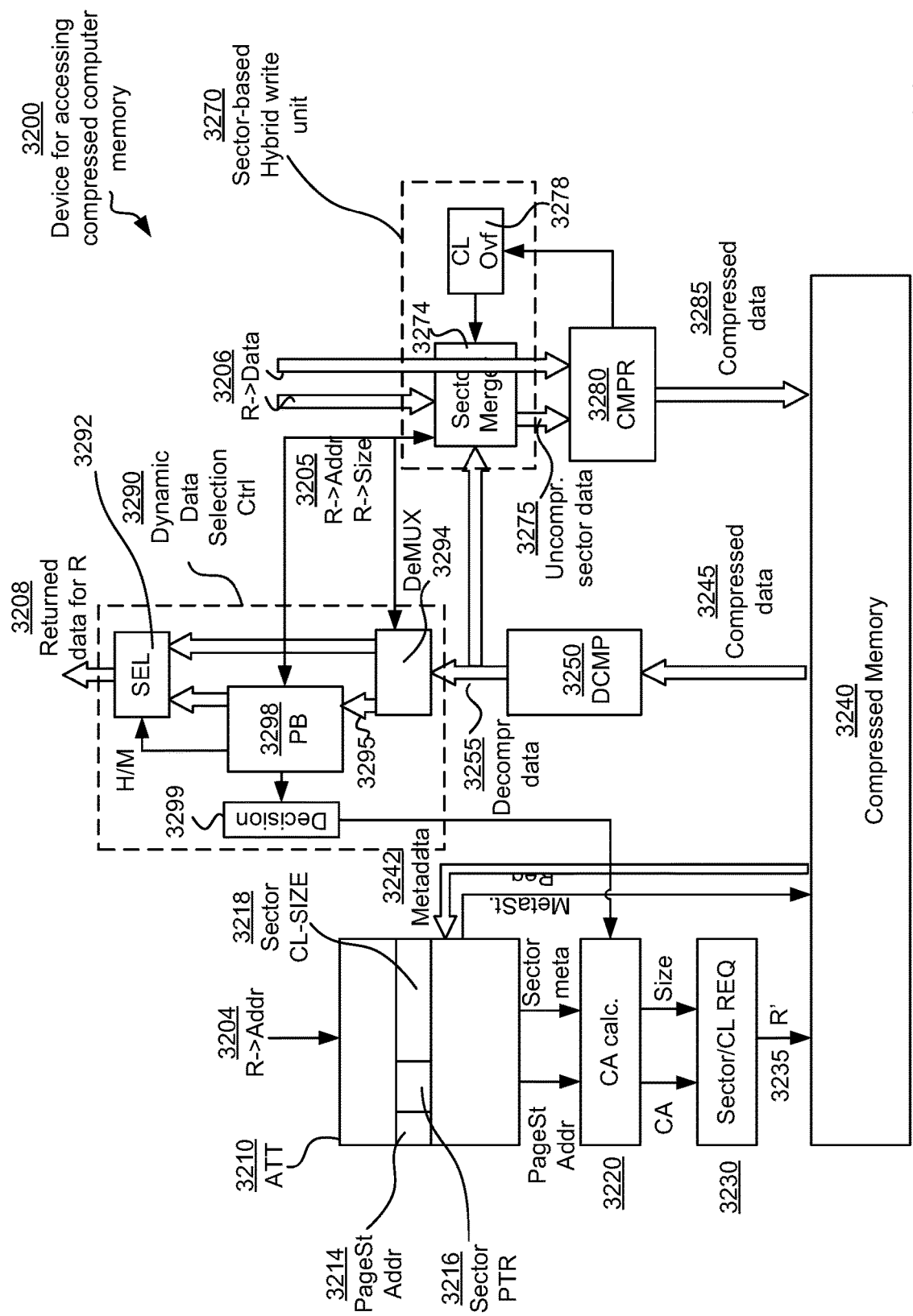
FIG. 32 depicts a fourth embodiment of a device for accessing compressed computer memory residing in physical computer memory, wherein the translation metadata follows the exemplary format of FIG. 29.

FIG. 32 depicts a fourth embodiment of a device 3200 for accessing compressed computer memory residing in physical computer memory. The device 3200 includes a sector-based hybrid translation device (3210-3230, 3270 and 3290) along with a compressor 3280 (CMPR) and decompressor 3250 (DCMP) in a hybrid sector-based memory compression system. FIG. 32 comprises also the compressed memory 3240. All the memory requests are intercepted by the device 3200 of FIG. 32. The sector-based hybrid translation device comprises the Sector-based Translation and Address Calculation units (3210-3230), the Dynamic data selection control 3290, the Sector-based Hybrid write unit 3270. The ATT 3210 comprises for each page the PageStAddr 3214, and the sector-based hybrid metadata PTR 3216 and sector CL-SIZE 3218. The ATT is accessed and updated similarly to the embodiment 2710/2810 of FIGS. 27 and 28.

The PB 3298 of the Dynamic data selection control 3290 is accessed using the address and size (R→<Addr, Size>2805) of an incoming read request R (the PB is not checked for write requests in this embodiment). If the data exists in the PB (PB Hit), no memory request is needed to be scheduled towards the memory and the data is returned from the PB through the selector 3292. Said selector is controlled by the Hit (H)/Miss (M) signal of the PB 3298. If it is a PB miss, then the request R 3204 must be converted to a sector request R' 3235. Depending on the decision made by the Decision unit 3299 (detailed later) of the Dynamic data selection ctrl 3290, the CA calc. unit 3220 will derive either one or a plurality of sector requests, or one or a plurality of CL requests (one or a plurality of sectors or CLs is derived based on the address and size of the request R). The Sector/CL REQ 3230 creates the converted R' requests towards the compressed memory. Said unit 3230 also bookkeeps the association of original requests R 3204 to converted requests R' 3235. The compressed data 3245 returned from the compressed memory is decompressed by the DCMP 3250. If the original request R is a read request, the decompressed data 3255 is directed to Dynamic data selection control unit 3290, which returns the data for R using the selector 3292. If the decompressed data 3255 is a sector, all of it or part of it (similarly to previous embodiments) is stored in the PB 3298. If the data 3255 is one or a plurality of cache lines, the PB can be marked with a shadow sector (its use is detailed later).

If the original request R is a write request, then the data 3206 (of R) is first compressed by the CMPR 3280. The compressed size (CS) of the compressed data is sent to the CL ovf (overflow) unit 3278 of the Sector-based hybrid write unit 3270. The CL ovf 3278 implements similar functionality to the ones of 3125, 3127, 3129 described in the previous embodiment of FIG. 31A-D. If there is no CL overflow, the compressed data can be written immediately to memory; otherwise a compressed sector request must be created by the units 3210-3230, then said compressed sector must be decompressed by 3250, merged with new data in 3274, compressed again in 3280 and then eventually written to the compressed memory 3240, similarly to the embodiment of FIGS. 27 and 28. If the size of the original write request aligns to one or a plurality of sectors then the sector read step can be omitted.

In said hybrid sector-based device 3200, the Decision unit 3299 of the Dynamic data selection ctrl 3290 makes a prediction of whether the request R should be converted to a sector request, or a sub-sector request (i.e., a plurality of consecutive cache-lines), or a CL request. Said prediction decision can be made based on one or a plurality of criteria. In one embodiment, one criterion is the compressibility monitored; in an alternative embodiment it can be the PB utilization; in yet another embodiment, the decision can be made using the formulas (1), (2) or (3) described in the paragraph above which refers to the second example of the sector-based hybrid translation method 3100. The compressibility can be monitored in one example embodiment by tracking the compressed data sizes in the CMPR 3280; in an alternative embodiment it can be calculated for a specific page using the compressed sector or CL sizes from the ATT 3210. PB utilization can be quantified by measuring the hit ratio of the PB 3298. However, the PB might not have enough data when only CLs are preferred to be read because their data will typically not be stored in the PB. Henceforth, when the decompressed data 3255 does not correspond to a sector but to one or a plurality of CLs, the sector wherein said CL(s) belong can be marked in the PB using a pseudo-valid metadata bit defining that its data is not actually in the PB but could have been if the sector was accessed. In this case, when the PB is looked up and the pseudo-valid bit is set then it is a pseudo-Hit (instead of a Hit) and can be used similar to a Hit when measuring the PB utilization. Other embodiments to quantify PB utilization or compressibility monitoring can be realized by someone skilled in the art and such embodiments are also contemplated.

Figure 33A:
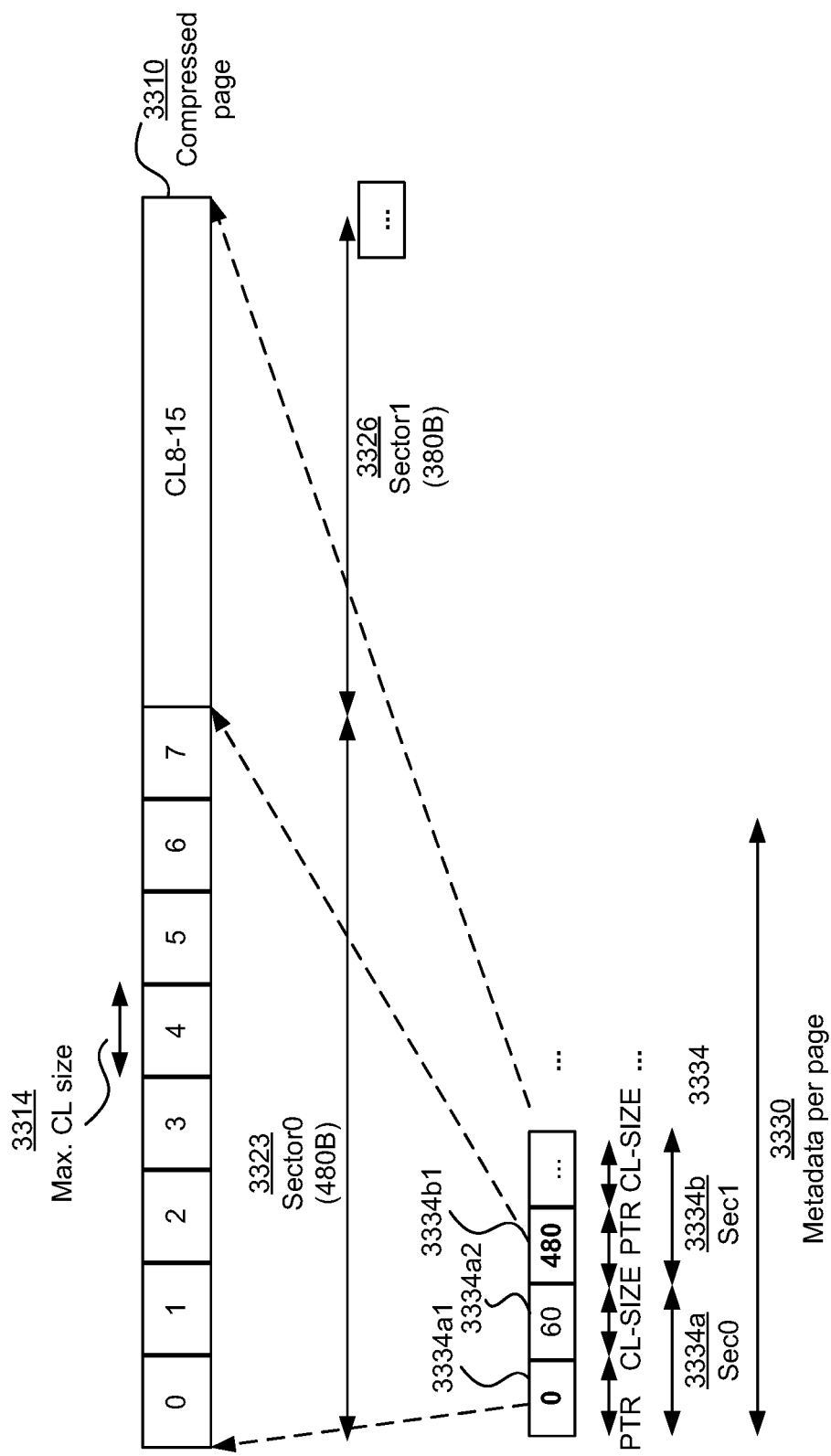
FIG. 33 comprises FIGS. 33A and 33B. Each figure depicts an exemplary sector-based hybrid translation metadata format wherein the compressed cache-lines within each sector are restricted to a specific size and thus address translation metadata comprises sector pointers (PTR) and one CL-SIZE per sector. The SectorLogSize is 8 in FIG. 33A and 4 in FIG. 33B.
Figure 33B:
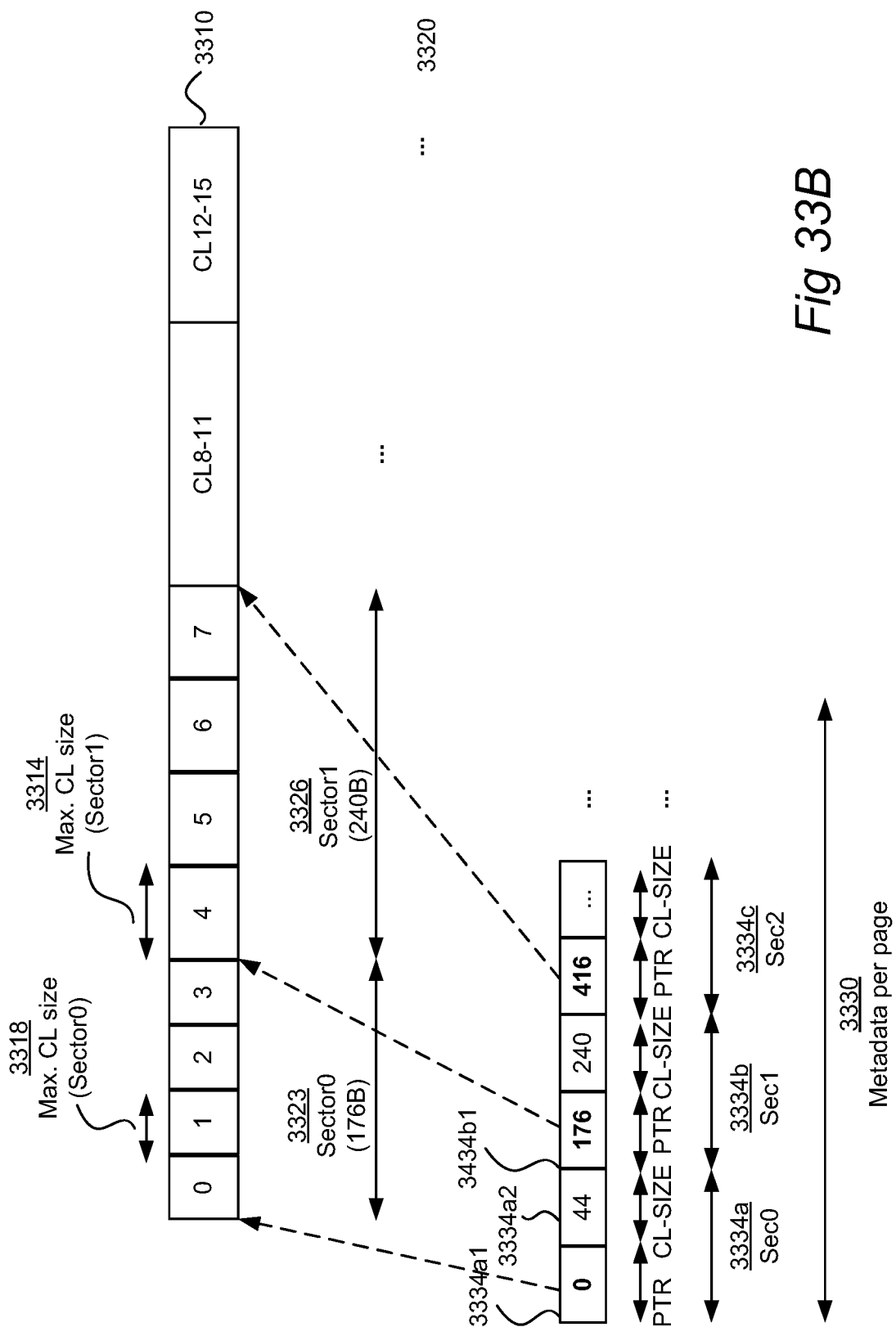

In an alternative sector-based translation format, sector metadata is combined with cache-line metadata, however the cache lines within each sector are restricted to a specific compressed size as depicted in FIG. 33A; said format is referred to as sector-based hybrid-limited translation format because it limits the amount of extra metadata. For example, the CL-SIZE metadata is only 6 bits per sector instead of SectorLogSize×metadata_width; while in the hybrid metadata format wherein the CL-size metadata overhead is 8×6=48 bits per sector, 384 bits in total per page, in this example metadata format it is 6 bits per sector and only 48 bits in total. In this alternative sector-based translation, the total metadata per page 3330 is 96+48=144 bits. However, this metadata format can reduce compressibility substantially as all the cache lines within a sector must have the size of the largest compressed cache line 3314. For example, sector0 3323 has now a compressed size of 480 Bytes while in the sector-based hybrid sector0's 2223/2323 size is 218 bytes instead. Such metadata format may be more beneficial for sectors of smaller SectorLogSize. In the alternative of FIG. 33B, the SectorLogSize is set to 4 thus there are 16 sectors. The size of the compressed sectors 0 3423 and 1 3426 that correspond to sector 0 3323 of the embodiment of FIG. 33A is now 416 Bytes (instead of 480 Bytes in FIG. 33A). However, the sector translation metadata is now 2× more than in the alternative of FIG. 33A. Someone skilled in the art can identify which metadata overhead vs. compression efficiency is the best if such format is selected.

Figure 30A:
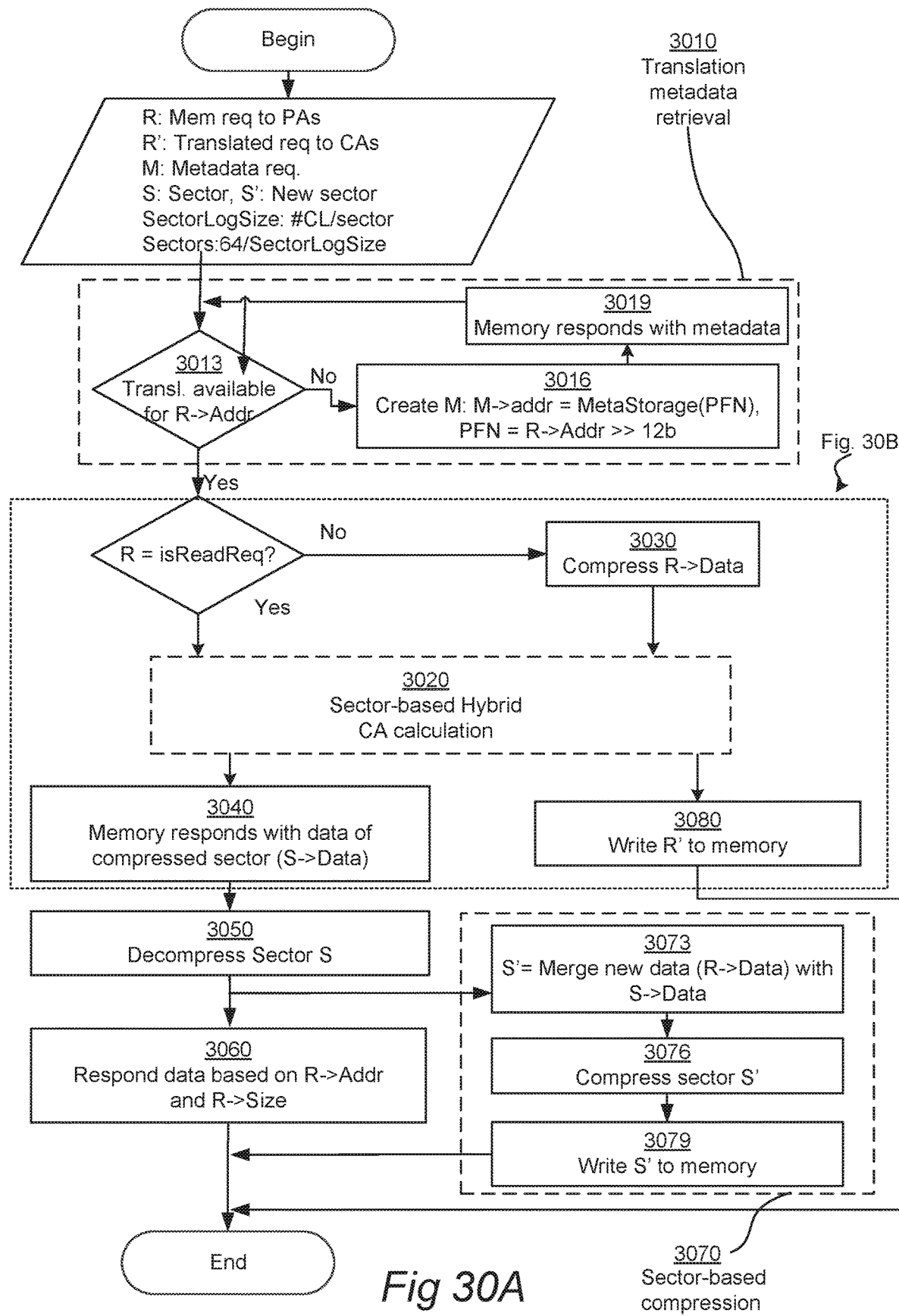
Figure 30B:
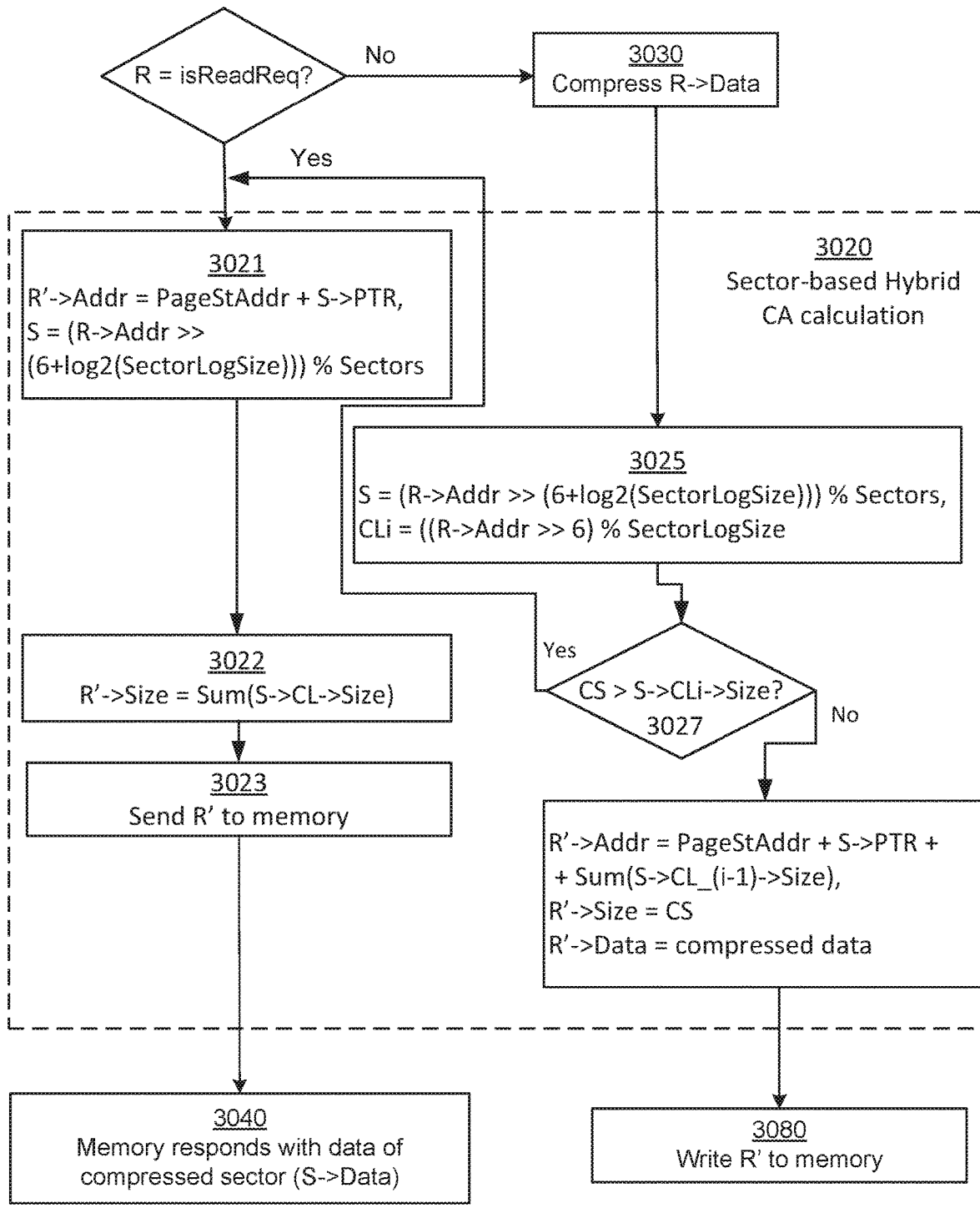
Figure 31B:
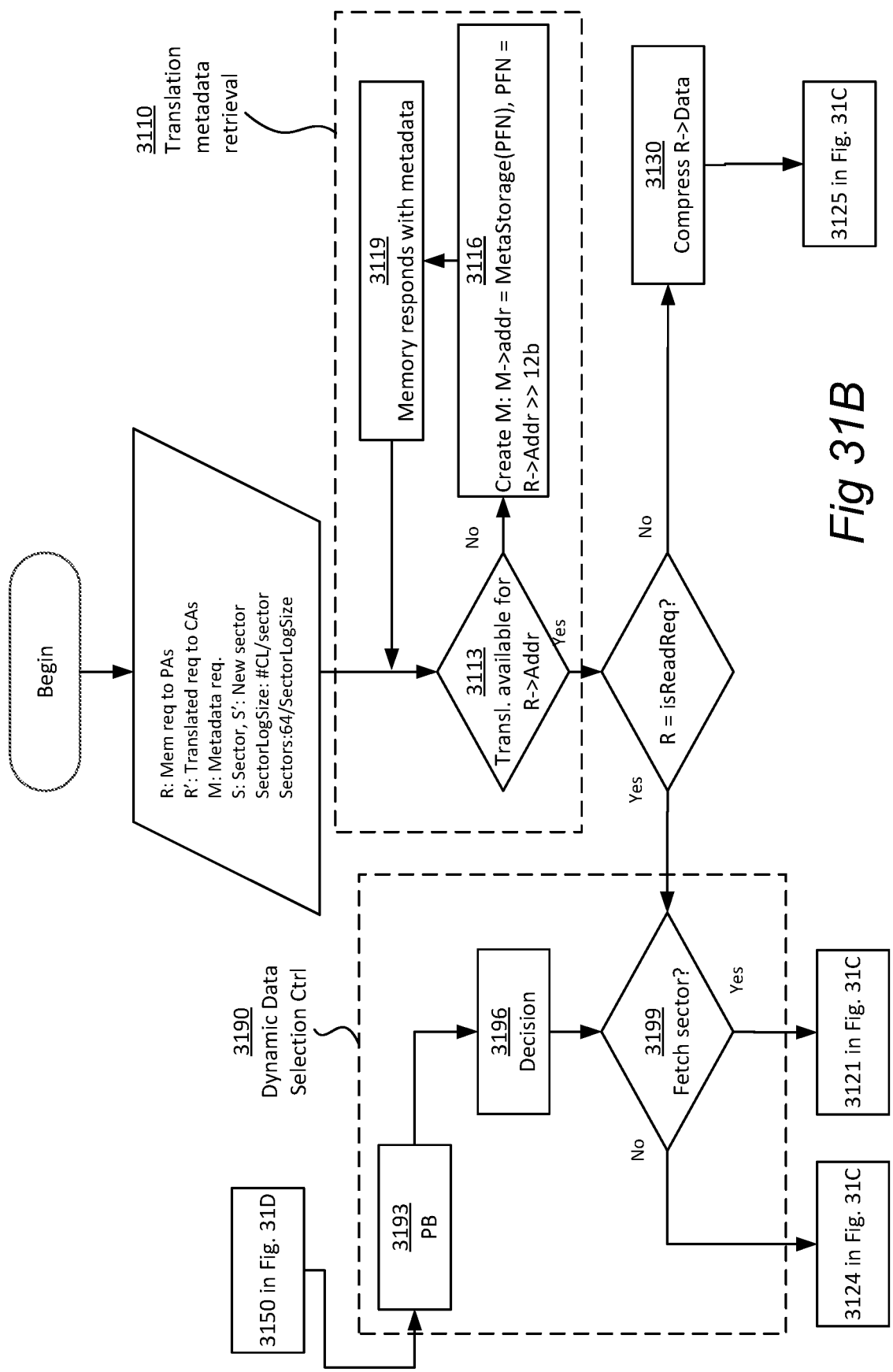
Figure 31C:
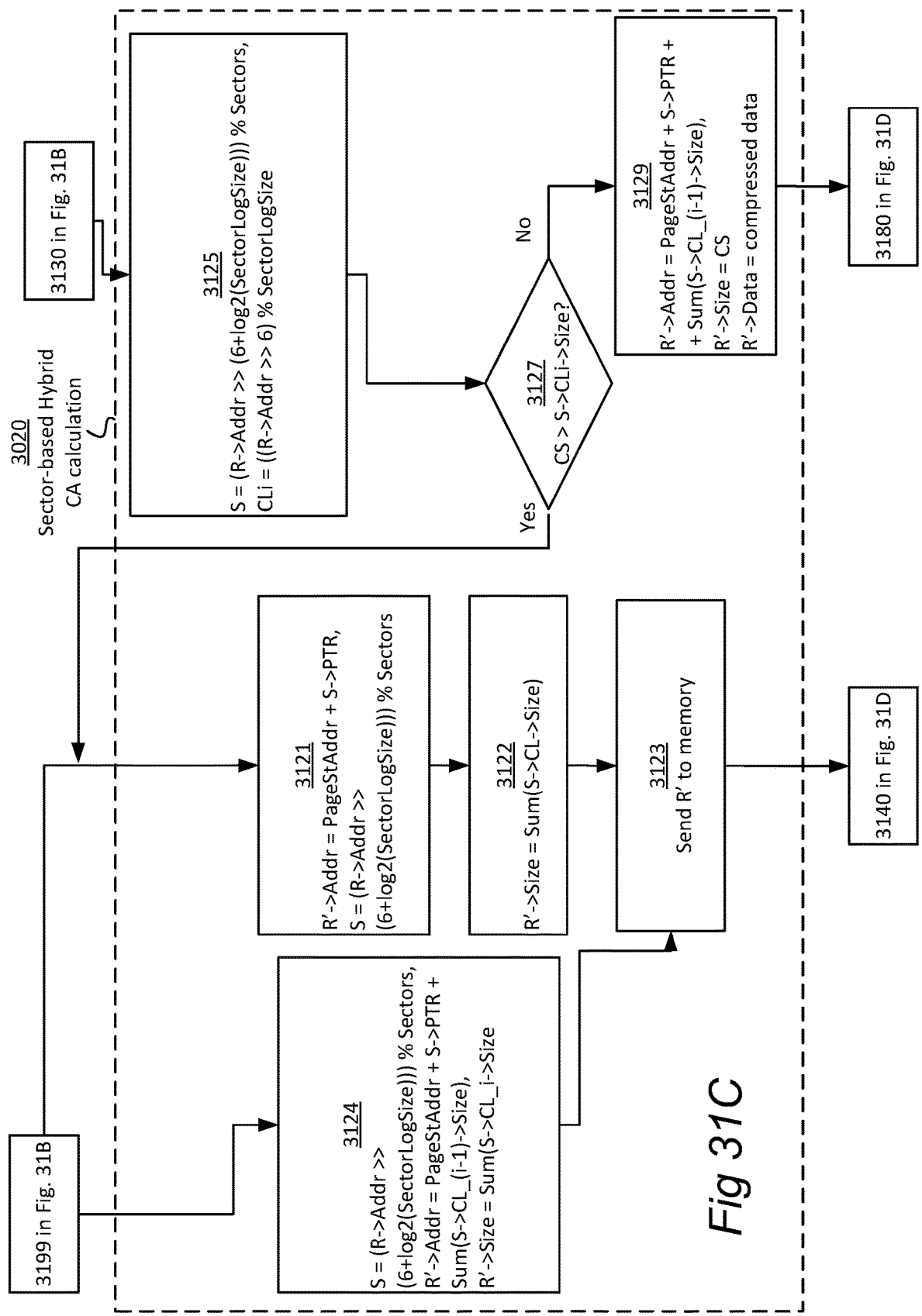
Figure 31D:
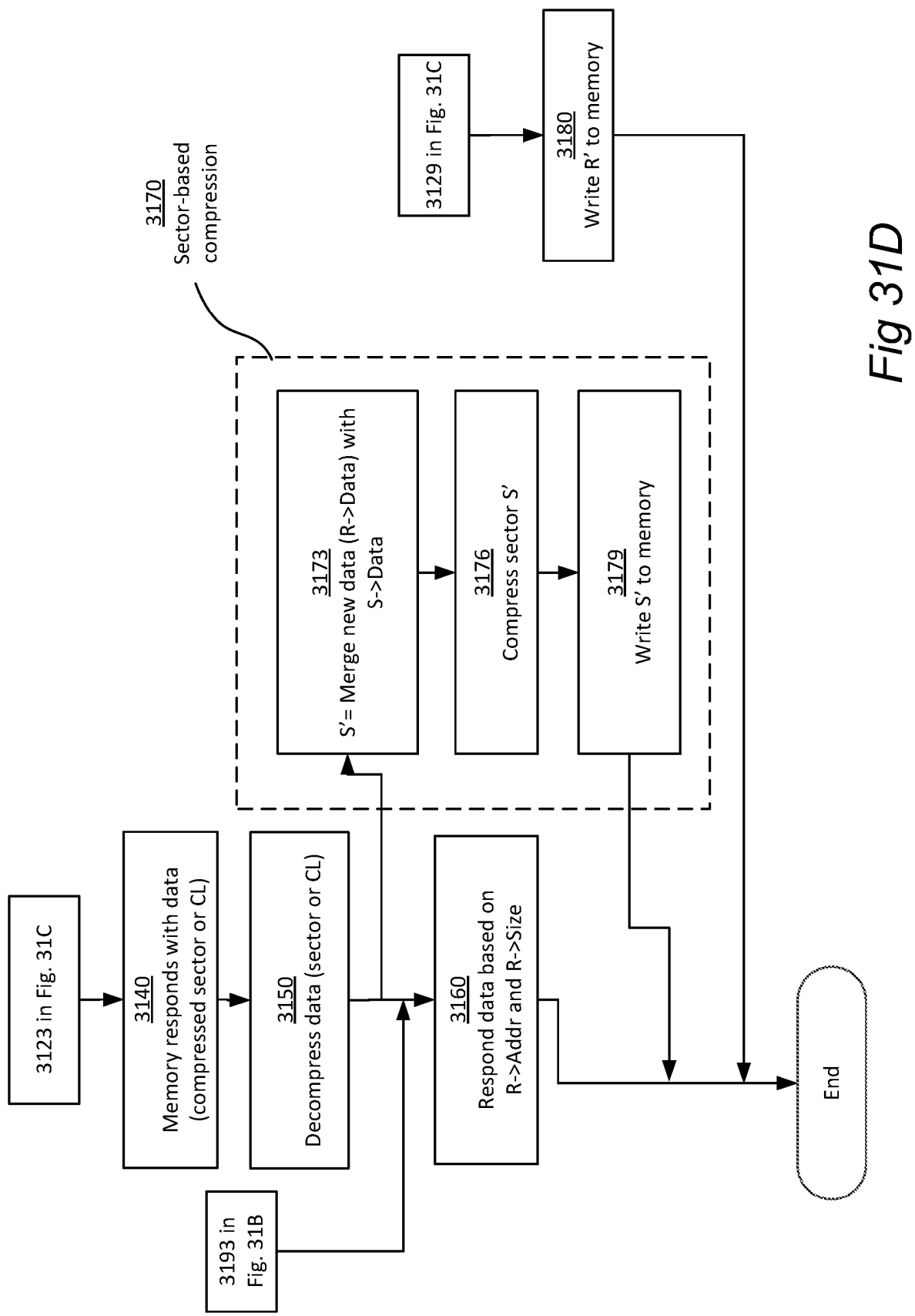

The method and device to support this sector-based hybrid-limited translation format are similar to the aforementioned sector-based hybrid translation method (FIGS. 30 and 31) and device (FIG. 32) respectively, except for the following functionality: 1) the calculation of the compressed address of a specific cache line is determined as follows: R'→Addr=PageStAddr+S→PTR+#pCLs×S→CL-Size, where #pCLs is the number of cache lines that exist prior the requested cache line within this sector;
2) the maximum compressed size among the compressed cache lines within a sector must be determined when a sector is written in memory; 3) if a compressed cache line has size larger than the CL-size, all the cache lines within the sector must be read, decompressed, merged and recompressed (equivalent to reading, decompressing, merging and compressing a sector); 4) if a compressed cache line grows in size and must be stored uncompressed then the whole sector must be decompressed.

Figure 34:
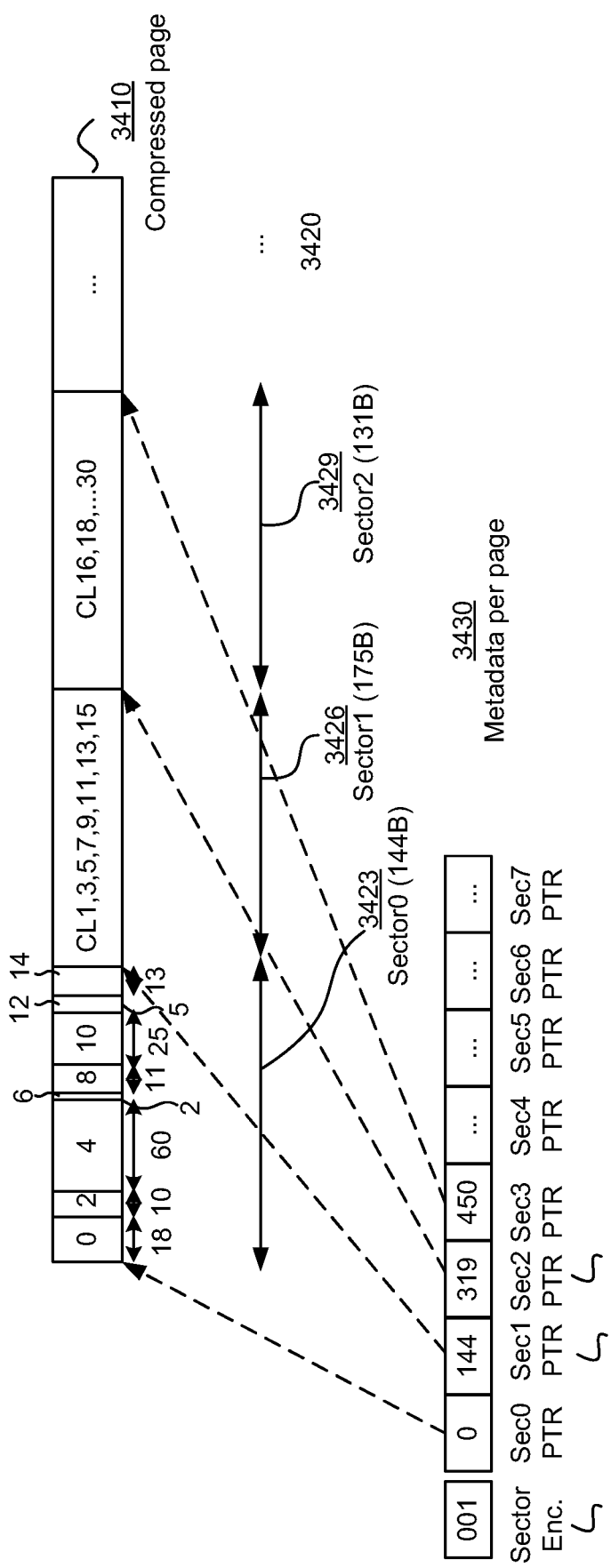
FIG. 34 depicts an exemplary sector-based translation metadata format wherein the ordering of compressed data within each sector has changed to factor in spatial reference locality (stride degree of 2 in this figure).

In a further alternative for a sector-based translation format, depicted in FIG. 34, the ordering of compressed data within each sector can change to factor in spatial reference locality in addition to compression for better improvement in memory bandwidth. This will be especially beneficial in the presence of a PB 2898 (FIG. 28) and 3298 (FIG. 32) since this can improve the PB utilization. Said translation format is referred to as compressed data reordered sector-based translation format. In the exemplary format of FIG. 34, sector0 3423 gathers the cache lines (CL) 0, 2, 4, 6, 8, 10, 12, 14; sector1 3426 gathers the CL 1, 3, 5, 7, 9, 11, 13, 15; sector2 3429 gather the CL 16, 18, 20, 22, 24, 26, 28, 30; etc. Said exemplary format organizes the sector compressed data if the memory requests have a stride of 2. The organization of sector data is encoded in the extra field Sector Enc. 3432 so that the address translation method and device can associate the memory request to a specific sector. This requires a negligible amount of extra metadata in comparison to the previously disclosed embodiments. The metadata is kept per page allowing different reordering types for different pages. In an alternative, said metadata can be omitted if one reordering type is applied for the whole sector-based compressed memory.

In an example of a compressed data reordered sector-based translation, the reordering of data organized in sectors happens when a page is compressed. There is a set of preconfigured reordering modes, for example, stride of 2, 3, 4 of the size of data accessed (e.g., typically cache-lines). The exact type of reordering is decided by a prediction process which monitors the access traffic of the data within a page prior its compression and tries to match it with one of the preconfigured reordering modes. The best matching one is selected when the page is compressed for a first time. In an alternative embodiment, the type of reordering can be adjusted by recompressing a page especially if the predictor found that the previous prediction was not accurate.

If the memory traffic is monitored for regular access patterns, then in one examplary embodiment wherein the access pattern monitored is stride-based, the boundaries of the stride degree value set can be limited by the total number of data blocks for which the access pattern is monitored per page divided by the SectorLogSize (measured in number of said data blocks). For example, if the access pattern is monitored in the cache-line granularity, then for a 4 KB page that comprises 64 cache lines and for a SectorLogSize of 4 cache lines, the stride degree belongs to the value-set [0,16]; for stride-degree of 16, sector0 will comprise cache-lines (CL) 0, 16, 32, 48; sector1 will comprise CL 1, 17, 33, 49; etc. If the memory traffic is monitored for irregular access patterns, then in one exemplary embodiment, the monitoring mechanism could comprise a 2D array of counters, wherein each dimension width is determined by the number of data blocks monitored in a page (for example cache-lines). This 2D array keeps track of possible correlations between block accesses that are successive within a page. Someone skilled in the art may implement embodiments that are capable of monitoring successive block accesses within a page, even if accesses in different pages occur inbetween. One dimension of the 2D array is used to refer to the previous data-block access and the other dimension to the current data-block access, so that based on a combination of the previous and the current access the associated counter is incremented. For example, a counter positioned in (10,40) represents the number of times that successive accesses between blocks 10 and 40 within a page have occurred. Said set of counters is evaluated periodically or on-demand to decide if the array of counters can derive a formal correlation-based pattern that will be used to group data blocks within a sector. Said grouping can be still encoded with the Sector Enc metadata field but it requires to generate a hash function to be able to determine the correct sector for an incoming memory request address.

If the access pattern of every page is monitored in isolation, this may require a lot of resources to maintain all the access patterns. In yet another embodiment, the access pattern of more than one pages can be used to determine the reordering type for a specific page(s). Such prediction may be less accurate, but the predictor requires less resources to make the decision. The monitoring traffic can be the read traffic only, the write traffic only and/or both.

In an alternative of a compressed data reordered sector-based translation, the reordering of data organized in sectors happens when data in a page is compressed for a first time. In such a case, the whole page needs to be read from memory, compressed and written back to memory. The data reordered within each sector is cache lines, however, data blocks of other sizes can be considered for reordering in other alternative embodiments.

Previous sector-based address translation methods (and devices) can support the compressed data reordered sector-based translation format if enhanced by a prediction method (device) that monitors the incoming memory requests (R) of FIGS. 25, 26, 30 and 31 (27, 28 and 32) and a page is compressed for a first time—metadata determines whether page is compressed or not—the data of the page is read, reordered, compressed and stored in the memory by updating the metadata 3434*a, b, c,* etc and the sector encoding 3432 accordingly. In alternative embodiments, the page does not need to be already compressed but can be instead recompressed if the current sector encoding type does not match with the predicted sector encoding type.

In alternative embodiments of re-ordered sector-based translation formats, methods and devices, compressed data within a sector can be reordered based on other criteria except achieving better spatial locality. In a further alternative embodiment, the compressed data within a sector could be reordered based on their compressed size to favor better alignment with a potentially existing fixed-size memory block size. Such an embodiment would be preferred in a context where data compression is used to minimize the traffic from/to memory. For example, if the compressed blocks within a sector are of sizes 40B, 50B, 20B and 10B, the memory access block size is 64B, and the goal is to minimize the worst-case amount of traffic (i.e., traffic of compressed data shall be smaller or equal to uncompressed data per block of data accessed, hence fetching isolated compressed blocks —when access pattern is not favorable for fetching sectors—should not lead to fetching more memory blocks compared to the uncompressed memory), then ordering the compressed data in original order would have as a result that the compressed block of 50B spans two memory access blocks; to solve this without reordering the blocks within a sector, would require to introduce a fragment after the block of size of 40B pushing so that the block of 50B fits in a block of size that is equal to the memory access block size, however, this would result that the blocks of sizes of 20B and 10B need to be pushed further requiring extra space and reducing the compressibility; instead, by reordering the compressed blocks as follows 40B, 20B, 50B, 10B the same level of compressibility is maintained while alignment is also achieved. Reordering the data within a sector based on the compressed block size requires a small amount of metadata per sector that defines the ordering of compressed data blocks, i.e., SectorLogSize×(log 2(SectorLogSize)); for the aforementioned example where SectorLogSize=4, the amount of metadata is 8 bits/sector. If the re-ordering is limited to compressed blocks within a sector, then re-ordering can occur any time the sector is compressed. However, if the reordering of data happens in such way that all the sectors are affected, it would be preferable to do the reordering when the whole page is compressed similar to previous embodiments.

The various embodiments and alternatives described above with reference to FIG. 20 to FIG. 34 can be summarized as follows. A device 2700; 2800; 3200; 2700'; 2700" for accessing compressed computer memory 2740; 2840; 3240 residing in physical computer memory comprises an address translation unit 2710; 2810; 3210, a compressed address calculator unit 2720; 2820; 3220, a sector request unit 2730; 2830; 3230, a selector unit 2760; 2890; 3290, a sector merge unit 2770; 2870; 3270, a decompressor 2750; 2850; 3250 and a compressor 2780; 2880; 3280.

The address translation unit 2710; 2810; 3210, the compressed address calculator unit 2720; 2820; 3220 and the sector request unit 2730; 2830; 3230 are configured, in combination, for converting a physical memory access request R to a sector-based compressed memory request R', wherein a sector id is extracted automatically using an address 2704; 2804; 3204 of said physical memory access request R, said sector id is used to determine from sector-based translation metadata 2742; 2842; 3242 the location of a sector in the compressed computer memory 2740; 2840; 3240, a compressed address CA and size Size of the determined sector are calculated, and based on the compressed address CA and size Size, a sector request R' is made 2735; 2835; 3235 to the compressed computer memory 2740; 2840; 3240.

The decompressor 2750; 2850; 3250 and the selector unit 2760; 2890; 3290 are configured, in combination, for operating on compressed sector data 2745; 2845; 3245 as retrieved from the compressed computer memory 2740; 2840; 3240 in response to the sector request R' to obtain read request response data from said compressed sector data 2745; 2845; 3245 using the address and a size 2705; 2805; 3205 of said physical memory access request R, and to return the obtained read request response data in decompressed form 2708; 2808; 3208 to a source of said physical memory access request R when being a read request.

The sector merge unit 2770; 2870; 3270 and the compressor 2780; 2880; 3280 are configured, in combination, for merging data of said compressed sector data 2745; 2845; 3245—as retrieved from the compressed computer memory 2740; 2840; 3240 in response to the sector request R'—with data 2706 in said physical memory access request R to obtain sector-based write request data using the address and size 2705; 2805; 3205 of said physical memory access request R when being a write request, and to store the obtained sector-based write request data as compressed sector data 2785; 2885; 3285 in the compressed computer memory 2740; 2840; 3240.

Figure 27B:
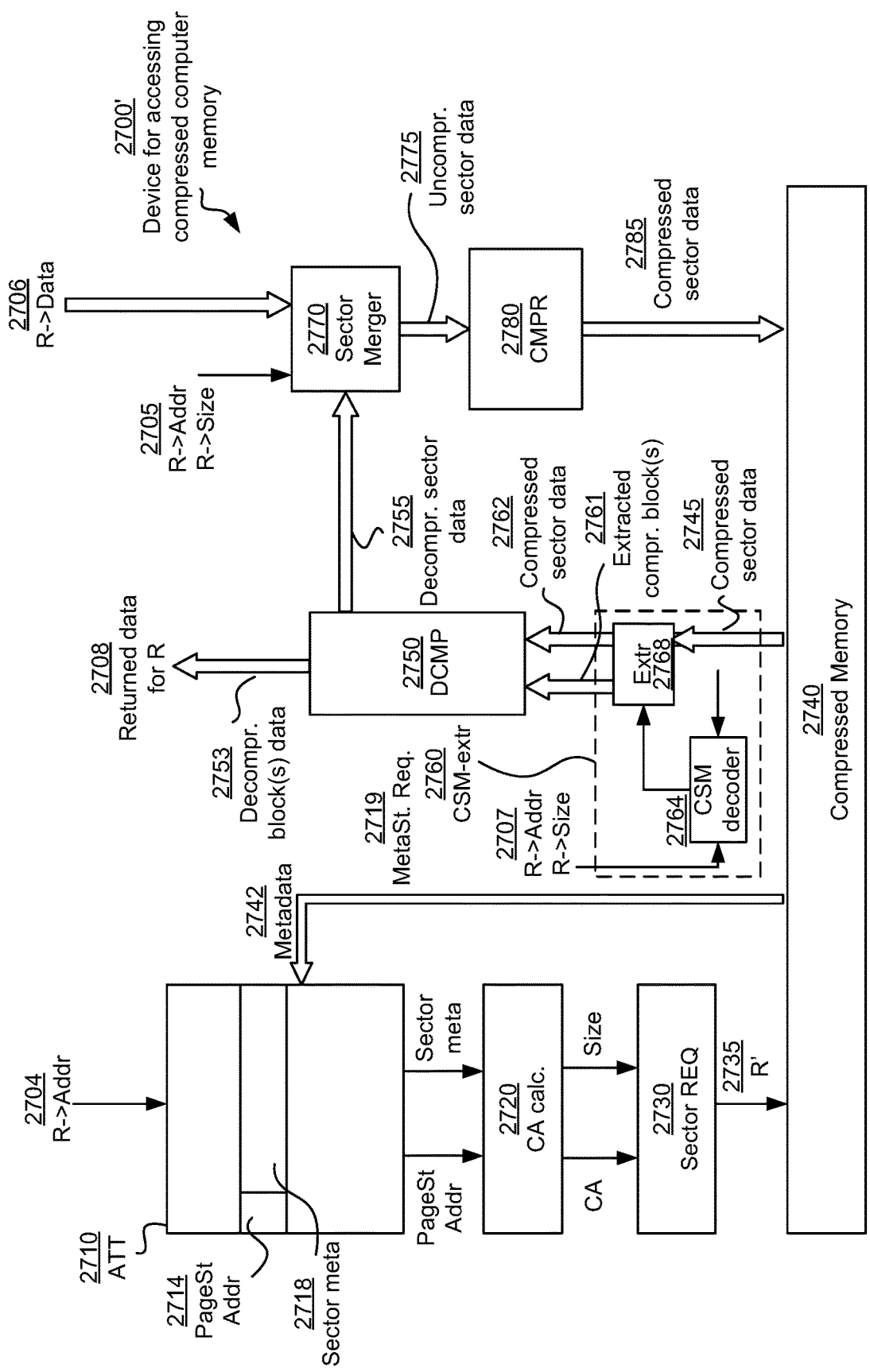
FIG. 27B depicts a second embodiment of a device for accessing compressed computer memory residing in physical computer memory, wherein the device is associated with the method in FIG. 26.
Figure 27C:
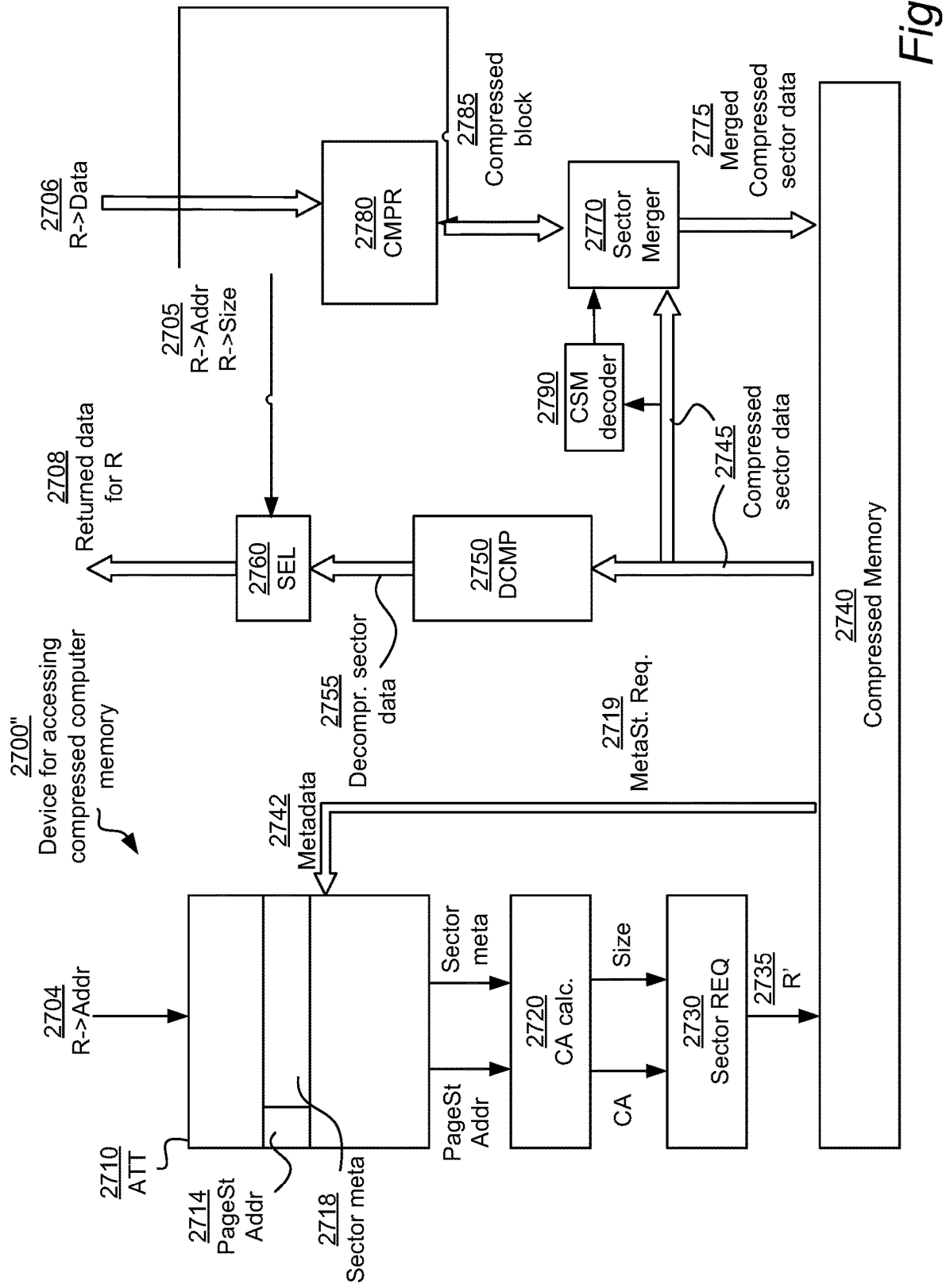
FIG. 27C depicts an alternative to the second embodiment of a device for accessing compressed computer memory residing in physical computer memory

The first embodiment of the device 2700 for accessing compressed computer memory residing in physical computer memory according to FIG. 27 (and its associated method in FIG. 25), the second embodiment of the device 2700' according to FIG. 27B (and its associated method in FIG. 26), the alternative device 2700" according to FIG. 27C, the third embodiment of the device 2800 according to FIG. 28 (and its associated method in FIG. 25B), as well as the fourth embodiment of the device 3200 according to FIG. 32. are all embodiments of the device 2700, 2800; 3200; 2700'; 2700" described above.

A corresponding method can be seen as comprising the functional steps performed by the device 2700; 2800; 3200; 2700'; 2700" described above.

For the device 2700; 2800; 3200; 2700'; 2700" described above, compressed memory blocks in said compressed computer memory 2740; 2840; 3240 are represented as sectors, wherein all sectors contain a fixed number of compressed memory blocks such as cache lines, have a fixed logical size in the form of the fixed number of compressed memory blocks, and have varying physical sizes in the form of the total size of data stored in the respective compressed memory blocks.

Particularly for the first, second and third embodiments of the device 2700, 2800, 3200, the decompressor 2750; 2850; 3250 is configured for decompressing compressed sector data 2745; 2845; 3245 as retrieved from the compressed computer memory 2740; 2840; 3240 in response to the sector request R', and for providing the decompressed sector data 2755; 2855; 3255 to the selector unit 2760; 2890; 3290 and the sector merge unit 2770; 2870; 3270. The selector unit 2760; 2890; 3290 is configured for obtaining data from the decompressed sector data 2755; 2855; 3255 using the address and size 2705; 2805; 3205 of said physical memory access request R, and for returning 2708; 2808 the obtained data to the source of said physical memory access request R in response to said read request. The sector merge unit 2770; 2870; 3240 is configured for obtaining data from the decompressed sector data 2755; 2855; 3255 using the address and size 2705; 2805; 3205 of said physical memory access request R, for merging the obtained data with data 2706 in said physical memory access request R into new uncompressed sector data 2775; 2875; 3275, and for providing the new uncompressed sector data 2775; 2875; 3275 to the compressor 2780; 2880; 3280. The compressor 2780; 2880; 3280 is configured for compressing the new uncompressed sector data 2775; 2875; 3275 and storing it as said compressed sector data 2785; 2885; 3285 in the compressed computer memory 2740; 2840; 3240 in response to said write request. A corresponding method can be seen as further comprising the functional steps of the first, second and third embodiments of the device 2700, 2800, 3200.

Particularly for the second and third embodiments of the device 2800, 3200, the selector unit 2890; 3290 may comprise a prefetch buffer 2898; 3298 configured for buffering all or some of the decompressed sector data 2755; 2855; 3255 resulting from said physical memory access request R being a first read request. The selector unit 2890; 3290 is configured, for a subsequent physical memory access request being a second read request, to use an address and a size of said second read request to check if the requested data exists in the prefetch buffer 2898; 3298, and, if so retrieve the requested data from the prefetch buffer 2898; 3298 and return it to a source of said second read request, or, otherwise retrieve and return the requested data for the second read request as defined for said physical memory access request R being a read request as previously described. The prefetch buffer 2898; 3298 may advantageously be configured for buffering the portions of the decompressed sector data 2755; 2855; 3255 which has not been returned to the source of said first read request. A corresponding method can be seen as further comprising the functional steps of the second and third embodiments of the device 2800, 3200.

Compressed memory pages in said compressed computer memory 3240 may comprise a number of sectors, each sector containing said fixed number of compressed memory blocks such as cache lines, Particularly for the third embodiment of the device 3200, the sector-based translation meta data 3242; 2930 comprises, for each compressed memory page a) sector metadata 2931a, 2931b, PTR comprising pointers to the sectors 2934a, 2934b of the compressed memory page, and b) memory block metadata 2932a, 2932b, CL-SIZE comprising sizes 2932a1, 2932a2 of the memory blocks of each sector. The device 3200 is configured for selectively converting a physical memory access request R into either of: i) a sector-based request for at least one sector in the compressed computer memory 3240, or ii) a block-based request for a memory block or a plurality of contiguous memory blocks in the compressed computer memory 3240.

Particularly for the third embodiment of the device 3200, the selector unit 3290 may comprise a decision function 3299 configured for making a decision for causing the compressed address calculator unit 3220 and the sector request unit 3230 to selectively make a sector-based read request, a sub-sector-based read request or a block-based read request to the compressed computer memory 3240. The decision function 3299 is operative to make said decision based on any of the following: monitored compressibility of the compressor 3280, monitored memory access pattern, utilization of the prefetch buffer as previously described, an evaluation of compression ratio of the requested sector in relation to its uncompressed physical size, and an evaluation of compression ratio of the requested sector in relation to its uncompressed physical size and average metadata per request. Also, the selector merge unit 3270 may be configured for selectively converting the physical memory access request R into a sector-based write request, a sub-sector-based write request or a block-based write request to the compressed computer memory 3240 depending on the size of the physical memory access request R. A corresponding method can be seen as further comprising the functional steps of the third embodiment of the device 3200 as described above.

It is recalled that compressed memory pages in said compressed computer memory 2740 comprises a number of sectors, each sector containing said fixed number of compressed memory blocks such as cache lines. Particularly for the second embodiment of the device 2700', each sector 2423 comprises compressed block metadata 2418, CSM indicative of the respective sizes of the compressed memory blocks 2414 of the sector 2423. The selector unit 2760 is configured for obtaining the read request response data from the compressed sector data 2745 retrieved from the compressed computer memory 2740 by using the compressed block metadata 2418, CSM in the compressed sector data 2745 to extract one or more compressed memory blocks, and for providing the extracted one or more compressed memory blocks 2761 to the decompressor 2750, The decompressor 2750 is configured for decompressing the extracted one or more compressed memory blocks 2761 and for returning 2708 the decompressed one or more memory blocks 2753 to the source of said physical memory access request R in response to said read request.

Further for the second embodiment of the device 2700', the selector unit 2760 may be further configured for providing 2762 the compressed sector data 2745 retrieved from the compressed computer memory 2740 to the decompressor 2750. The decompressor 2750 is configured for decompressing the compressed sector data 2762 as provided by the selector unit 2760, and for providing the decompressed sector data 2755 to the sector merge unit 2770. The sector merge unit 2770 is configured for obtaining data from the decompressed sector data 2755 using the address and size 2705 of said physical memory access request R, for merging the obtained data with data in said physical memory access request R into new uncompressed sector data 2775, and for providing the new uncompressed sector data 2775 to the compressor 2780. The compressor 2780 is configured for compressing the new uncompressed sector data 2775 and storing it as said compressed sector data 2785 in the compressed computer memory 2740 in response to said write request.

Alternatively, for the alternative 2700" to the second embodiment, the compressor 2780 and the sector merge unit 2770 may be configured for compressing data 2706 in said physical memory access request R into compressed block data 2785, receiving the compressed sector data 2745 retrieved from the compressed computer memory 2740, using the address and size 2705 of said physical memory access request R and the compressed block metadata 2418, CSM in the compressed sector data 2745 to merge the compressed block data 2785 with the compressed sector data 2745; and storing the merged compressed sector data 2745 in the compressed computer memory 2740; 2840 in response to said write request.

A corresponding method can be seen as further comprising the functional steps of the second embodiment of the device 2700' or its alternative 2700" as described above.

Address Translation: Variable Segmentation Embodiments

Figure 35:
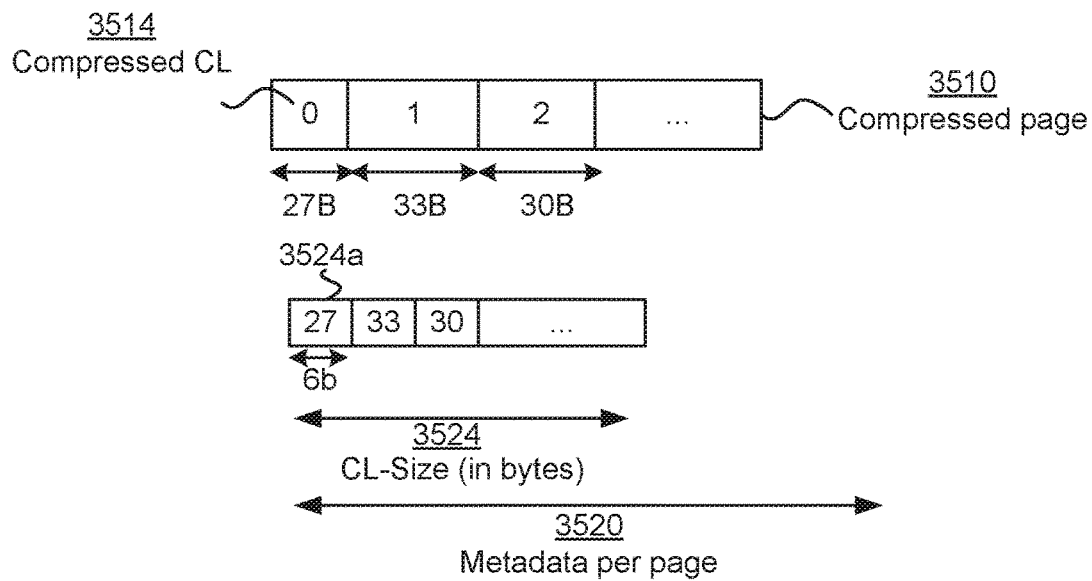
FIG. 35 depicts an exemplary compressed page wherein compressed cache lines are compacted and can be placed in any byte position.
Figure 36:
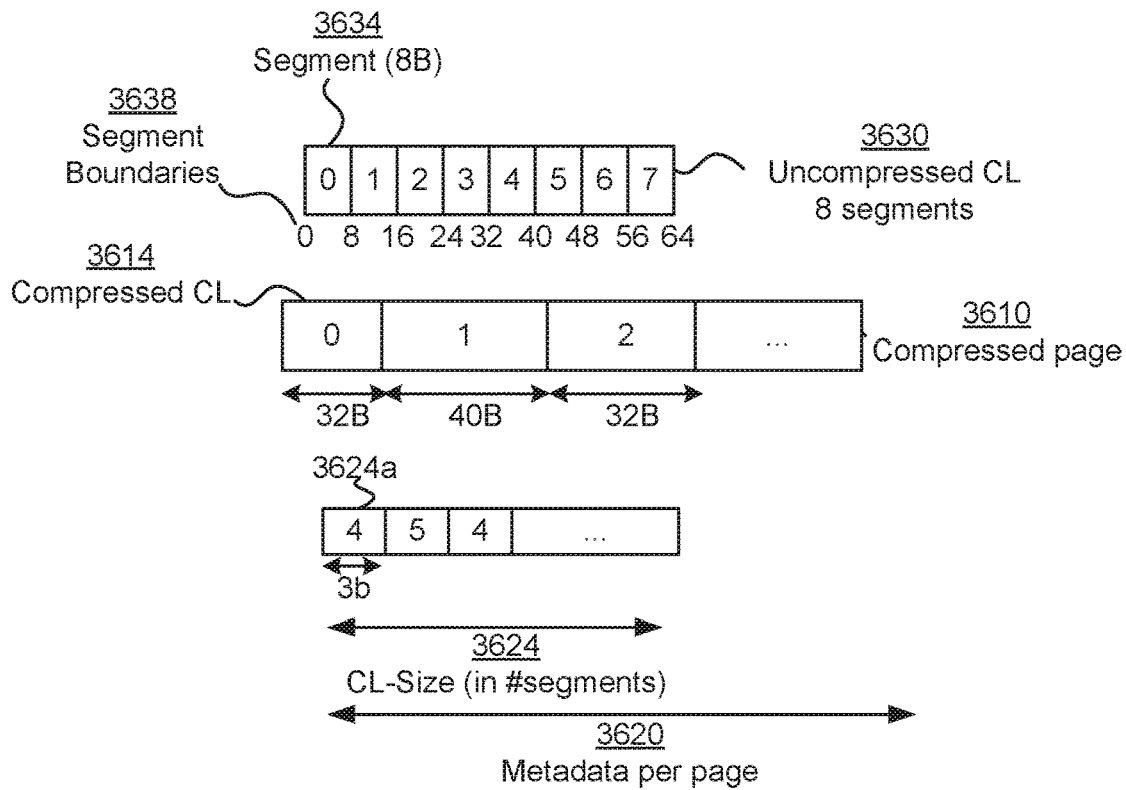
FIG. 36 depicts the exemplary compressed page of FIG. 35 wherein compressed cache lines are associated with fixed-size segments and thus their position in the compressed space is aligned to segment boundaries.

The metadata overhead can be minimized further (reducing memory and bandwidth overheads even more) by applying segmentation in the compressed sector and/or the compressed cache lines (for the sector-based hybrid translation embodiment). FIG. 35 shows a compressed page 3510 comprising compressed cache-lines 3514 whose CL-SIZE is measured in bytes. FIG. 36 shows an alternative of said page wherein the CL-SIZE is measured in number of segments. Segmentation divides the memory in fixed-size segments 3634, e.g., 8 Bytes, thus compressed sectors (or cache lines) are restricted to a set of pre-defined sizes instead as encoded by the CL-SIZE metadata 3624a, which is determined by the number of segments needed to meet a certain compressed size. Compressed sizes which are unaligned to segment boundaries need to be rounded up to the closest segment boundary. For example, CL0 is 27B but need to be rounded to 32B in the segmented metadata translation of FIG. 36. This way the space of possible sizes is shrunk, as a result fewer bits are needed to represent the compressed size; however, this causes internal fragmentation and worse compressibility because the wider a segment is, the bigger the internal fragmentation caused, i.e., the more space is underutilized because of misalignment between the compressed data size and segment boundaries.

Figure 37:
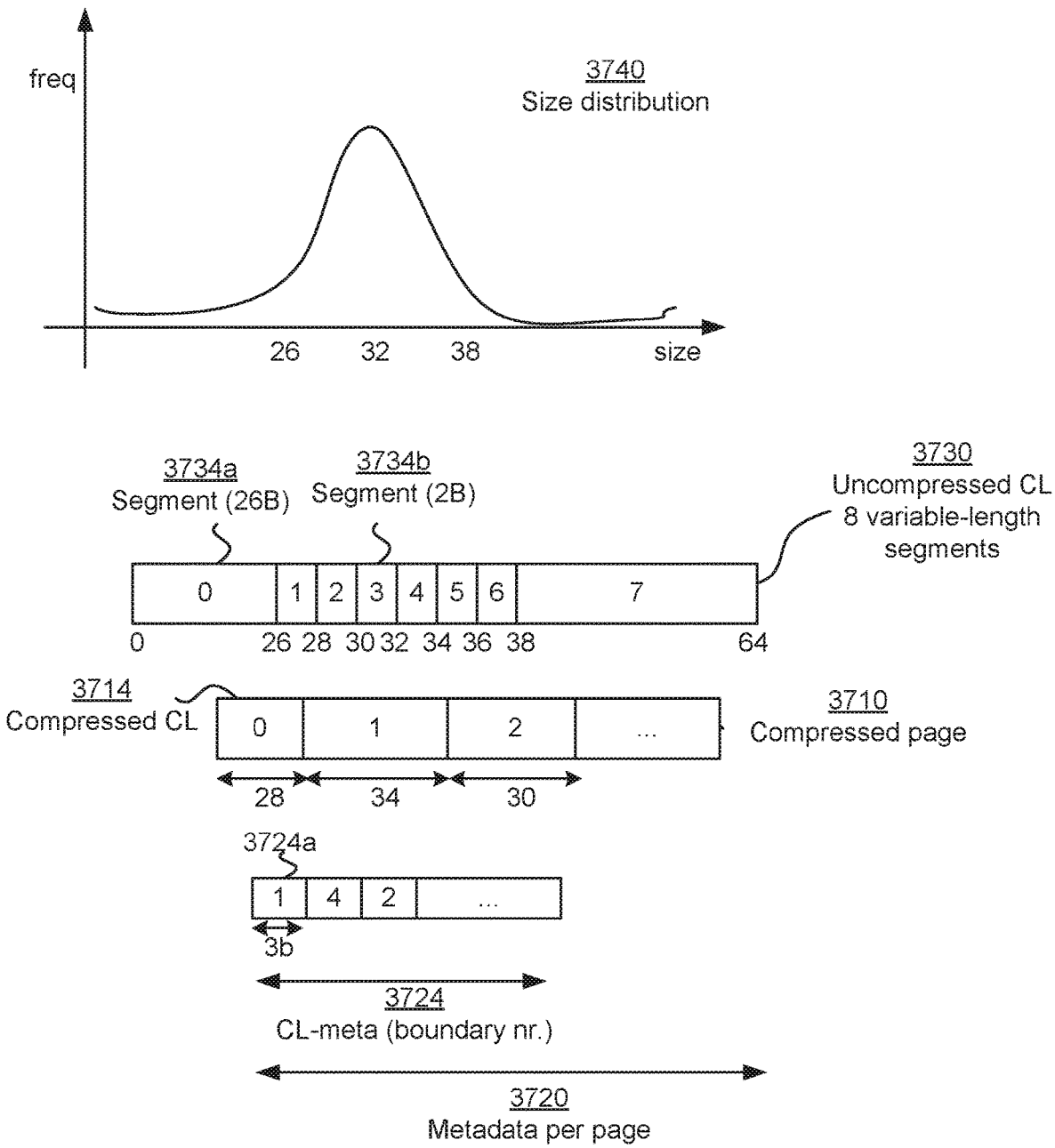
FIG. 37 depicts the exemplary compressed page of FIG. 35 wherein compressed cache lines are associated with variable-size segments and thus their position in the compressed space is adapted to the most frequent compressed cache-line sizes. This uses the same metadata as FIG. 36 but can achieve better compression and compressed space utilization.

An alternative metadata translation format is depicted in FIG. 37 where compressed data is segmented but segmentation is of variable length based on the observation that certain compressed sizes are encountered more often than others, thus specific numbers of segments are more important than others. In an example, frequency-size distribution 3740 segment boundaries 26-38 can occur more frequently than the rest. Hence, variable-length segmentation is based on the compressed data size distribution: "hot" number of segments (compressed sizes that occur often) are narrow and "cold" number of segments (compressed sizes that occur more rarely) are wide; for example, the segment 0-25B 3734a is cold while the segment 31-32B 3734b is hot. As a result, CL-SIZE metadata in the previous embodiments need to be replaced by CL-meta, which encodes the variable-length segment boundary instead of size. Variable-length segmentation can be applied to cache lines, sectors or other compressed data entities by those skilled in the art.

Using variable-length segmentation in any of the aforementioned sector-based translation metadata formats (pure sector, hybrid sector, restricted hybrid sector, etc) triggers the following problem definition:

For compressed data with minimum and maximum possible sizes of $S_{min}$, $S_{max}$ respectively, and given a fixed number (N) of segments $[S_{min}, B_1], (B_1, B_2], (B_{N-1}, S_{max}]$, find the boundaries $B_1, B_2, \ldots, B_{N-1}$ that minimize the overhead:
overhead=Sum(freq(s)*(bound(s)−s)), where bound(s)=$B_i$ if s>$B_i$−1 and s<=$B_i$(1)

$$\text{overhead} = \sum_{s=S_{min}}^{S_{max}} freq(s) \times (\text{ceil}(s) - s)$$

$$\text{Where } \text{ceil}(s) = \begin{cases} B_1, \text{ if } S_{min} \le s \le B_1 \\ S_{max}, \text{ if } B_{N-1} < s \le S_{max} \\ B_i, \text{ if } B_{i-1} < s \le B_i, i = 1, 2, \ldots, N-1 \end{cases}$$

Figure 38:
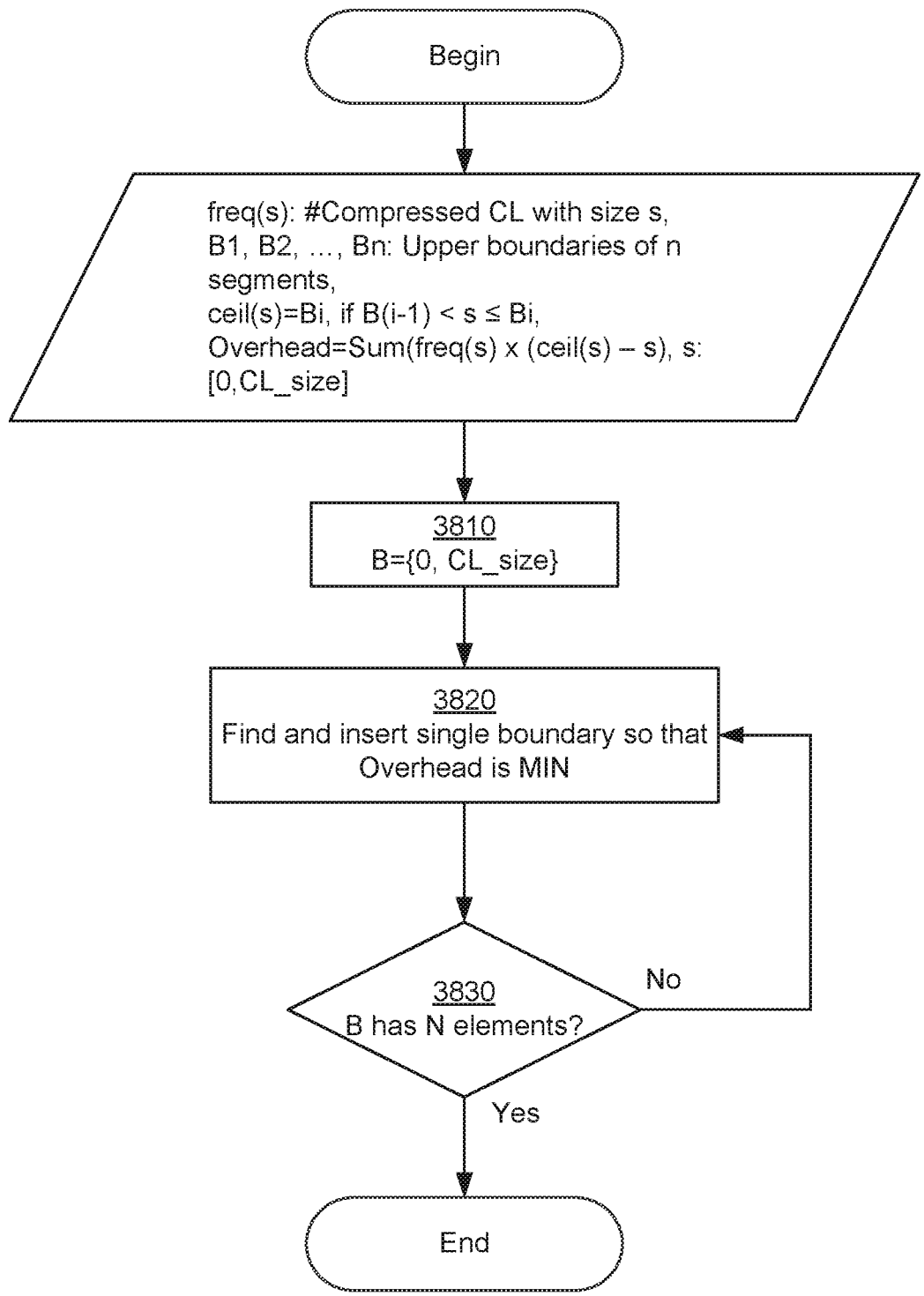
FIG. 38 depicts an embodiment of a heuristic method that finds the appropriate variable-length segmentation format so that the overhead is minimized.

An example method that solves the previous problem is the heuristic 3800 of FIG. 38 and works as follows:

Starting from a single segment [$S_{min}$, $S_{max}$] (0, CL_Size) 3810 in FIG. 38, introduce the first boundary Bi 3820 to create two segments, [Smin, Bi] and (Bi, Smax], all values between $S_{min}$ and $S_{max}$ are tried for $B_i$; the one that minimizes the overhead equation given above is assigned to. Then a second boundary $B_j$ is introduced, which can be smaller or bigger than Bi, and is also assigned the value that minimizes the overhead equation. This process is repeated until the desired number of segments has been created (condition check 3830). In a further alternative embodiment, the method can be optimized by further refining the boundaries that were discovered with the above process: eliminating the boundaries, one by one, from oldest to newest, and introducing newly discovered boundaries. Once every boundary has been refined, the process is repeated until there is no further overhead improvement from one iteration to the other.

Variable segmentation can be integrated in a memory compression system with a translation device embodiment similar to the one in FIGS. 27, 28, and 32, by also adding an extra unit which is a mechanism that collects the compressed sizes distribution. This is done by analyzing the compressed data. In one embodiment that implements statistical compression, said collection of compressed-size distribution can be done during sampling when the compression device collects data value statistics for the compression coding. In an alternative embodiment, the distribution can be built by collecting information from the actual compressed data. Two sets of segmentation boundaries must be supported. During initialization, the boundaries can be initialized to represent fixed-size segments. Then, at runtime, the compressed-size distribution is built and the variable-size segments can be defined as the second set of segments. Every compressed entity needs to be mapped to the segmentation boundaries it corresponds to. This can be done in different granularities (cache line, sector, page) with variable metadata overhead. For example, if we allow every compressed entity to be mapped to different segmentation boundaries, the metadata need to be augmented with 1 bit per compressed entity. Alternatively, if compressed entities of the same page are forced to be mapped to the same segmentation boundaries, a single bit per page suffices. Migration from one segmentation scheme to the other has to be applied for all compressed entities that share the same segmentation set. For example, if all compressed entities in a page are mapped to the same segmentation set, they all have to migrate to the new set at the same time. In one alternative, migration can happen on-demand, i.e., when a new segmentation set has been created, every write request that arrives will trigger a recompression using the new segmentation set. In case several compressed entities share the same segmentation scheme, all of them have to be recompressed when a write request arrives for one of them. When a set of segmentation boundaries is about to be updated, every compressed entity mapped to that set needs to be recompressed using the second segmentation set (the one that will not be affected).

The embodiments and alternatives described above with reference to FIG. 35 to FIG. 38 can be summarized as a method for deriving compression metadata of a specific size that maximizes a target effect for compressing blocks of data. The method comprise analyzing the sizes of compressed blocks, deriving frequency and size distributions of said compressed blocks, identifying one or a plurality of candidate compressed block sizes that compressed blocks will be rounded up to, evaluating whether said identified sizes maximize the target effect while being represented with metadata of said specific size, and, if so, accordingly generating a compression metadata format, or, otherwise, repeating the method from the deriving step. Said specific size may typically either be given or be part of the target effect to minimize overhead of metadata while maximizing compression ratio. The blocks of data are typically any of the following: memory blocks, network blocks, cache lines, memory pages, or sectors.

A corresponding device for deriving compression metadata of a specific size that maximizes a target effect for compressing blocks of data will comprise means for performing the functional steps referred to for the method above.

Address Translation: Data Dynamic Changes—Sector Overflow Handling

The disclosed sector-based translation format, methods and devices demonstrate an effective solution to reduce the high translation metadata overhead, eliminate internal fragmentation and increase gains in bandwidth that prior translation schemes suffer from. Apart from these, compressed data overflows due to dynamic data changes are handled by prior art by either introducing external fragmentation in fine granularity that requires later (or periodically) significant effort to (re-)create contiguous space by recompaction or are limited to only recompacting cache lines. The former is possible by keeping metadata that determine both the exact location of the compressed cache lines and their sizes resulting in a metadata overhead of more than 1000 bits per page (i.e., 64×12+64×6=1152 bits in comparison to 768 bits described in the second paragraph of the section "Address Translation" above; moreover, it lowers the bandwidth gains due to the caused fragmentation by inevitably breaking the spatial reference locality. On the other hand, in the latter recompaction can happen often adding substantial latency; this also affects the amount of free memory and can have detrimental effects on the free memory management.

Figure 39A:
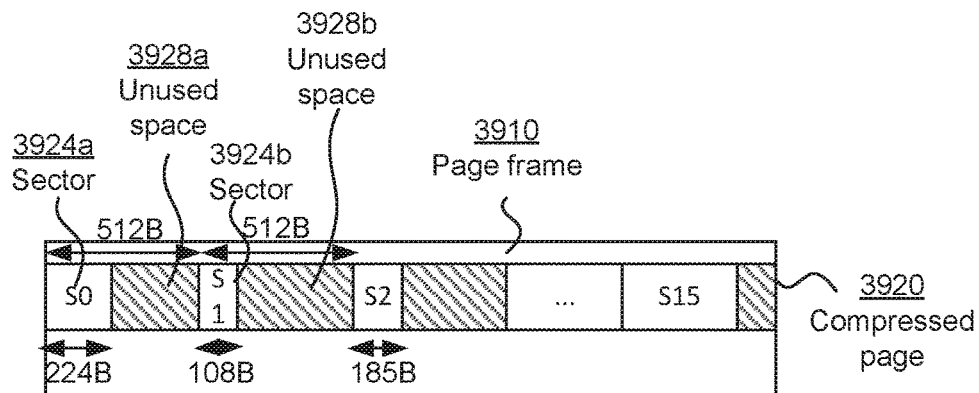
FIG. 39A depicts an exemplary page frame wherein sectors are compressed but are aligned in their original positions (as they were uncompressed) leaving the free space unused.
Figure 39A:
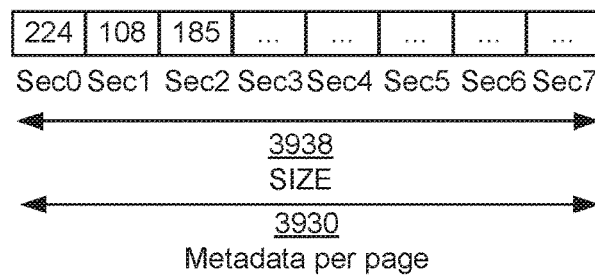
Figure 39B:
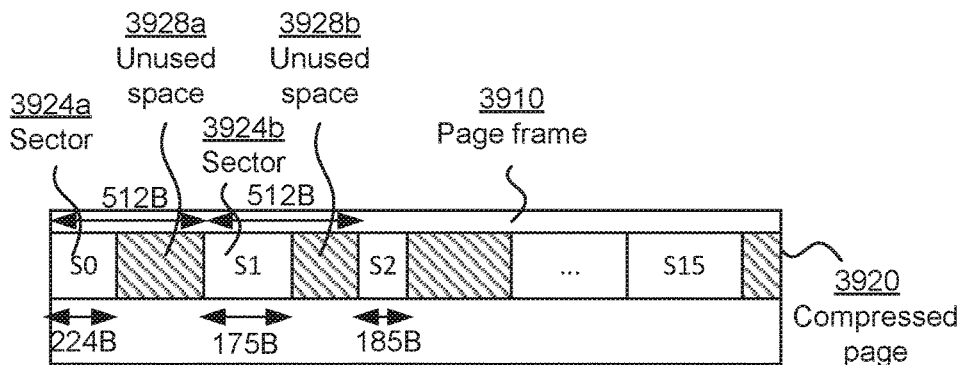
FIG. 39B depicts the same page of FIG. 39A wherein Sector 1 has expanded in size due to dynamic data changes within Sector 1.
Figure 39B:
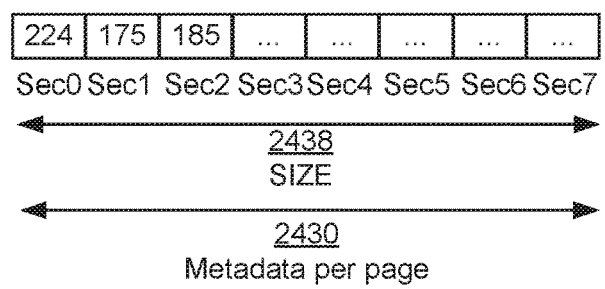

In the exemplary page frame of FIG. 39A, compressed sectors 3924a, 3924b, etc of a compressed page 3920 are aligned in the original positions of a page frame 3910 which are determined as follows: Sector i×SectorLogSize×64B; for example, sector 1 is placed in the 512$^{th}$ Byte of the compressed page. Such placement is beneficial when compressed sectors can help in improving the memory bandwidth need but increasing the memory capacity is not of interest. Hence, the space freed out of compressed is unused (3928a, 3928b, etc). Moreover, the translation metadata per page 2430 needs to comprise the sector SIZE which in this embodiment is 8b as the maximum SectorPhysSize is 512B (when the sector is uncompressed); thus the total size of translation metadata per page is 64b. In said embodiment, if the compressed data of a sector expands in size because of dynamic data changes, the compressed sector will expand in size taking space from the unused space; for example, sector 1 in the embodiment of FIG. 39B has size of 175B taking more space from the unused space 3928b and said change is reflected in the metadata. If the compressed sector expands more than the available unused space, it will be enforced to be decompressed and stored uncompressed. This type of compressed sector expansion due to dynamic data changes is handled by the disclosed sector-based translation device and method embodiments detailed previously without extra functionality.

Figure 40A:
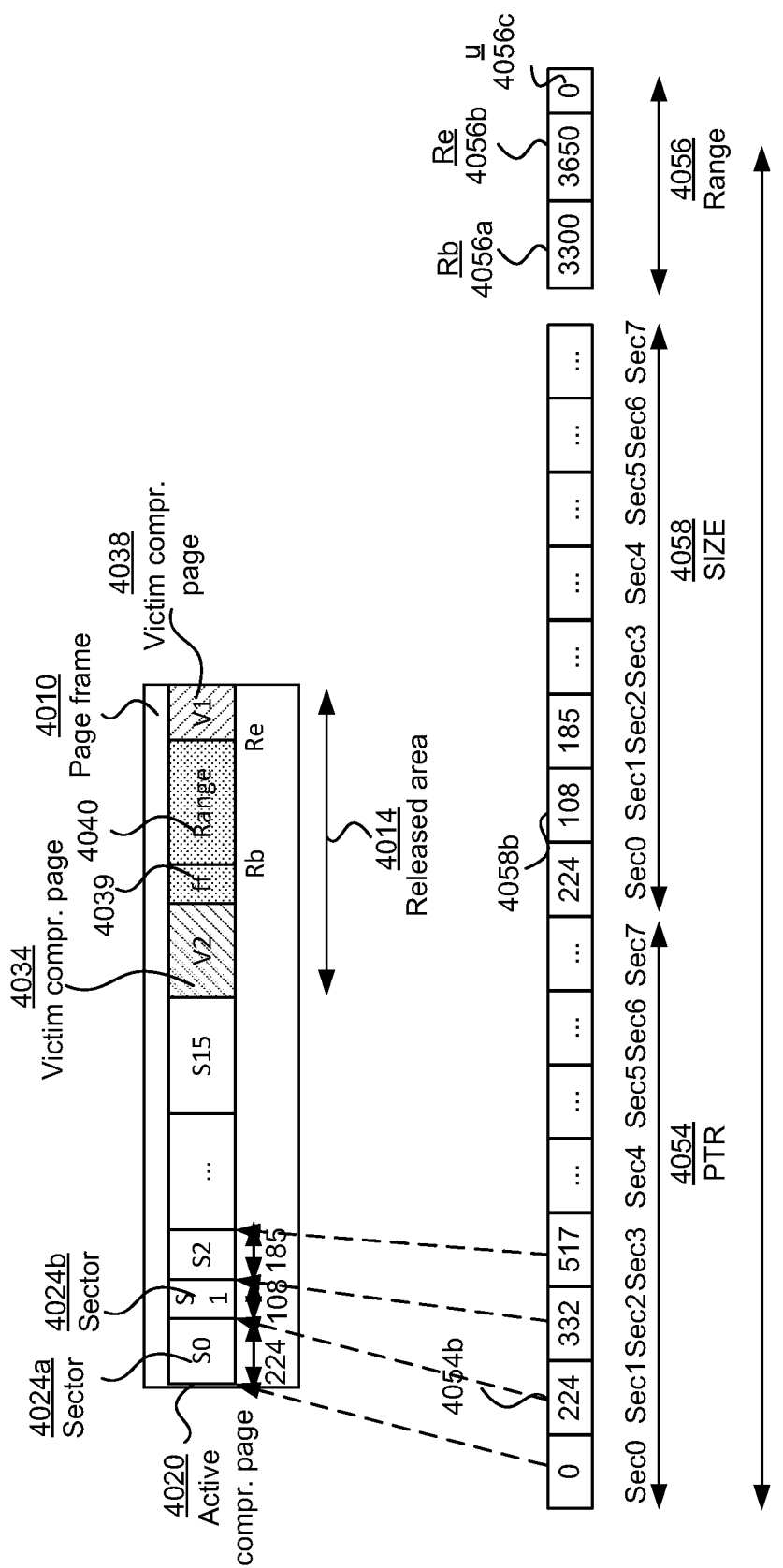
FIG. 40A depicts an exemplary page frame wherein a compressed page comprises sectors compressed and compacted next to each other so that free space (Released area) is utilized to map victim pages and a Range associated with said compressed page.
Figure 40B:
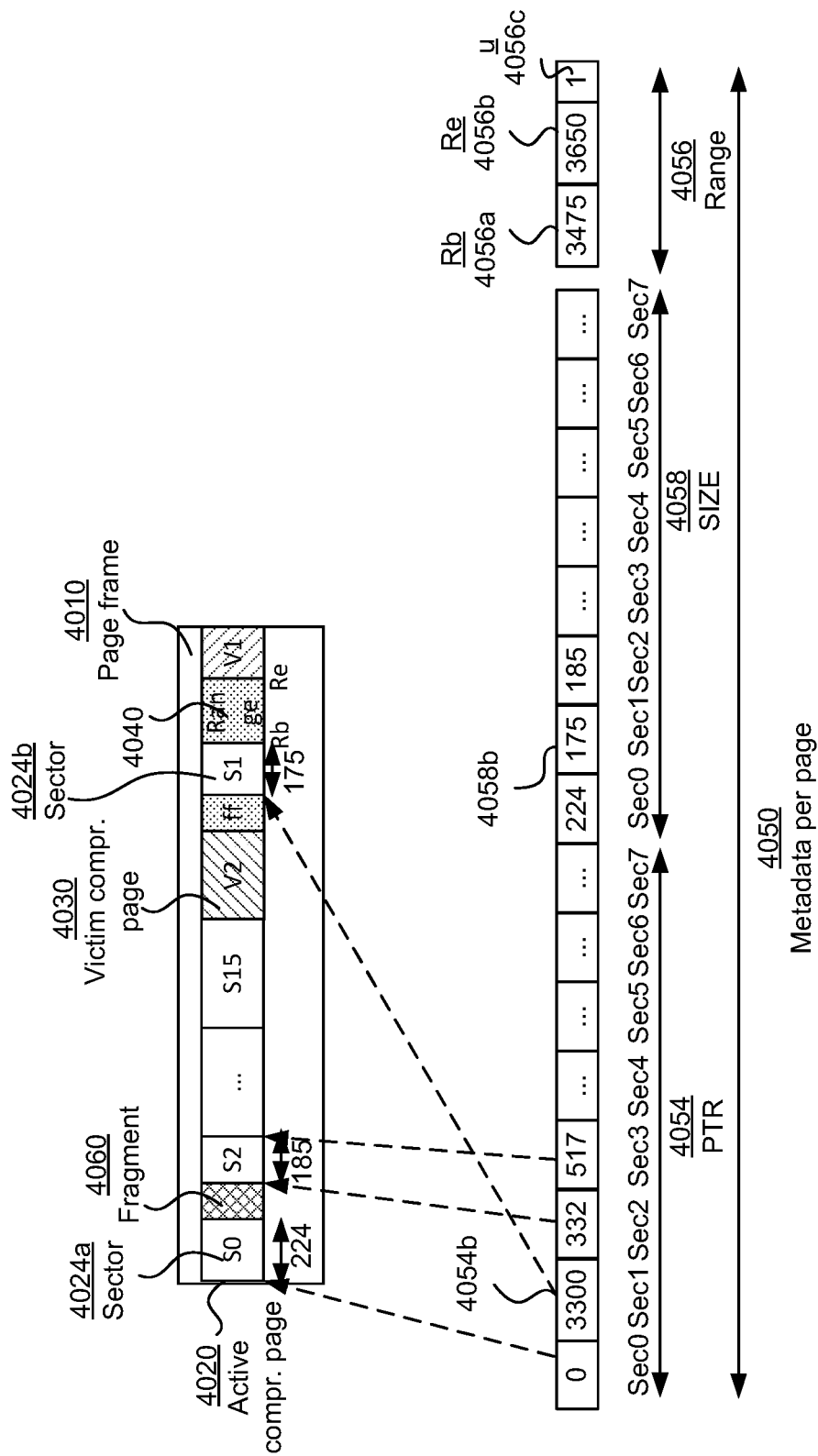
FIG. 40B depicts the same page of FIG. 40A wherein Sector 1 has expanded in size due to dynamic data changes within Sector 1.

FIG. 40A illustrates an alternative page frame layout, where compressed sectors are placed one after the other, as indicated by the sector PTR 4054 of the translation metadata 4050; said placement of compressed sector data is beneficial for improving the memory bandwidth needs and also increasing the effective memory capacity. In said exemplary page frame embodiment, the active page 4020 comprises the compressed sectors 4024a, 4024b, etc. The released due to data compression area 4014 of the page frame is utilized by an example Auxiliary memory by placing two victim pages V1 4038 and V2 4034, while there is a free fragment (ff) 4039. The released area comprises also the Range 4040 that is associated to the active compressed page 4020 as also indicated by the Range metadata 4056. Said metadata 4056 comprises the Range begin (Rb) 4056a and end (Re) 4056b boundaries like the embodiment of FIG. 12 and also the Range use (u) bit 4056c; said u bit 4056c can be used to indicate if the Range was used or not. If, for example, the sector1 (S1) 4024b expands in size due to dynamic data changes of the compressed data of sector1 and has a new size of 175 Bytes, then S1 cannot fit in the same position. Instead the Range is utilized to write the expanded sector1 as shown in FIG. 40B. This results in changing the Sec1 PTR 4054a (FIG. to point to the new location, updating the SIZE 4058a, updating the Range boundaries accordingly (in this case Rb 4056a points to location 3475 (175 Bytes to the right) and setting the u bit 4056c to '1'. The old position of S1 becomes now a fragment 4060. In this exemplary embodiment, the fragment location is not recorded thus cannot be directly utilized, however the position of the fragments can be dynamically tracked using the sector PTR and SIZE metadata. In an alternative embodiment, the fragments created can be recorded in metadata, however this will increase the overhead of the translation metadata. In an alternative embodiment, the u bit can be omitted if there is a mechanism that can track that the Range was used.

In one embodiment the Range associated with a compressed page can be contiguous to the compressed page. In an alternative embodiment, the Range associated with a compressed page can be non-contiguous to the compressed page but still in the same page frame. In yet another embodiment, the Range associated with a compressed page can be non-contiguous to the compressed page and in a different page frame, however said embodiment requires more metadata, i.e., the page frame wherein the Range is located in addition to the Range boundaries.

Said compressed sector overflow handling approach has two advantages in comparison to prior art: 1) All the compressed data of the sector are still packaged together so that bandwidth can be still improved by fetching the whole sector if spatial reference locality is exhibited. 2) The fragmentation created is external and therefore trackable; more importantly it is in coarser granularity thus it can be better utilized. In an alternative exemplary page frame embodiment, the Fragment(s) 4060 can be used to fill in other expanded sectors.

Figure 41B:
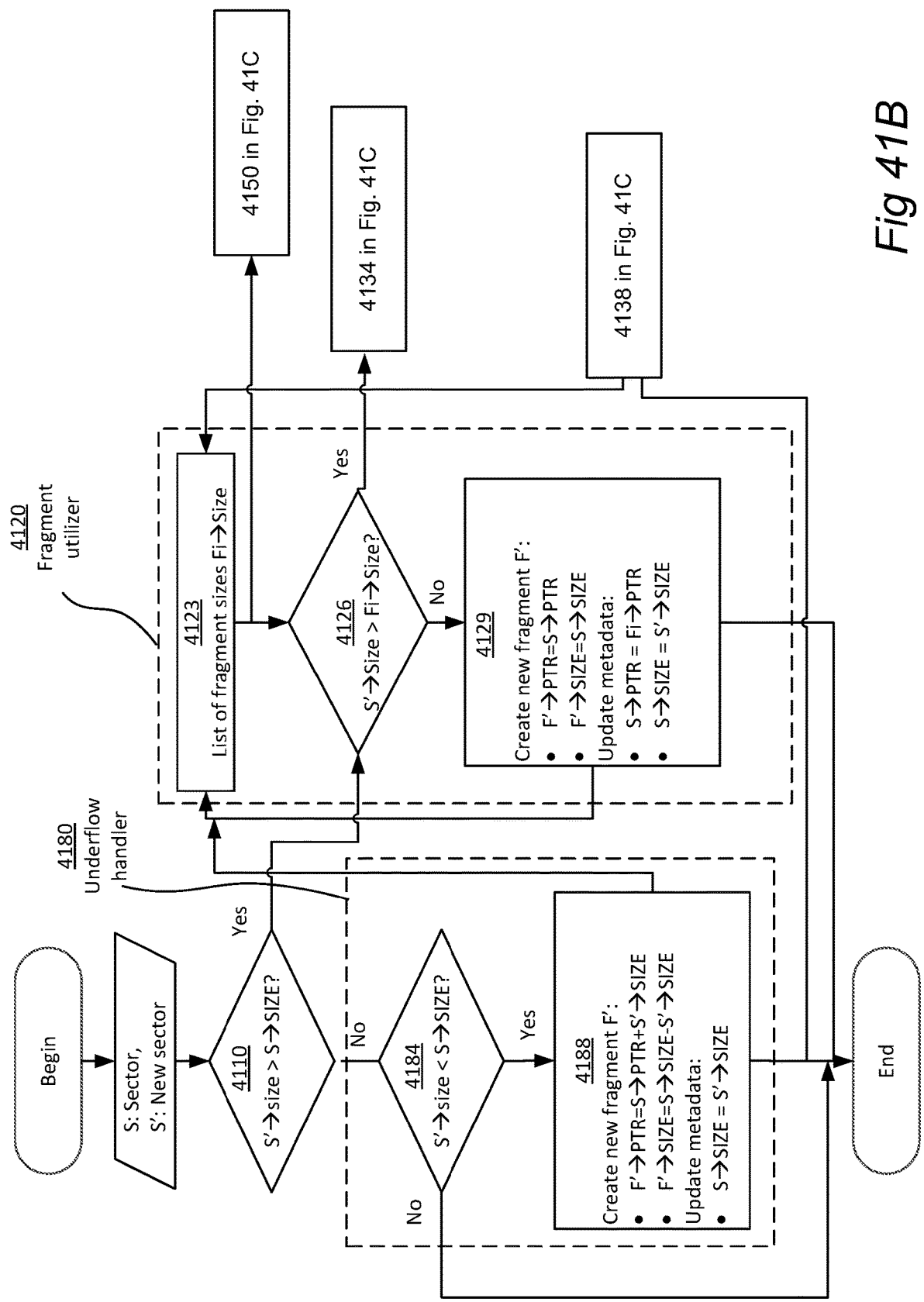
Figure 41C:
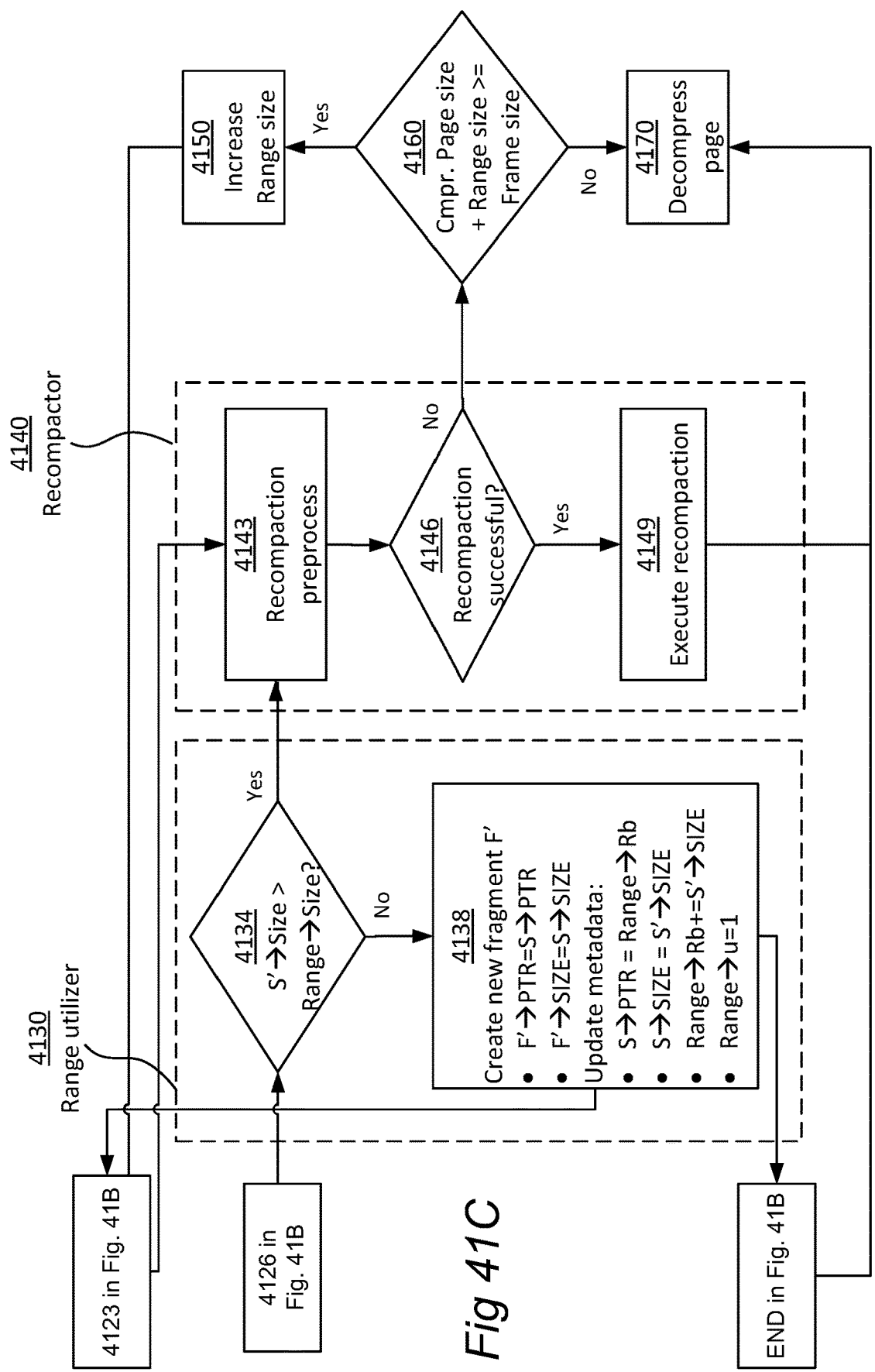

An exemplary embodiment of a sector overflow handling method is depicted in FIG. 41A-C, wherein FIG. 41B-C are detailed illustrations of parts of FIG. 41A. Said method comprises among other steps a Fragment utilizer process 4120, a Range utilizer process 4130, a Recompaction process 4140 and an Underflow handler process 4180. Said sector overflow handling method is input with the size of a new compressed sector version (S') and the size of an older version of the same sector (S). It is first checked if S' is larger than S 4110. If it is not, then the underflow handling process is triggered which checks whether the size S' is smaller than the size of S. If it is (Yes outcome of 4184), then a new fragment is created for the space not used and the sector SIZE metadata is updated with S'→SIZE in the MetaStorage 4188; if S' and S have the same size (No outcome of 4184), then no further handling is needed. On the other hand, if S'→SIZE>S→SIZE (Yes outcome of 4110), then it is a sector overflow.

The Fragment utilizer process 4120 is first triggered and looks in a list for fragments 4123 that have been created in the compressed page due to a previous relocation of another sector to the Range; if there is a fragment Fi wherein S' 4126 can fit then, firstly, a new fragment F' is created to record the current location (S→PTR) and size (S→SIZE) of the old version of the sector S 4129 (top); afterwards, the sector translation metadata (MetaStorage) is updated 4129 (bottom). If the size of the fragment Fi cannot be fully utilized to fit S', then the Fi position and size must be updated to record the unused space of said fragment. The list of fragments must be updated for both the Fi and F' as shown with the arrow that connects 4129 and 4123. With this, the sector overflow is handled.

If there is no fragment to be utilized to handle the sector overflow, then the Range utilizer process 4130 is triggered. Said process 4130 first checks 4134 whether the Range associated with a page where the compressed sector belong to, has enough size to accommodate S'. If it has (No outcome in 4134), then, firstly, a new fragment F' is created to record the current location (S→PTR) and size (S→SIZE) of the old version of the sector S 4138 (top); afterwards, the sector translation metadata (MetaStorage) is updated 4138 (bottom) so that the sector pointer points to the beginning of the Range and the sector size is updated with the size of S'; moreover, the Range boundaries must be accordingly updated as well as the Range's use bit to be set to '1'. With this, the sector overflow is handled.

If the Range utilizer cannot handle the overflow, the recompactor process 4140 is triggered. Said process targets to place the sectors one after each other so that it eliminates any external fragmentation. Said process has a preprocess step 4143 that reads the sector-based translation metadata sector PTR and sector SIZE; sector pointers (PTR) are typically in the sector-based translation metadata; sector sizes (SIZE) are either provided (FIG. 24); or can be calculated by subtracting sector pointers (FIG. 22/23), or by adding the CL-SIZE of all cache-lines within a sector for each sector (FIG. 29), or by multiplying CL-SIZE to the number of cache-lines within a sector for each sector (FIG. 33). Said preprocess step 4143 can also use the fragment list to determine quickly whether there are fragments available. The preprocess step 4143 calculates whether said sectors if recompacted can fit in the existing compressed page using the whole Range or part of it. If it is successful (Yes outcome of 4146), it executes recompaction 4149 by reading said sectors from memory, recompacting them in a buffer, and writing them back to the compressed memory updating the sector translation metadata and the Range metadata in the MetaStorage. If it is not successful (No outcome of 4146), then the sector overflow is handled into two ways: either by expanding the Range (if possible) 4150 and triggering again the Range utilizer process 4130, or by decompressing the compressed page entirely 4170; the latter is preferred especially if the size of the compressed page and its range surpass the size of an uncompressed page (i.e., the page frame) 4160. In either case the free manager of the memory compression system must guarantee that the decompressed page or the expanded Range will not overwrite other data that is not related to said compressed page for which the Sector overflow is handled.

In an alternative embodiment, in the Fragment utilizer 4120, if the size of the fragment Fi cannot be fully utilized to fit S', then the sector S' data can be padded with don't care bits to fill in the rest of the fragment space. This can potentially simplify fragment management but creates internal fragmentation (in the new Sector S') while the decompressor must be able to decompress data that is mixed with don't care bits.

In yet alternative embodiment, the Fragment utilizer process can be bypassed trading off better space utilization for faster overflow handling. In yet alternative embodiment, the Fragment utilizer can be entirely omitted trading off better space utilization for simpler overflow handling. In yet alternative embodiment, 4188 can be omitted creating internal fragmentation (i.e., non-trackable fragmentation) in the sector. Other alternative embodiments can be realized by someone skilled in the art and such embodiments are also contemplated.

Figure 42:
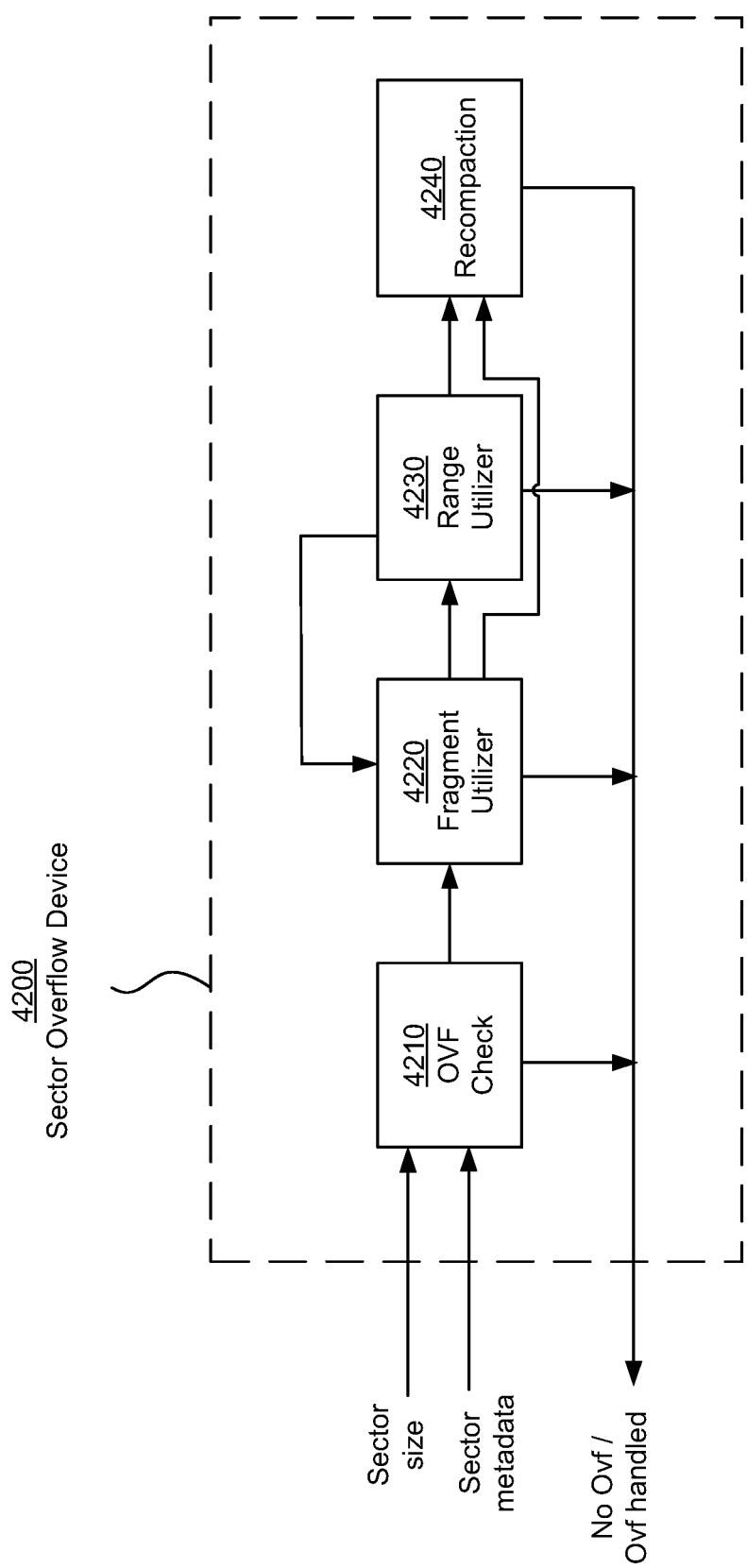
FIG. 42 depicts an embodiment of a Sector Overflow device

FIG. 42 depicts a Sector Overflow device 4200 which comprises the following units Ovf Check 4210, a Fragment Utilizer 4220, a Range Utilizer 4230 and a Recompactor 4240. Said units implement the functionality described in the method of FIG. 41A-C; the Ovf check unit 4210 implements the functionality of 4110 and 4180, the Fragment Utilizer unit 4220 implements the functionality of the 4120, the Range Utilizer unit 4230 implements the functionality of 4130 and the Recompactor unit implements the functionality of 4140 and 4160.

Figure 43:
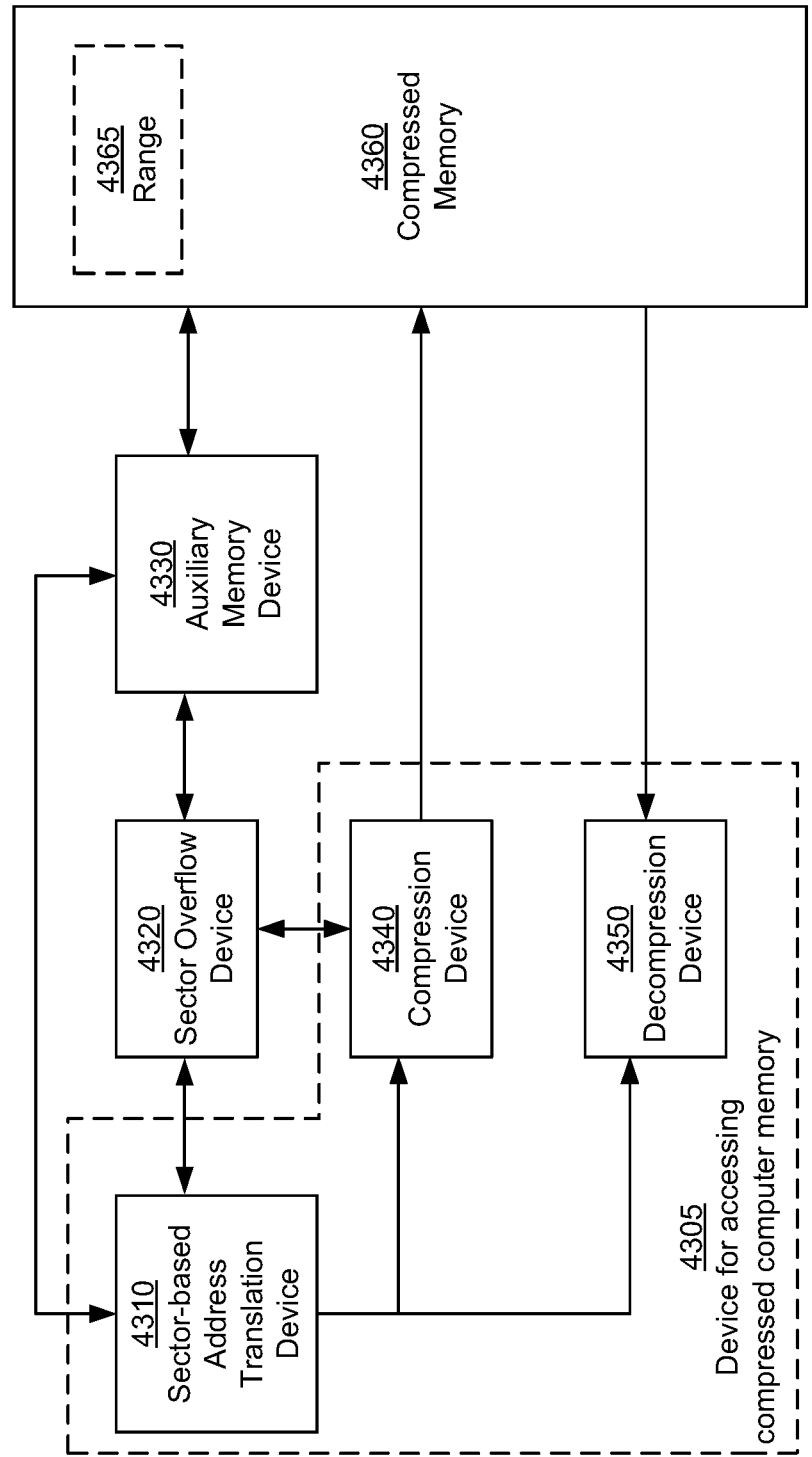
FIG. 43 depicts an embodiment of a Memory Compression System that comprises a Sector-based Address Translation device, a Sector Overflow device, an Auxiliary Memory device, a Compression and Decompression device, and a Compressed Memory which comprises further a Range as well as compressed data.

FIG. 43 depicts an embodiment of a Memory Compression System 4300 that comprises a Sector-based Address Translation Device 4310, a Sector-Overflow Device 4320, a Free Memory Manager Device 4330, a Compression Device 4340 and a Decompression Device 4350, and finally a Compressed Memory 4360 which comprises further a Range 4365 as well as compressed data or a mix of compressed and uncompressed data. The Sector-based Address Translation Device 4310 can be any of the embodiments 2700, 2800 or 3200 (including the Decompression Device 4350 and Compression Device 4340, together forming a device 4305 for accessing compressed computer memory). The Sector-Overflow device can be the embodiment 4200. The Free Memory Manager device can be any embodiment of a device that manages the free memory, for example, any of the embodiments of the Auxiliary Memory device (first embodiment, Zero-copy). The Compression and Decompression Devices can implement any compression and decompression algorithm but the Decompression Device must be able to decompress data compressed with said Compression Device. For each compressed page in memory there can be a Range 4365 associated with said compressed page; said Range is used as a point of synchronization between the Sector Overflow Device 4320 and the Free Memory Manager Device 4330 to determine how much space is used for memory capacity expansion and overflow handling. As described earlier, the Sector Overflow Device 4320/4200 can handle overflows silently until the Range Utilizer 4230, the Fragment Utilizer 4220 and the Recompactor 4240 can handle said overflows; if the overflow cannot be handled by said Overflow Device then either the compressed page is decompressed or the Range is expanded. In either case, the Free Memory Manager 4330 is notified (for example, through an interrupt) to reorganize the compressed memory so that other unrelated data are not overwritten by either of those actions. This is one example of synchronization between said devices. Someone skilled in the art can implement the synchronization of said units using locking mechanisms or other such mechanisms. In an alternative embodiment, if the overflow cannot be handled by said overflow device, the whole page can be relocated to another place in memory (as described in above) or the page can be split (as described above).

Therefore, FIG. 43 can be seen as a sector-based memory compression system 4300 which comprises a compressed memory 4360, a device 4305; 2700; 2800; 3200 for accessing compressed computer memory as previously described in this document, and a free memory management device 4330.

Advantageously, the free memory management device 4330 comprises a compressed memory management arrangement 405 (cf. FIG. 4 and the associated description) for a computer system 400 having one or more processors $P_1$-$P_N$, compressible main memory 414, secondary memory 450 and an operating system 420, the compressible main memory 414 having a compressed memory space comprising an active part directly accessible to said one or more processors $P_1$-$P_N$, as well as an inactive part not directly accessible to said one or more processors $P_1$-$P_N$ in the form of memory freed up by memory compression. The compressed memory management arrangement 405 comprises an auxiliary memory 440 for maintaining a layout of the compressed memory space of the compressible main memory 414, the layout including size and location of individual memory pages as well as free memory regions in said compressed memory space. The compressed memory management arrangement 405 moreover comprises selector functionality 430 interfacing said operating system 420, said secondary memory 450 and said auxiliary memory 440.

The memory management arrangement 405 of the free memory management device 4330 is configured to trigger the compression of a memory page in the compressible main memory 414, intercept a page-in request from said operating system 420 to said secondary memory 450, use the layout of the compressed memory space maintained by the auxiliary memory 440 to locate, when available, in said auxiliary memory 430 a page requested by the page-in request, and make the located requested page available in the active part of the compressed memory space. The memory management arrangement 405 of the free memory management device 4330 is further configured to intercept a page-out request from said operating system 420 to said secondary memory 450, use the layout of the compressed memory space maintained by the auxiliary memory 440 to obtain a free region for a page requested by the page-out request, and accommodate the requested page in the obtained free region of the auxiliary memory 440.

As has already been explained, the sector-based memory compression system 4300 may further comprise a sector overflow device 4320; 4200, wherein the sector overflow device 4320; 4200 comprises an overflow check unit 4210, a fragment utilizer unit 4220, a range utilizer unit 4230 and a recompaction unit (4240). The overflow check unit 4210 is configured for checking whether a new version of a compressed sector is larger in size than an old version and, if not, allowing the old version to be overwritten with the new version of the sector. The fragment utilizer unit 4220 is configured for searching in a list of free memory fragments for a memory fragment of suitable size to fit the new version of the sector if found by the overflow check unit 4210 larger in size than the old version, and if such a memory fragment is successfully found, inserting the new version of the sector in the found memory fragment and invalidating the old version of the sector by inserting the area where the old version resides in the list of free memory fragments. The range utilizer unit 4230 is configured for accommodating the new version of the sector in range data 4365; Range by accordingly updating the amount of free data in the range data 4365; Range, and if so, invalidating the old version of the sector by inserting the area where the old version resides in the list of free memory fragments. Finally, the recompaction unit 4240 is configured for rearranging the sector data so that different memory fragments are moved together to form one contiguous free memory fragment space.

In one or more embodiments, the overflow check unit 4210 further comprises a sector underflow handler unit configured for checking whether the new version of a compressed sector is smaller in size than the old version, if not, allowing the old version to be overwritten with the new version of the sector, and otherwise inserting in the list of free memory fragments a new memory fragment having a size equal to the difference between the old version of the sector and the new version and accordingly overwriting the part of the old version of the sector with the new version.

The range data 4365; Range utilized by the range utilizer unit 4230 may be a memory space contiguous to the sectors, a memory space non-contiguous to the sectors, or a non-memory space.

In one or more embodiments, the sector-based memory compression system 4300 further comprises a device for deriving compression metadata as described above with reference to FIG. 35 to FIG. 38.

The invention claimed is:

1. A device for accessing compressed computer memory residing in physical computer memory, the device comprising:
an address translation unit;
a compressed address calculator unit;
a sector request unit;
a selector unit;
a sector merge unit;
a decompressor; and
a compressor,
wherein compressed memory blocks in said compressed computer memory are represented as sectors, and wherein all sectors contain a fixed number of compressed memory blocks such as cache lines, have a fixed logical size in the form of the fixed number of compressed memory blocks, and have varying physical sizes in the form of the total size of data stored in the respective compressed memory blocks,
the address translation unit, the compressed address calculator unit and the sector request unit being configured, in combination, for converting a physical memory access request to a sector-based compressed memory request, wherein:
a sector id is extracted automatically using an address of said physical memory access request,
said sector id is used to determine from sector-based translation metadata the location of a sector in the compressed computer memory,
a compressed address and size of the determined sector are calculated, and
based on the compressed address and size, a sector request is made to the compressed computer memory;
the decompressor and the selector unit being configured, in combination, when said physical memory access request is a read request, for operating on compressed sector data as retrieved from the compressed computer memory in response to the sector request to obtain read request response data from said compressed sector data using the address and a size of said physical memory access request, and to return the obtained read request response data in decompressed form to a source of said physical memory access request being a read request; and
the sector merge unit and the compressor being configured, in combination, when said physical memory access request is a write request, for merging data of said compressed sector data as retrieved from the compressed computer memory in response to the sector request with data in said physical memory access request to obtain sector-based write request data using the address and size of said physical memory access request being a write request, and to store the obtained sector-based write request data as compressed sector data in the compressed computer memory.

2. The device for accessing compressed computer memory as defined in claim 1, wherein the decompressor is configured for decompressing compressed sector data as retrieved from the compressed computer memory in response to the sector request, and for providing the decompressed sector data to the selector unit and the sector merge unit;
wherein the selector unit is configured for obtaining data from the decompressed sector data using the address and size of said physical memory access request, and for returning the obtained data to the source of said physical memory access request in response to said read request;
wherein the sector merge unit is configured for obtaining data from the decompressed sector data using the address and size of said physical memory access request, for merging the obtained data with data in said physical memory access request into new uncompressed sector data, and for providing the new uncompressed sector data to the compressor; and
wherein the compressor is configured for compressing the new uncompressed sector data and storing it as said compressed sector data in the compressed computer memory in response to said write request.

3. The device for accessing compressed computer memory as defined in claim 2, the selector unit comprising:
a prefetch buffer configured for buffering all or some of the decompressed sector data resulting from said physical memory access request being a first read request,
wherein the selector unit is configured, for a subsequent physical memory access request being a second read request, to:
use an address and a size of said second read request to check if the requested data exists in the prefetch buffer, and, if so:
retrieve the requested data from the prefetch buffer and return it to a source of said second read request, or, otherwise:
retrieve and return the requested data for the second read request as defined for said physical memory access request being said read request.

4. The device for accessing compressed computer memory as defined in claim 3, wherein the prefetch buffer is configured for buffering the portions of the decompressed sector data which has not been returned to the source of said first read request.

5. The device for accessing compressed computer memory as defined in claim 1,
wherein compressed memory pages in said compressed computer memory comprises a number of sectors, each sector containing said fixed number of compressed memory blocks,
wherein the sector-based translation metadata comprises, for each compressed memory page:
sector metadata comprising pointers to the sectors of the compressed memory page, and
memory block metadata comprising sizes of the memory blocks of each sector; and
wherein the device is configured for selectively converting a physical memory access request into either of:
a sector-based request for at least one sector in the compressed computer memory, or
a block-based request for a memory block or a plurality of contiguous memory blocks in the compressed computer memory.

6. The device for accessing compressed computer memory as defined in claim 5, wherein the selector unit comprises a decision function configured for making a decision for causing the compressed address calculator unit and the sector request unit to selectively make a sector-based read request, a sub-sector-based read request or a block-based read request to the compressed computer memory, the decision function being operative to make said decision based on any of the following:
  monitored compressibility of the compressor,
  monitored memory access pattern,
  utilization of a prefetch buffer configured for buffering all or some of the decompressed sector data resulting from a physical memory access request,
  an evaluation of compression ratio of the requested sector in relation to its uncompressed physical size, and
  an evaluation of compression ratio of the requested sector in relation to its uncompressed physical size and average metadata per request.

7. The device for accessing compressed computer memory as defined in claim 5, wherein the selector merge unit is configured for selectively converting the physical memory access request into a sector-based write request, a sub-sector-based write request or a block-based write request to the compressed computer memory depending on the size of the physical memory access request.

8. The device for accessing compressed computer memory as defined in claim 1, wherein compressed memory pages in said compressed computer memory comprises a number of sectors, each sector containing said fixed number of compressed memory blocks;
  wherein each sector comprises compressed block metadata indicative of the respective sizes of the compressed memory blocks of the sector;
  wherein the selector unit is configured for obtaining the read request response data from the compressed sector data retrieved from the compressed computer memory by using the compressed block metadata in the compressed sector data to extract one or more compressed memory blocks, and for providing the extracted one or more compressed memory blocks to the decompressor; and
  wherein the decompressor is configured for decompressing the extracted one or more compressed memory blocks and for returning the decompressed one or more memory blocks to the source of said physical memory access request in response to said read request.

9. The device for accessing compressed computer memory as defined in claim 8, wherein the selector unit is further configured for providing the compressed sector data retrieved from the compressed computer memory to the decompressor; and
  wherein the decompressor is configured for decompressing the compressed sector data as provided by the selector unit, and for providing the decompressed sector data to the sector merge unit;
  wherein the sector merge unit is configured for obtaining data from the decompressed sector data using the address and size of said physical memory access request, for merging the obtained data with data in said physical memory access request into new uncompressed sector data, and for providing the new uncompressed sector data to the compressor; and
  wherein the compressor is configured for compressing the new uncompressed sector data and storing it as said compressed sector data in the compressed computer memory in response to said write request.

10. The device for accessing compressed computer memory as defined in claim 8, wherein the compressor and the sector merge unit are configured for:
  compressing data in said physical memory access request into compressed block data;
  receiving the compressed sector data retrieved from the compressed computer memory;
  using the address and size of said physical memory access request and the compressed block metadata in the compressed sector data to merge the compressed block data with the compressed sector data; and
  storing the merged compressed sector data in the compressed computer memory in response to said write request.

11. A method for accessing compressed computer memory residing in physical computer memory, the method comprising:
  representing compressed memory blocks in said compressed computer memory as sectors, wherein all sectors contain a fixed number of compressed memory blocks such as cache lines, have a fixed logical size in the form of the fixed number of compressed memory blocks, and have varying physical sizes in the form of the total size of data stored in the respective compressed memory blocks;
  converting a physical memory access request to a sector-based compressed memory request, wherein:
    a sector id is extracted automatically using an address of said physical memory access request,
    said sector id is used to determine from sector-based translation metadata the location of a sector in the compressed computer memory,
    a compressed address and size of the determined sector are calculated, and
    based on the compressed address and size, a sector request is made to the compressed computer memory;
  when said physical memory access request is a read request, operating on compressed sector data as retrieved from the compressed computer memory in response to the sector request to:
    obtain read request response data from said compressed sector data using the address and a size of said physical memory access request, and
    return the obtained read request response data in decompressed form to a source of said physical memory access request; and
  when said physical memory access request is a write request, merging data of said compressed sector data as retrieved from the compressed computer memory in response to the sector request with data in said physical memory access request to:
    obtain sector-based write request data using the address and size of said physical memory access request, and
    store the obtained sector-based write request data as compressed sector data in the compressed computer memory.

12. The method for accessing compressed computer memory as defined in claim 11, further comprising:
  decompressing compressed sector data as retrieved from the compressed computer memory in response to the sector request;
  providing the decompressed sector data to the selector unit and the sector merge unit;

handling said read request by:
  obtaining data from the decompressed sector data using the address and size of said physical memory access request, and
  returning the obtained data to the source of said physical memory access request; and
handling said write request by:
  obtaining data from the decompressed sector data using the address and size of said physical memory access request,
  merging the obtained data with data in said physical memory access request into new uncompressed sector data,
  compressing the new uncompressed sector data, and
  storing it as said compressed sector data in the compressed computer memory.

13. The method for accessing compressed computer memory as defined in claim 12, further comprising:
  buffering in a prefetch buffer all or some of the decompressed sector data resulting from said physical memory access request being a first read request; and
  for a subsequent physical memory access request being a second read request:
    using an address and a size of said second read request to check if the requested data exists in the prefetch buffer, and, if so:
    retrieving the requested data from the prefetch buffer and returning it to a source of said second read request, or, otherwise:
    retrieving and returning the requested data for the second read request as defined for said physical memory access request being said read request.

14. The method for accessing compressed computer memory as defined in claim 13, wherein the portions of the decompressed sector data which has not been returned to the source of said first read request are buffered in the prefetch buffer.

15. The method for accessing compressed computer memory as defined in claim 11,
  wherein compressed memory pages in said compressed computer memory comprises a number of sectors, each sector containing said fixed number of compressed memory blocks, wherein the sector-based translation metadata comprises, for each compressed memory page:
    sector metadata comprising pointers to the sectors of the compressed memory page, and
    memory block metadata comprising sizes of the memory blocks of each sector; and
  wherein the method involves selectively converting a physical memory access request into either of:
    a sector-based request for at least one sector in the compressed computer memory, or
    a block-based request for a memory block or a plurality of contiguous memory blocks in the compressed computer memory.

16. The method for accessing compressed computer memory as defined in claim 15, further comprising making a decision to selectively make either a sector-based read request or a block-based read request to the compressed computer memory, the decision being based on any of the following:
  monitored compressibility,
  monitored memory access pattern,
  utilization of a prefetch buffer configured for buffering all or some of the decompressed sector data resulting from a physical memory access request,
  an evaluation of compression ratio of the requested sector in relation to its uncompressed physical size, and
  an evaluation of compression ratio of the requested sector in relation to its uncompressed physical size and average metadata per request.

17. The method for accessing compressed computer memory as defined in claim 15, further comprising selectively converting the physical memory access request into either a sector-based write request or a block-based write request to the compressed computer memory depending on the size of the physical memory access request.

18. The method for accessing compressed computer memory as defined in claim 11,
  wherein compressed memory pages in said compressed computer memory comprises a number of sectors, each sector containing said fixed number of compressed memory blocks;
  wherein each sector comprises compressed block metadata indicative of the respective sizes of the compressed memory blocks of the sector;
  the method further comprising:
  obtaining the read request response data from the compressed sector data retrieved from the compressed computer memory by using the compressed block metadata in the compressed sector data to extract one or more compressed memory blocks;
  decompressing the extracted one or more compressed memory blocks; and
  returning the decompressed one or more memory blocks to the source of said physical memory access request in response to said read request.

19. The method for accessing compressed computer memory as defined in claim 18, further comprising:
  decompressing the compressed sector data as retrieved from the compressed computer memory;
  obtaining data from the decompressed sector data using the address and size of said physical memory access request;
  merging the obtained data with data in said physical memory access request into new uncompressed sector data;
  compressing the new uncompressed sector data; and
  storing the compressed new sector data as said compressed sector data in the compressed computer memory in response to said write request.

20. The method for accessing compressed computer memory as defined in claim 18, further comprising:
  compressing data in said physical memory access request into compressed block data;
  receiving the compressed sector data retrieved from the compressed computer memory;
  using the address and size of said physical memory access request and the compressed block metadata in the compressed sector data to merge the compressed block data with the compressed sector data; and
  storing the merged compressed sector data in the compressed computer memory in response to said write request.

21. A sector-based memory compression system, comprising a compressed computer memory;
  a device for accessing compressed computer memory residing in physical computer memory, wherein the device for accessing compressed computer memory comprises:

an address translation unit;
a compressed address calculator unit;
a sector request unit;
a selector unit;
a sector merge unit;
a decompressor,
a compressor,
wherein compressed memory blocks in said compressed computer memory are represented as sectors, and wherein all sectors contain a fixed number of compressed memory blocks such as cache lines, have a fixed logical size in the form of the fixed number of compressed memory blocks, and have varying physical sizes in the form of the total size of data stored in the respective compressed memory blocks,
the address translation unit, the compressed address calculator unit and the sector request unit being configured, in combination, for converting a physical memory access request to a sector-based compressed memory request, wherein:
a sector id is extracted automatically using an address of said physical memory access request,
said sector id is used to determine from sector-based translation metadata the location of a sector in the compressed computer memory,
a compressed address and size of the determined sector are calculated, and
based on the compressed address and size, a sector request is made to the compressed computer memory;
the decompressor and the selector unit being configured, in combination, when said physical memory access request is a read request, for operating on compressed sector data as retrieved from the compressed computer memory in response to the sector request to obtain read request response data from said compressed sector data using the address and a size of said physical memory access request, and to return the obtained read request response data in decompressed form to a source of said physical memory access request being a read request; and
the sector merge unit and the compressor being configured, in combination, when said physical memory access request is a write request, for merging data of said compressed sector data as retrieved from the compressed computer memory in response to the sector request with data in said physical memory access request to obtain sector-based write request data using the address and size of said physical memory access request being a write request, and to store the obtained sector-based write request data as compressed sector data in the compressed computer memory; and
a free memory management device.

22. The sector-based memory compression system as defined in claim 21, wherein the free memory management device comprises a compressed memory management arrangement for a computer system having one or more processors, compressible main memory, secondary memory and an operating system, the compressible main memory having a compressed memory space comprising an active part directly accessible to said one or more processors, as well as an inactive part not directly accessible to said one or more processors in the form of memory freed up by memory compression, the compressed memory management arrangement comprising:
an auxiliary memory for maintaining a layout of the compressed memory space of the compressible main memory, the layout including size and location of individual memory pages as well as free memory regions in said compressed memory space; and
selector functionality interfacing said operating system, said secondary memory and said auxiliary memory;
wherein the memory management arrangement is configured to:
trigger the compression of a memory page in the compressible main memory;
intercept a page-in request from said operating system to said secondary memory, use the layout of the compressed memory space maintained by the auxiliary memory to locate, when available, in said auxiliary memory a page requested by the page-in request, and make the located requested page available in the active part of the compressed memory space; and
intercept a page-out request from said operating system to said secondary memory, use the layout of the compressed memory space maintained by the auxiliary memory to obtain a free region for a page requested by the page-out request, and accommodate the requested page in the obtained free region of the auxiliary memory.

23. The sector-based memory compression system as defined in claim 21, further comprising a sector overflow device, wherein the sector overflow device comprises:
an overflow check unit;
a fragment utilizer unit;
a range utilizer unit; and
a recompaction unit,
wherein the overflow check unit is configured for:
checking whether a new version of a compressed sector is larger in size than an old version and, if not, allowing the old version to be overwritten with the new version of the sector;
wherein the fragment utilizer unit is configured for:
searching in a list of free memory fragments for a memory fragment of suitable size to fit the new version of the sector if found by the overflow check unit larger in size than the old version, and
if such a memory fragment is successfully found, inserting the new version of the sector in the found memory fragment and invalidating the old version of the sector by inserting the area where the old version resides in the list of free memory fragments;
wherein the range utilizer unit is configured for:
accommodating the new version of the sector in range data by accordingly updating the amount of free data in the range data, and if so, invalidating the old version of the sector by inserting the area where the old version resides in the list of free memory fragments; and
wherein recompaction unit is configured for:
rearranging the sector data so that different memory fragments are moved together to form one contiguous free memory fragment space.

24. The sector-based memory compression system as defined in claim 23, wherein the overflow check unit further comprising a sector underflow handler unit configured for:
checking whether the new version of a compressed sector is smaller in size than the old version, if not, allowing the old version to be overwritten with the new version of the sector, and otherwise inserting in the list of free memory fragments a new memory fragment having a size equal to the difference between the old version of the sector and the new version and accordingly overwriting the part of the old version of the sector with the new version.

25. The sector-based memory compression system as defined in claim 23, wherein the range data utilized by the range utilizer unit is a memory space contiguous to the sectors.

26. The sector-based memory compression system as defined in claim 23, wherein the range data utilized by the range utilizer unit is a memory space non-contiguous to the sectors.

27. The sector-based memory compression system as defined in claim 23, wherein the range utilized by the range utilizer unit is a non-memory space.

* * * * *